US012610542B2

(12) United States Patent
Fukuoka et al.

(10) Patent No.: US 12,610,542 B2
(45) Date of Patent: Apr. 21, 2026

(54) SEMICONDUCTOR MEMORY DEVICE

(71) Applicant: Kioxia Corporation, Tokyo (JP)

(72) Inventors: Ryo Fukuoka, Yokkaichi (JP);
Fumitaka Arai, Yokkaichi (JP); **Kouji
Matsuo, Ama (JP); Hiroaki Kosako**,
Yokkaichi (JP); Keiji Hosotani,
Yokkaichi (JP); Takayuki Kakegawa,
Yokkaichi (JP); Shinya Naito, Toyota
(JP); Shinji Mori, Nagoya (JP)

(73) Assignee: Kioxia Corporation, Tokyo (JP)

( * ) Notice: Subject to any disclaimer, the term of this
patent is extended or adjusted under 35
U.S.C. 154(b) by 879 days.

(21) Appl. No.: 17/692,920

(22) Filed: Mar. 11, 2022

(65) Prior Publication Data

US 2022/0352188 A1      Nov. 3, 2022

(30) Foreign Application Priority Data

Apr. 28, 2021      (JP) ................................. 2021-076886

(51) Int. Cl.
*H10B 41/10* (2023.01)
*G11C 16/26* (2006.01)
*H10B 41/27* (2023.01)

(52) U.S. Cl.
CPC ............. *H10B 41/10* (2023.02); *G11C 16/26*
(2013.01); *H10B 41/27* (2023.02)

(58) Field of Classification Search
CPC ........ H10B 41/10; H10B 41/27; G11C 16/26;
G11C 16/0483
See application file for complete search history.

(56) References Cited

U.S. PATENT DOCUMENTS 7,382,018 B2      6/2008   Kim et al.
7,915,667 B2      3/2011   Knoefler et al.
(Continued)

FOREIGN PATENT DOCUMENTS

JP        2008078404 A        4/2008
JP        2020043119 A        3/2020

OTHER PUBLICATIONS

IEEE vol. 57, No. 9, Sep. 1969 p. 1469-1476 "The Influence of
Crystal orientation on Silicon Semiconductor Processing" (Year:
1969).*

*Primary Examiner* — Britt Hanley
*Assistant Examiner* — William C. Trice, III
(74) *Attorney, Agent, or Firm* — Holtz, Holtz & Volek PC

(57)      ABSTRACT

A semiconductor memory device includes a first semicon-
ductor layer, first conductive layers, electric charge accu-
mulating portions, a first conductivity-typed second semi-
conductor layer, a first wiring, a second conductivity-typed
third semiconductor layer, and a second conductive layer.
The first semiconductor layer extends in a first direction.
First conductive layers are arranged in the first direction and
extend in a second direction. Electric charge accumulating
portions are disposed between the first semiconductor layer
and first conductive layers. The second semiconductor layer
is connected to one end of the first semiconductor layer. The
first wiring is connected to the first semiconductor layer via
the second semiconductor layer. The third semiconductor
layer is connected to a side surface in a third direction of the
first semiconductor layer. The second conductive layer
extends in the second direction and is connected to the first
semiconductor layer via the third semiconductor layer.

18 Claims, 42 Drawing Sheets

(56)  References Cited

U.S. PATENT DOCUMENTS

| | | | |
|---|---|---|---|
| 8,008,732 B2 | 8/2011 | Kiyotoshi et al. | |
| 8,159,017 B2 | 4/2012 | Seol et al. | |
| 8,912,589 B2 | 12/2014 | Wang | |
| 9,076,722 B2 | 7/2015 | Sakuma et al. | |
| 9,087,715 B2 | 7/2015 | Kusai et al. | |
| 9,461,175 B2 | 10/2016 | Lue et al. | |
| 9,711,522 B2 | 7/2017 | Park et al. | |
| 10,607,995 B2 | 3/2020 | Roberts et al. | |
| 10,756,109 B2 | 8/2020 | Uchida | |
| 2017/0062456 A1 | 3/2017 | Sugino et al. | |
| 2018/0197608 A1* | 7/2018 | Song | G11C 16/3495 |
| 2021/0013229 A1* | 1/2021 | Sakuma | H10D 64/033 |

* cited by examiner

SEMICONDUCTOR MEMORY DEVICE

CROSS-REFERENCE TO RELATED APPLICATIONS

This application is based upon and claims the benefit of Japanese Patent Application No. 2021-076886, filed on Apr. 28, 2021, the entire contents of which are incorporated herein by reference.

BACKGROUND

Field

Embodiments described herein relate generally to a semiconductor memory device.

Description of the Related Art

There has been known a semiconductor memory device in which a plurality of memory cells are stacked in a direction intersecting with a surface of a substrate.

BRIEF DESCRIPTION OF THE DRAWINGS

FIG. 11 is a schematic cross-sectional view illustrating a configuration of a part of the semiconductor memory device;

FIG. 23 is a schematic cross-sectional view for describing the manufacturing method;

FIG. 35 is a schematic cross-sectional view for describing the manufacturing method;

DETAILED DESCRIPTION

Figure 1:
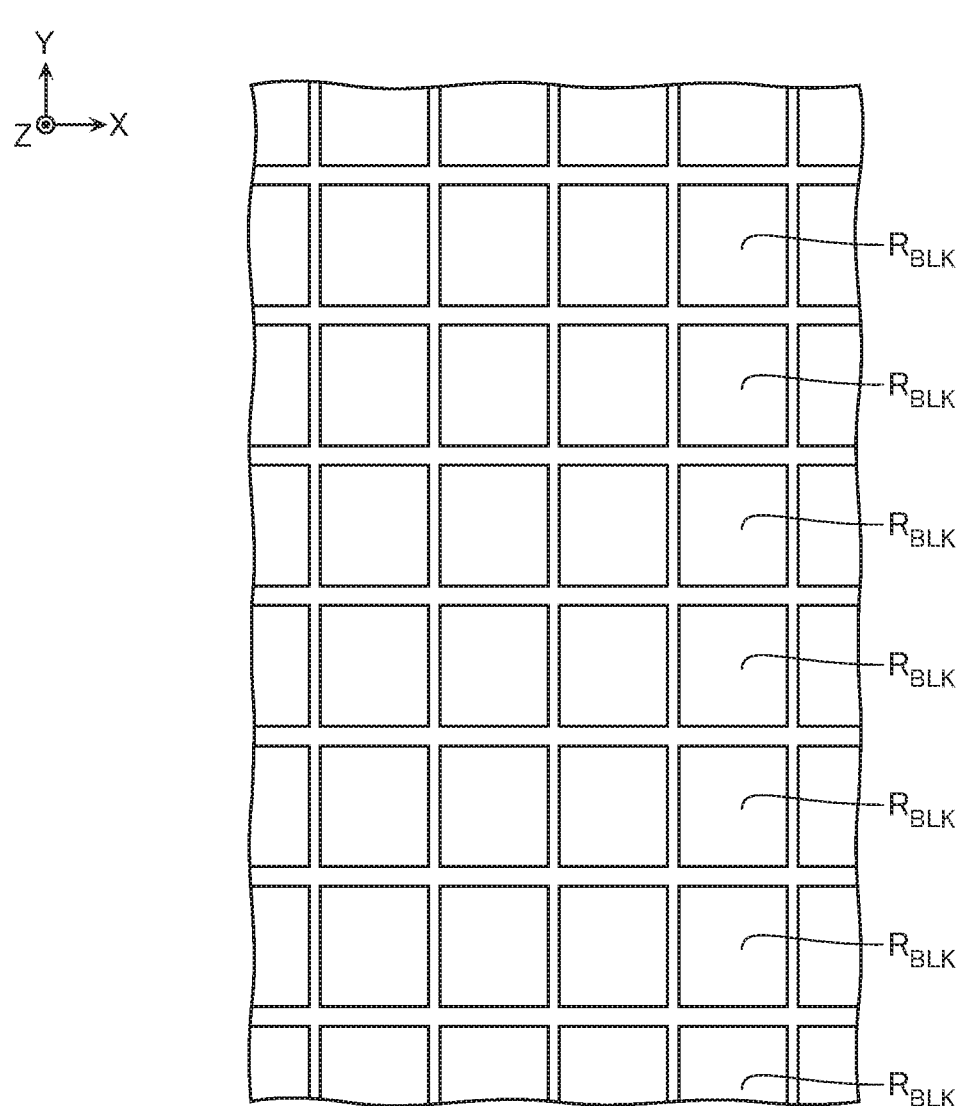
FIG. 1 is a schematic plan view illustrating a configuration of a part of a semiconductor memory device according to a first embodiment.

A semiconductor memory device according to one embodiment includes a first semiconductor layer, a plurality of first conductive layers, a plurality of electric charge accumulating portions, a first conductivity-typed second semiconductor layer, a first wiring, a second conductivity-typed third semiconductor layer, and a second conductive layer. The first semiconductor layer extends in a first direction. The plurality of first conductive layers are arranged in the first direction and extend in a second direction intersecting with the first direction. The plurality of electric charge accumulating portions are disposed between the first semiconductor layer and the plurality of first conductive layers. The first conductivity-typed second semiconductor layer is connected to one end in the first direction of the first semiconductor layer. The first wiring is connected to the first semiconductor layer via the second semiconductor layer. The second conductivity-typed third semiconductor layer is connected to a side surface at one side in a third direction of the first semiconductor layer. The third direction intersects with the first direction and the second direction. The second conductive layer extends in the second direction and is connected to the first semiconductor layer via the third semiconductor layer.

Next, the semiconductor memory devices according to embodiments are described in detail with reference to the drawings. The following embodiments are only examples, and not described for the purpose of limiting the present invention. The following drawings are schematic, and for convenience of description, apart of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

[Configuration]

FIG. 1 is a schematic plan view illustrating a configuration of a part of a semiconductor memory device according to a first embodiment. The semiconductor memory device according to the embodiment includes a plurality of memory block regions $R_{BLK}$. The memory block regions $R_{BLK}$ are arranged in a matrix in the X-direction and the Y-direction.

Figure 2:
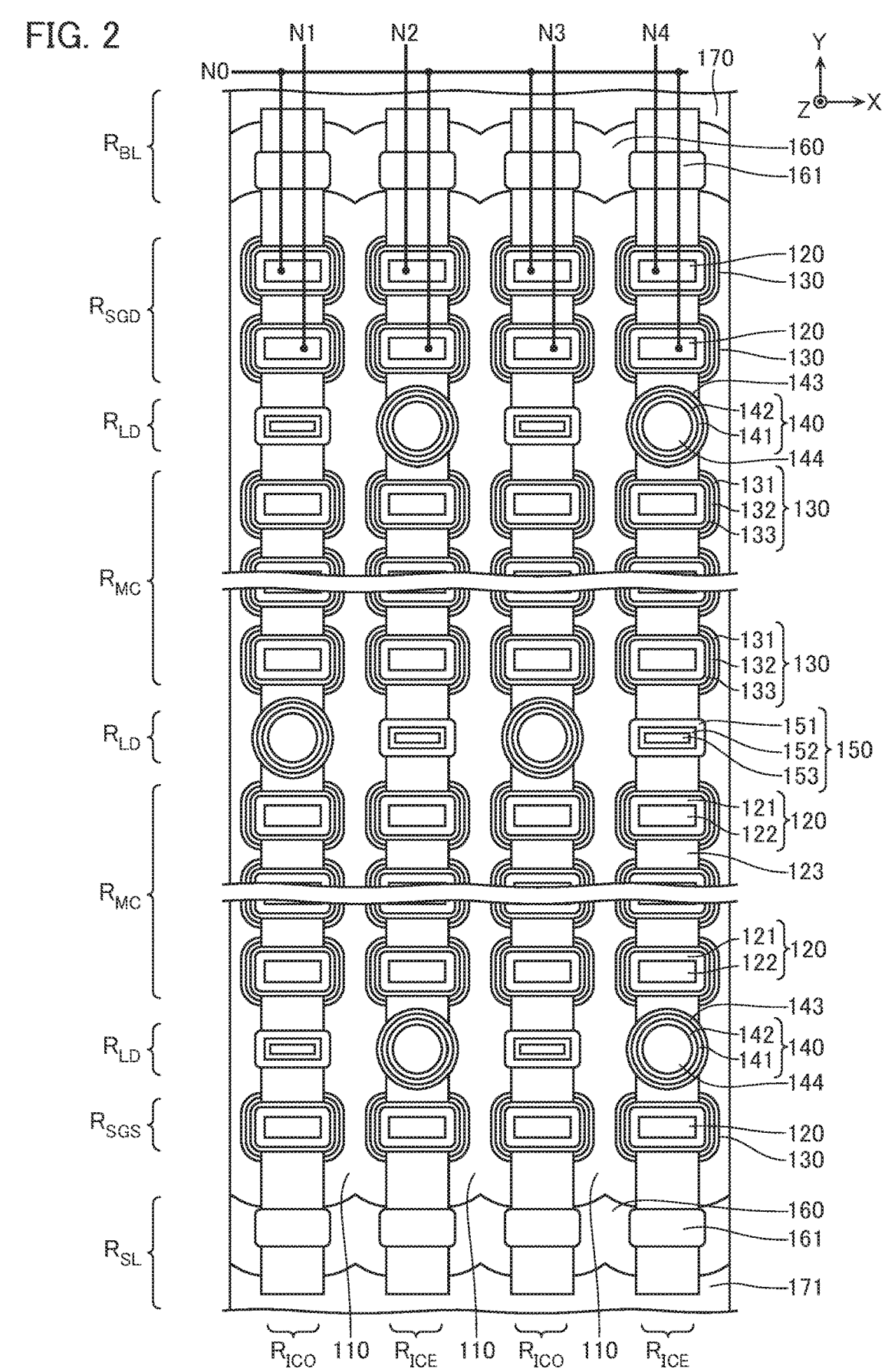
FIG. 2 is a schematic plan view illustrating a configuration of a part of the semiconductor memory device.
Figure 3:
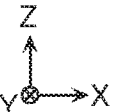
FIG. 3 is a schematic cross-sectional view illustrating a configuration of a part of the semiconductor memory device.
Figure 3:
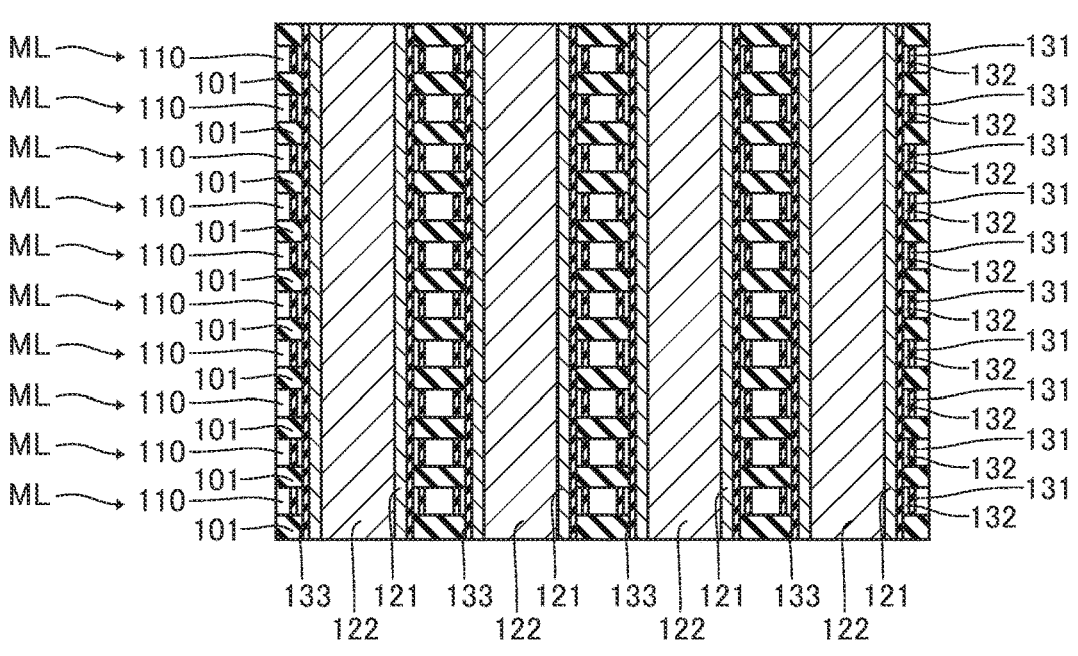
Figure 4:
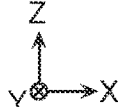
FIG. 4 is a schematic cross-sectional view illustrating a configuration of a part of the semiconductor memory device.
Figure 4:
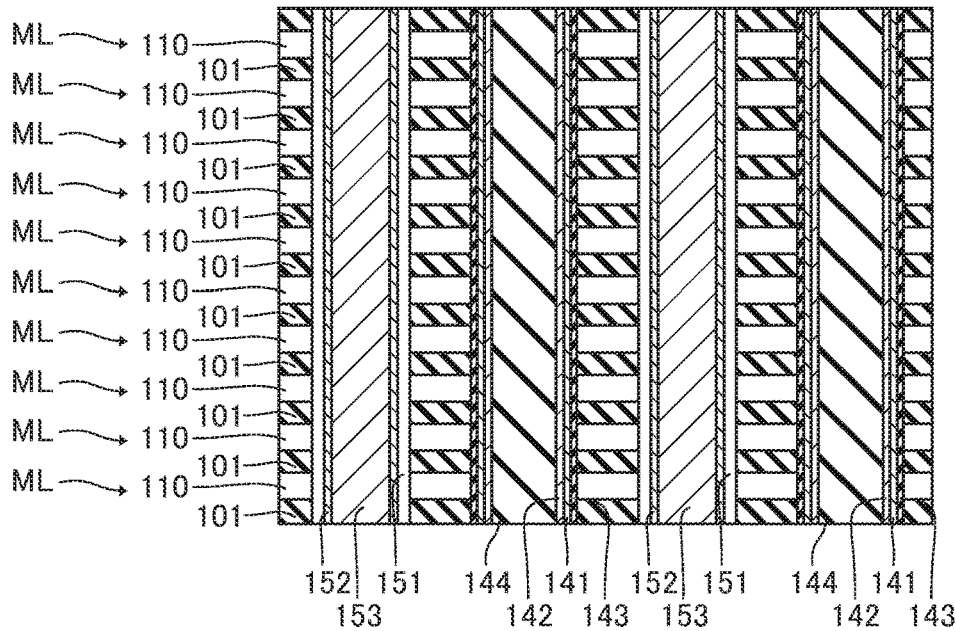
Figure 5:
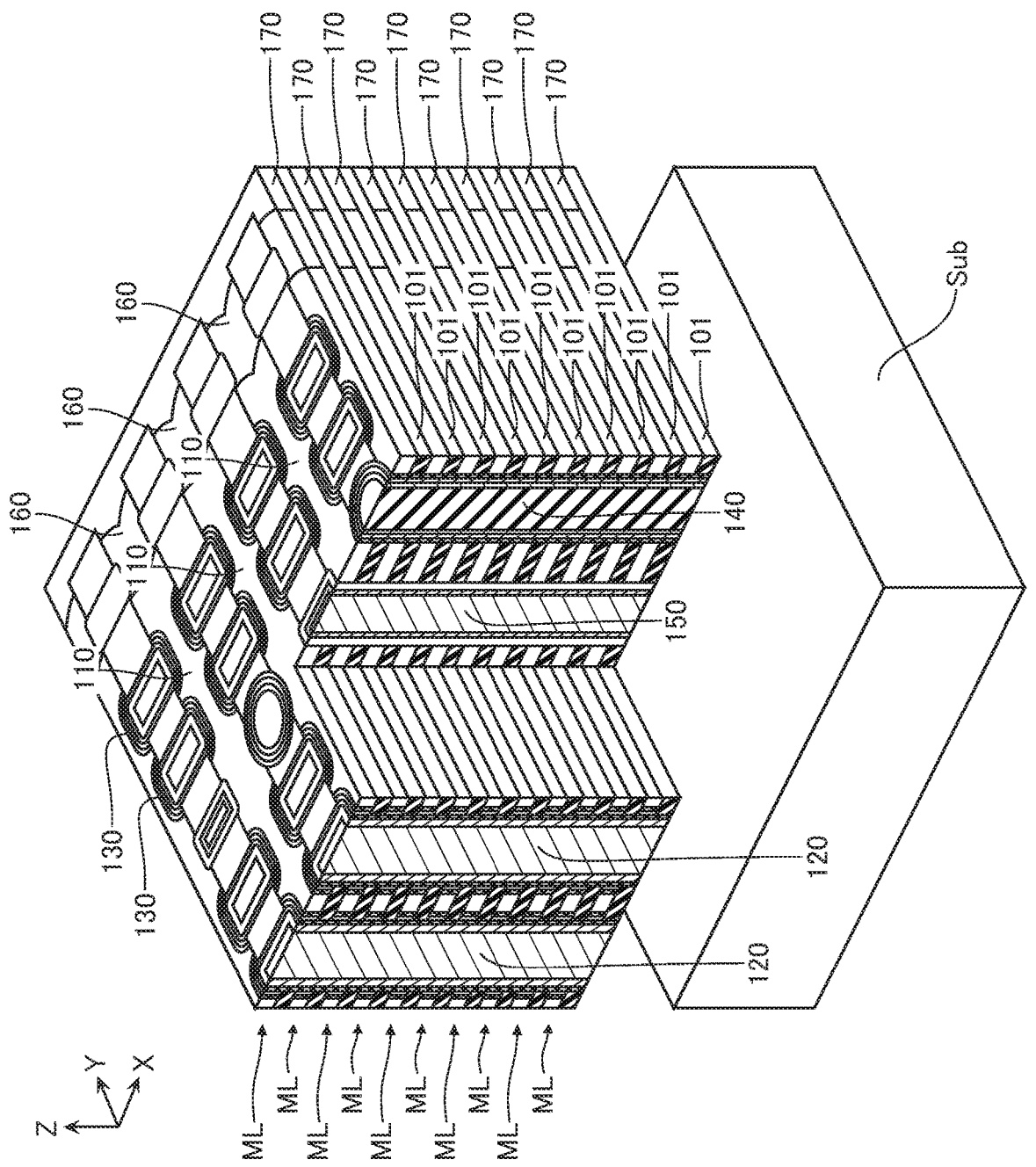
FIG. 5 is a schematic perspective view illustrating a configuration of a part of the semiconductor memory device.

FIG. 2 is a schematic plan view illustrating a configuration of a part of the semiconductor memory device according to the embodiment. FIG. 3 and FIG. 4 are schematic cross-sectional views illustrating a configuration of a part of the semiconductor memory device according to the embodiment. FIG. 5 is a schematic perspective view including parts illustrated in FIG. 2 to FIG. 4.

As illustrated in FIG. 2, in the memory block region $R_{BLK}$, a plurality of memory cell regions $R_{MC}$ and a plurality of ladder regions $R_{LD}$ alternately arranged in the Y-direction are disposed. At one end portion in the Y-direction of the memory block region $R_{BLK}$, a select transistor region $R_{SGD}$ and a bit line region $R_{BL}$ are disposed. At the other end portion in the Y-direction of the memory block region $R_{BLK}$, a select transistor region $R_{SGS}$ and a source line region $R_{SL}$ are disposed.

Note that, in the first embodiment, the ladder region $R_{LD}$ is disposed between the select transistor region $R_{SGD}$ and the memory cell region $R_{MC}$ positioned the closest thereto. Similarly, the ladder region $R_{LD}$ is disposed between the select transistor region $R_{SGS}$ and the memory cell region $R_{MC}$ positioned the closest thereto.

FIG. 5 illustrates a part of a semiconductor substrate Sub. The semiconductor substrate Sub includes, for example, silicon (Si) containing P-type impurities, such as boron (B), or the like. As illustrated, the semiconductor memory device according to the embodiment includes a plurality of memory layers ML arranged in the Z-direction. Between two memory layers ML adjacent in the Z-direction, an insulating layer 101, such as silicon oxide ($SiO_2$), is disposed.

The memory layer ML includes a plurality of semiconductor layers 110 arranged in the X-direction. These plurality of semiconductor layers 110 each extend in the Y-direction across the plurality of memory cell regions $R_{MC}$, the plurality of ladder regions $R_{LD}$, and the select transistor regions $R_{SGD}$, $R_{SGS}$ described with reference to FIG. 2. The semiconductor layer 110 functions, for example, as a plurality of memory transistors (memory cells) connected in series and channel regions of the select transistors connected thereto. Note that in the following description, a configuration that includes the plurality of memory transistors connected in series and the select transistors connected thereto is referred to as a memory string in some cases. The semiconductor layer 110 may, for example, include polycrystalline silicon (Si) and the like or include single-crystal silicon (Si) and the like. In such cases, the semiconductor layer 110 may include N-type impurities, such as phosphorus (P), may include P-type impurities, such as boron (B), or does not necessarily include impurities. When the semiconductor layer 110 includes single-crystal silicon (Si), an orientation of this silicon crystal may correspond to an orientation of the silicon crystal constituting the semiconductor substrate Sub.

Note that, in the following description, the region between the two semiconductor layers 110 adjacent in the X-direction is referred to as an "inter-channel region $R_{IC}$" in some cases. The odd-numbered inter-channel regions $R_{IC}$ counted from one side in the X-direction (for example, a negative side in the X-direction) are referred to as "inter-channel regions $R_{ICO}$" in some cases. The even-numbered inter-channel regions $R_{IC}$ counted from the one side in the X-direction are referred to as "inter-channel regions $R_{ICE}$" in some cases.

In the inter-channel region Ricin the memory cell region $R_{MC}$ and the select transistor regions $R_{SGD}$, $R_{SGS}$ (FIG. 2), for example, as illustrated in FIG. 2, a plurality of conductive layers 120 arranged in the Y-direction are disposed. In the memory cell regions $R_{MC}$, the memory layer ML includes a plurality of gate insulating layers 130 disposed between side surfaces in the X-direction of the plurality of conductive layers 120 and the semiconductor layers 110.

Among the conductive layers 120, ones disposed in the memory cell regions $R_{MC}$ function, for example, as gate electrodes of the plurality of memory transistors and word lines connected thereto. Among the conductive layers 120, ones disposed in the select transistor regions $R_{SGD}$, $R_{SGS}$ each function as gate electrodes of the select transistors and select gate lines connected thereto.

For example, as illustrated in FIG. 2, the conductive layer 120 may include a barrier conductive layer 121, such as titanium nitride (TiN), and a conductive layer 122, such as tungsten (W). For example, as illustrated in FIG. 3 and FIG. 5, the conductive layer 120 passes through the plurality of memory layers ML and extends in the Z-direction. Note that, between the two conductive layers 120 adjacent in the Y-direction, an insulating layer 123 (FIG. 2), such as silicon oxide ($SiO_2$), is disposed.

Note that, in the embodiment, the two conductive layers 120 arranged in the Y-direction are each disposed in the inter-channel region $R_{IC}$ in the select transistor region $R_{SGD}$.

Here, the conductive layer 120 positioned far from the memory cell region $R_{MC}$ of the two conductive layers 120 disposed in the inter-channel region $R_{ICO}$ in the select transistor region $R_{SGD}$ is used for turning the select transistor into OFF state. In the illustrated example, these conductive layers 120 are commonly connected to a node N0. On the other hand, the conductive layer 120 positioned close to the memory cell region $R_{MC}$ is used for turning the select transistor into ON state or OFF state. In the illustrated example, these conductive layers 120 are connected to nodes N1, N3. The nodes N0, N1, N3 are electrically independent from one another and are configured to forward independent voltages.

The conductive layer 120 positioned far from the memory cell region $R_{MC}$ of the two conductive layers 120 disposed in the inter-channel region $R_{ICE}$ in the select transistor region $R_{SGD}$ is used for turning the select transistor into ON state or OFF state. In the illustrated example, these conductive layers 120 are connected to nodes N2, N4. On the other hand, the conductive layer 120 positioned close to the memory cell region $R_{MC}$ is used for turning the select transistor into OFF state. In the illustrated example, these conductive layers 120 are commonly connected to the node N0. The nodes N0, N2, N4 are electrically independent from one another and are configured to forward independent voltages.

Note that, the arrangement of the conductive layers 120 in the above-described inter-channel regions $R_{ICO}$ and $R_{ICE}$ is only necessary to be alternate, and the inter-channel regions $R_{ICO}$ and $R_{ICE}$ may be inversely connected to the nodes N0 to N4. For example, the conductive layer 120 positioned far from the memory cell region $R_{MC}$ of the two conductive layers 120 disposed in the inter-channel region $R_{ICO}$ in the select transistor region $R_{SGD}$ may be connected to the nodes N1, N3 and the conductive layer 120 positioned close to the memory cell region $R_{MC}$ may be connected to the node N0. In this case, the conductive layer 120 positioned far from the memory cell region $R_{MC}$ of the two conductive layers 120 disposed in the inter-channel region $R_{ICE}$ in the select transistor region $R_{SGD}$ may be connected to the node N0 and the conductive layer 120 positioned close to the memory cell region $R_{MC}$ may be connected to the nodes N2, N4.

The gate insulating layer 130 includes, for example, tunnel insulating layers 131 disposed on side surfaces in the X-direction of the semiconductor layer 110, electric charge accumulating layers 132 disposed on side surfaces in the X-direction of the tunnel insulating layers 131, and a block insulating layer 133 disposed on side surfaces in the X-direction of the electric charge accumulating layers 132.

The tunnel insulating layer 131 may, for example, include silicon oxide ($SiO_2$) and the like.

The electric charge accumulating layer 132 may, for example, include polycrystalline silicon (Si) and the like. In this case, the electric charge accumulating layer 132 may include N-type impurities, such as phosphorus (P), may include P-type impurities, such as boron (B), or does not necessarily include impurities.

The block insulating layer 133 may, for example, include silicon oxide ($SiO_2$) and the like. The block insulating layer 133 may include any metal oxide film of an insulating property including aluminum oxide (AlO) or hafnium oxide (HfO).

In the inter-channel region $R_{IC}$ in the ladder region $R_{LD}$ (FIG. 2), a conductive layer 140 or a conductive layer 150 is disposed.

For example, in the illustrated example, in the inter-channel region $R_{ICO}$, the conductive layers 150 are disposed in the odd-numbered ladder regions $R_{LD}$ counted from one side in the Y-direction. In the even-numbered ladder regions $R_{LD}$, the conductive layers 140 are disposed.

In the inter-channel region $R_{ICE}$, the conductive layers 140 are disposed in the odd-numbered ladder regions $R_{LD}$ counted from the one side in the Y-direction. In the even-numbered ladder regions $R_{LD}$, the conductive layers 150 are disposed.

The conductive layer 140 functions, for example, as a gate electrode of a transistor and a wiring connected thereto. The conductive layer 140 may include a semiconductor layer 141, such as polycrystalline silicon (Si), containing N-type impurities, such as phosphorus (P), and a conductive layer 142, such as titanium nitride (TiN), for example, as illustrated in FIG. 2 and FIG. 4. The conductive layer 140 passes through the plurality of memory layers ML and extends in the Z-direction. The conductive layer 140 has an outer peripheral surface on which an insulating layer 143, such as silicon oxide (SiO$_2$), is disposed. The conductive layer 140 has a center portion in which an insulating layer 144, such as silicon oxide (SiO$_2$), may be disposed.

The conductive layer 150 may include a semiconductor layer 151, such as polycrystalline silicon (Si), containing P-type impurities, such as boron (B), a conductive layer 152, such as titanium nitride (TiN), and a conductive layer 153, such as tungsten (W), for example, as illustrated in FIG. 2 and FIG. 4. The conductive layer 150 passes through the plurality of memory layers ML and extends in the Z-direction. The conductive layer 150 has an outer peripheral surface connected to the plurality of semiconductor layers 110 arranged in the Z-direction.

In the bit line region $R_{BL}$ (FIG. 2), the memory layer ML includes a plurality of semiconductor layers 160 arranged in the X-direction and a conductive layer 170 connected to these plurality of semiconductor layers 160.

The semiconductor layer 160 may, for example, include a semiconductor layer, such as polycrystalline silicon (Si), containing N-type impurities, such as phosphorus (P). The semiconductor layers 160 are each connected to an end portion in the Y-direction of the semiconductor layer 110. Between the two semiconductor layers 160 adjacent in the X-direction, an insulating layer 161 is disposed. The insulating layer 161 may, for example, include silicon oxide (SiO$_2$) and the like. The insulating layer 161 passes through the plurality of memory layers ML and extends in the Z-direction.

The conductive layer 170 functions, for example, as bit lines. The conductive layer 170 may, for example, include a conductive layer, such as titanium nitride (TiN). The conductive layer 170 extends in the X-direction and is connected to the plurality of semiconductor layers 110 via the plurality of semiconductor layers 160.

In the source line region $R_{SL}$ (FIG. 2), the memory layer ML includes the plurality of semiconductor layers 160 arranged in the X-direction and a conductive layer 171 connected to these plurality of semiconductor layers 160.

The conductive layer 171 functions, for example, as source lines. The conductive layer 171 may, for example, include a conductive layer, such as titanium nitride (TiN). The conductive layer 171 extends in the X-direction and is connected to the plurality of semiconductor layers 110 via the plurality of semiconductor layers 160.

[Read Operation]

Figure 6:
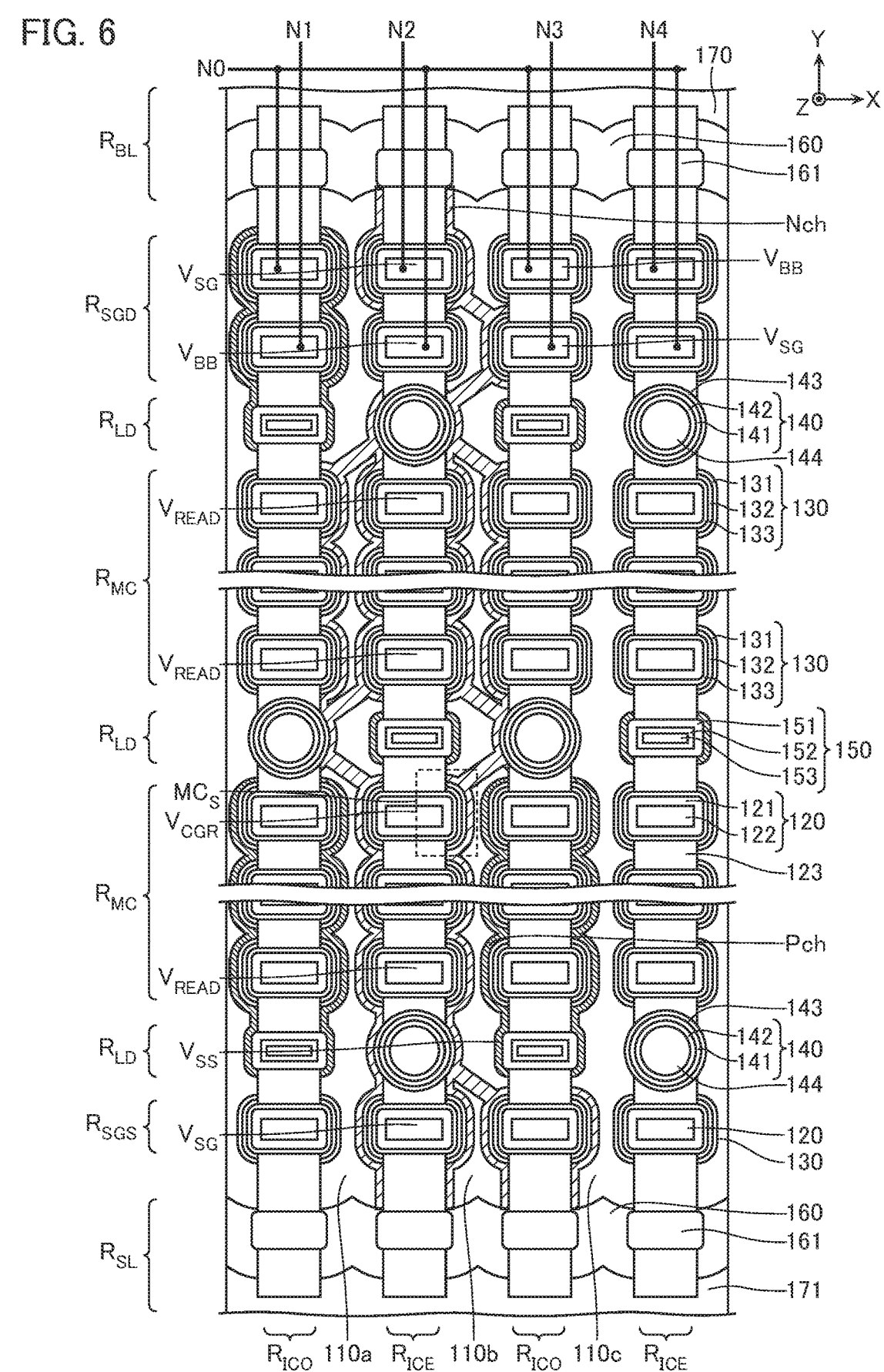
FIG. 6 is a schematic plan view for describing a read operation of the semiconductor memory device.
Figure 7:
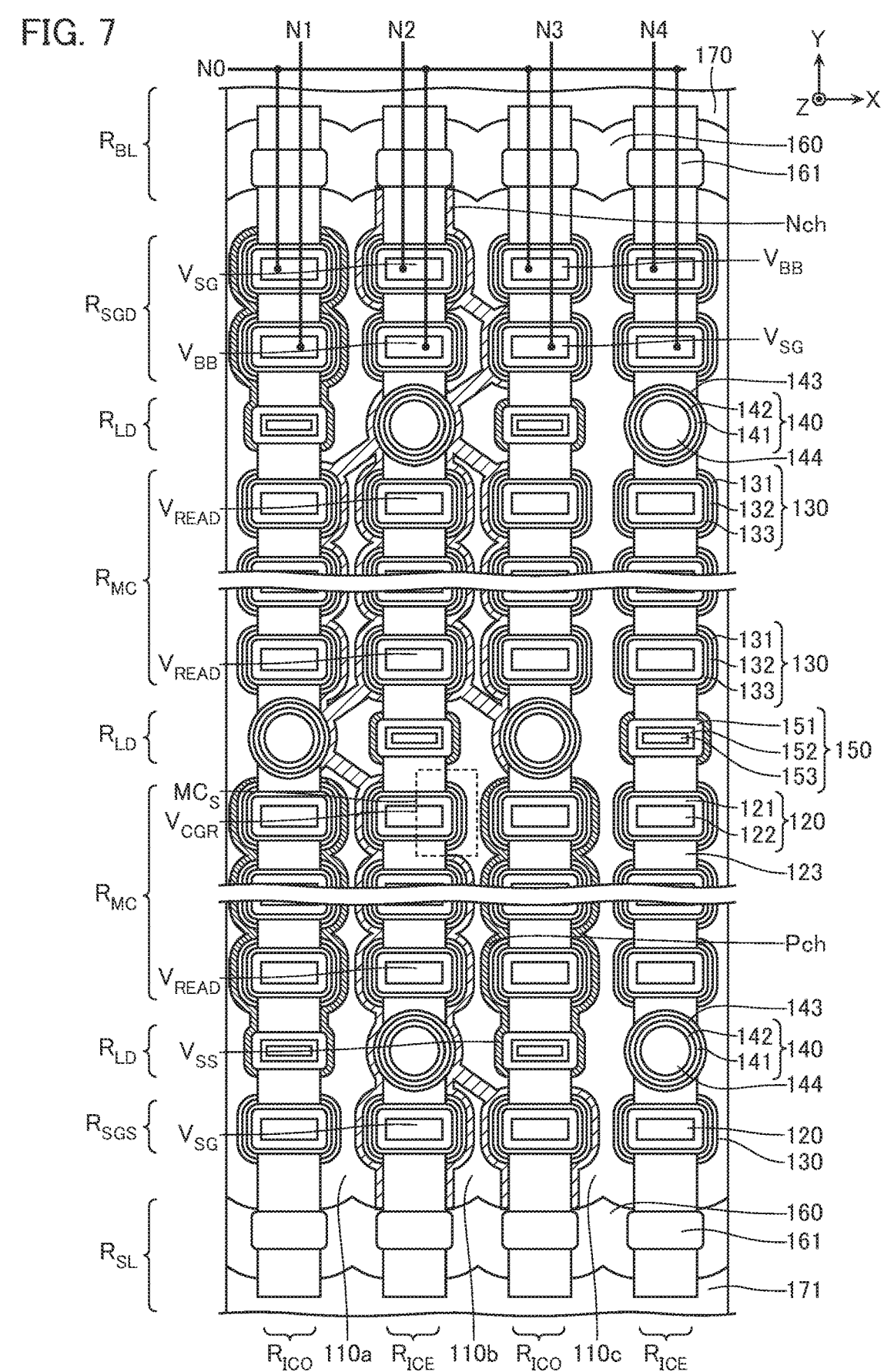
FIG. 7 is a schematic plan view for describing the read operation of the semiconductor memory device.

Next, with reference to FIG. 6 and FIG. 7, a read operation of the semiconductor memory device according to the first embodiment will be described. FIG. 6 and FIG. 7 are schematic plan views for describing the read operation of the semiconductor memory device according to the first embodiment. Note that, in FIG. 6 and FIG. 7, three semiconductor layers 110 arranged in the X-direction are illustrated as respective semiconductor layers 110a, 110b, 110c. FIG. 6 and FIG. 7 illustrate an example in which one of the plurality of memory cells disposed at one side in the X-direction of the semiconductor layer 110b is a selected memory cell $MC_S$.

In the read operation, the conductive layer 120 that functions as a gate electrode of the selected memory cell $MC_S$ is applied with a read voltage $V_{CGR}$. The read voltage $V_{CGR}$ has a magnitude that turns the memory cell into ON state or OFF state according to data stored in the memory cell. For example, when the selected memory cell $MC_S$ has a threshold voltage smaller than the read voltage, as illustrated in FIG. 6, an electron channel Nch is formed in a channel region of the selected memory cell $MC_S$. On the other hand, when the selected memory cell $MC_S$ has a threshold voltage larger than the read voltage, as illustrated in FIG. 7, the electron channel Nch is not formed in the channel region of the selected memory cell $MC_S$.

In the read operation, ones disposed at one side in the X-direction with respect to the semiconductor layer 110b (at the same side as the selected memory cell $MC_S$) among the plurality of conductive layers 120 disposed in the memory cell region $R_{MC}$ in common with the selected memory cell $MC_S$ are applied with a read pass voltage $V_{READ}$. The read pass voltage $V_{READ}$ has a magnitude that turns the memory cell into ON state regardless of data stored in the memory cell. This forms the electron channel Nch at the proximity of the selected memory cell $MC_S$.

In the read operation, ones disposed at the other side in the X-direction with respect to the semiconductor layer 110b (at the opposite side of the selected memory cell $MC_S$) among the plurality of conductive layers 120 disposed in the memory cell region $R_{MC}$ in common with the selected memory cell $MC_S$ are applied with a back surface cell blocking voltage $V_{BC}$. The back surface cell blocking voltage $V_{BC}$ has a magnitude that turns the memory cell into OFF state regardless of data stored in the memory cell. This forms hole channels Pch at the proximities of these plurality of conductive layers 120. This hole channel Pch is applied with a ground voltage $V_{SS}$ via the conductive layer 150.

In the read operation, the plurality of conductive layers 120 disposed in the memory cell regions $R_{MC}$ other than the memory cell region $R_{MC}$ in common with the selected memory cell $MC_S$ and the conductive layers 140 are applied with the read pass voltage $V_{READ}$. Two nodes corresponding to the semiconductor layer 110b (in the illustrated example, the nodes N2, N3) of the nodes N1 to N4 are applied with a voltage $V_{SG}$, and the nodes other than them (in the illustrated example, the nodes N0, N1, N4) are applied with a blocking voltage $V_{BB}$. The voltage $V_{SG}$ has a magnitude that turns the select transistor into ON state. The blocking voltage $V_{BB}$ has a magnitude that turns the select transistor into OFF state. This electrically conducts the conductive layer 170 functioning as the bit line and the conductive layer 171 functioning as the source line to the selected memory cell $MC_S$.

In the read operation, a voltage is applied between the conductive layers 170 and 171. When a current flows in the conductive layer 170, it is determined that the selected memory cell $MC_S$ is in ON state. On the other hand, when a current does not flow in the conductive layer 170, it is determined that the selected memory cell $MC_S$ is in OFF state.

Comparative Example

Figure 8:
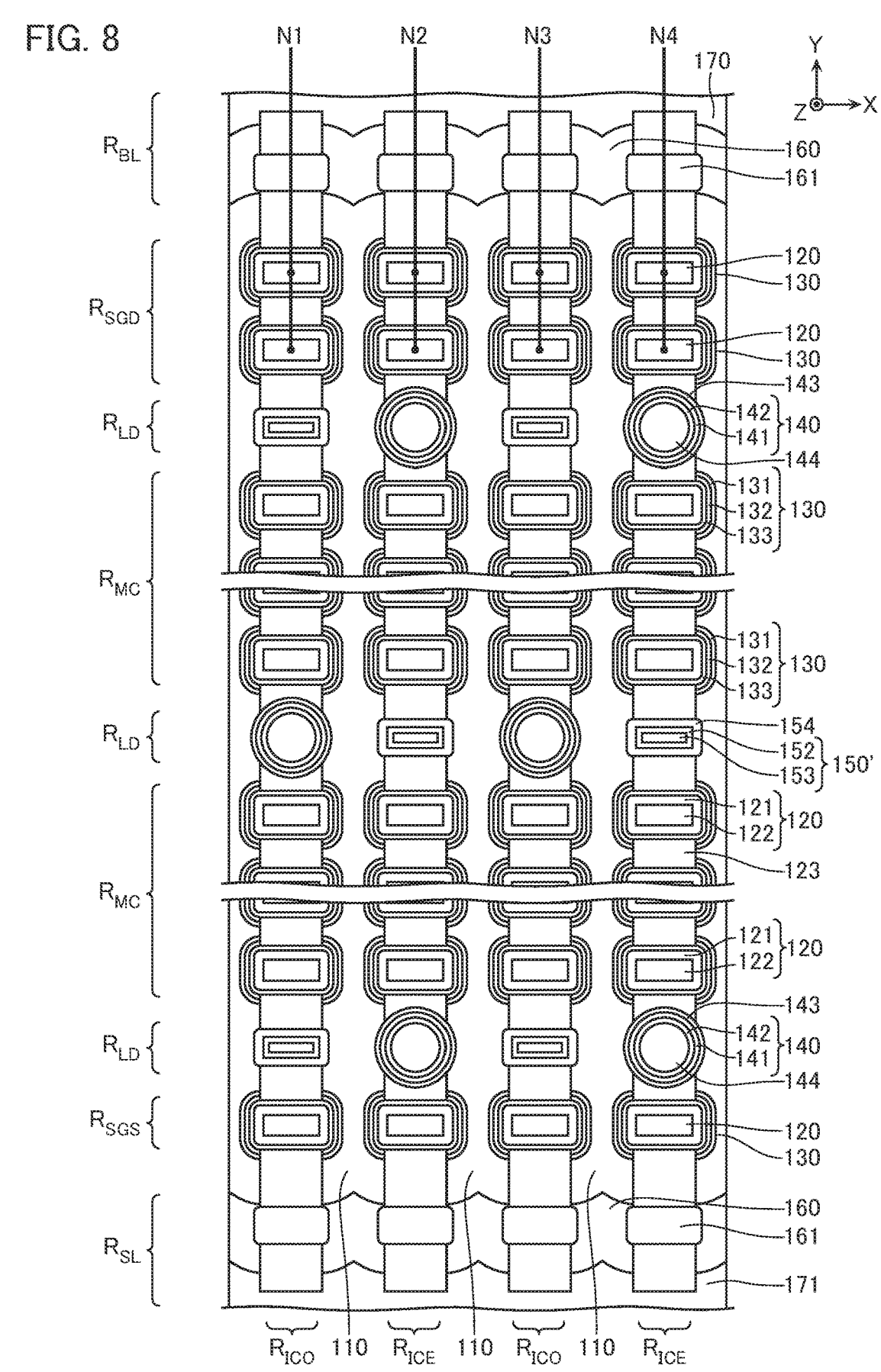
FIG. 8 is a schematic plan view for describing a configuration of a semiconductor memory device according to a comparative example.

Next, with reference to FIG. 8, a configuration of a semiconductor memory device according to a comparative example will be described. FIG. 8 is a schematic plan view for describing the configuration of the semiconductor memory device according to the comparative example.

The semiconductor memory device according to the comparative example includes conductive layers 150' instead of the conductive layers 150. The conductive layer 150' includes, for example, the above-described conductive layers 152, 153. The conductive layer 150' has an outer peripheral surface on which an insulating layer 154, such as silicon oxide ($SiO_2$), is disposed. The conductive layer 150' is insulated from the semiconductor layer 110 via this insulating layer 154.

Also in the comparative example, two conductive layers 120 arranged in the Y-direction are each disposed in the inter-channel region $R_{IC}$ in the select transistor region $R_{SGD}$. These two conductive layers 120 are each commonly connected to any one of the nodes N1 to N4.

Figure 9:
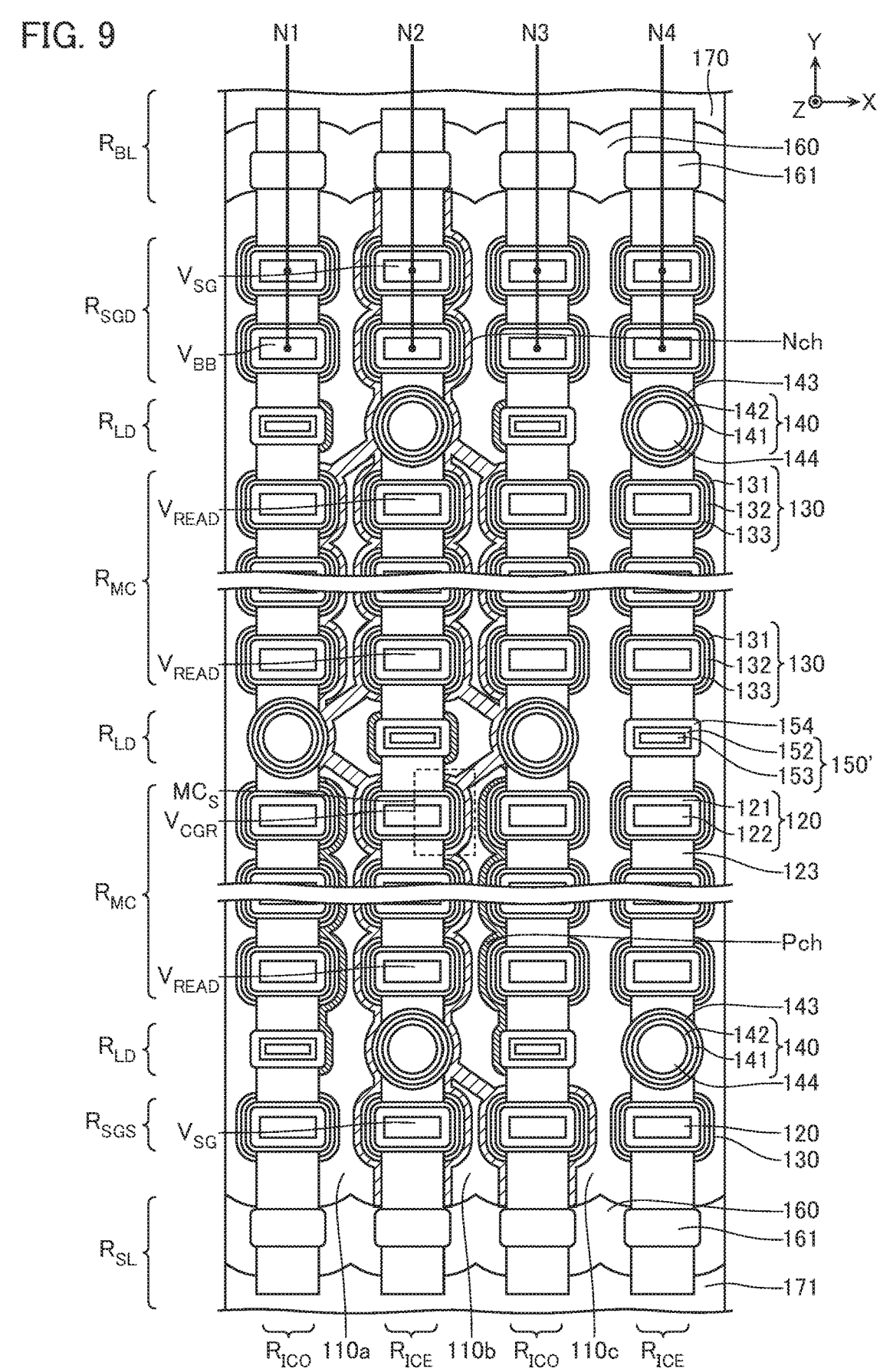
FIG. 9 is a schematic plan view for describing a read operation of the semiconductor memory device according to the comparative example.

Next, with reference to FIG. 9, a read operation of the semiconductor memory device according to the comparative example will be described. FIG. 9 is a schematic plan view for describing the read operation of the semiconductor memory device according to the comparative example. Note that, in FIG. 9, three semiconductor layers 110 arranged in the X-direction are illustrated as the respective semiconductor layers 110a, 110b, 110c. FIG. 9 illustrates an example in which one of the plurality of memory cells disposed at one side in the X-direction of the semiconductor layer 110b is the selected memory cell $MC_S$.

Also in the read operation of the semiconductor memory device according to the comparative example, ones disposed at the other side in the X-direction with respect to the semiconductor layer 110b (at the opposite side of the selected memory cell $MC_S$) among the plurality of conductive layers 120 disposed in the memory cell region $R_{MC}$ in common with the selected memory cell $MC_S$ are applied with the back surface cell blocking voltage $V_{BC}$. This forms the hole channels Pch at the proximities of these plurality of conductive layers 120.

In the read operation of the semiconductor memory device according to the comparative example, for example, one connected to the conductive layers 120 disposed at the one side in the X-direction with respect to the semiconductor layer 110b (at the same side as the selected memory cell $MC_S$) of the nodes N1 to N4 are applied with the voltage $V_{SG}$ (in the illustrated example, the node N2), and the nodes other than them (in the illustrated example, the nodes N1, N3, N4) are applied with the blocking voltage $V_{BB}$.

[Threshold Voltage of Selected Memory Cell $MC_S$]

In the example in FIG. 9, the selected memory cell $MC_S$ is disposed at the one side in the X-direction with respect to the semiconductor layer 110b. Here, when unselected memory cells disposed at the other side in the X-direction with respect to the semiconductor layer 110b are turned into ON state, a current flows to the conductive layer 170 regardless of data stored in the selected memory cell $MC_S$, and thus, the data stored in the selected memory cell $MC_S$ cannot be preferably determined in some cases. Therefore, in the semiconductor memory device according to the comparative example, in order to surely turn such unselected memory cells into OFF state, the back surface cell blocking voltage $V_{BC}$ is applied to the gate electrode of such unselected memory cells. In such a case, the hole channels Pch are formed in the channel regions of such unselected memory cells in some cases.

Here, in the semiconductor memory device according to the comparative example, the conductive layer 150' is disposed at the proximity of the above-described hole channel Pch. As described above, the conductive layer 150' is insulated from the semiconductor layer 110 via the insulating layer 154. Accordingly, this hole channel Pch is in an electrically floating state. In such a case, a voltage of this hole channel Pch is significantly varied in some cases due to, for example, an effect of capacitive coupling with the conductive layer 120 at the proximity of the hole channel Pch. This effect varies the threshold voltage of the selected memory cell $MC_S$ in some cases. This may cause a case where the data stored in the selected memory cell $MC_S$ cannot be preferably read out.

Therefore, in the semiconductor memory device according to the first embodiment, the conductive layer 150 connected to the semiconductor layer 110 via the semiconductor layer 151 including P-type impurities, such as boron (B), is disposed in the ladder region $R_{LD}$. With such a configuration, the voltage of the hole channel Pch described above is fixed to reduce the variation of the threshold voltage of the selected memory cell $MC_S$, thereby allowing to preferably execute the read operation.

[Providing the Holes]

Upon an erase operation, the holes need to be provided in the semiconductor layers 110. Here, in the semiconductor memory device according to the comparative example, the semiconductor layers 110 are connected to the conductive layers 170, 171 via the semiconductor layers 160 including N-type impurities. In such a configuration, it is considered to provide the holes in the semiconductor layers 110 by generating a Gate Induced Drain Leakage (GIDL) in the erase operation. However, when such a method is employed, the erase operation may take time.

Here, in the semiconductor memory device according to the first embodiment, the conductive layer 150 connected to the semiconductor layer 110 via the semiconductor layer 151 including P-type impurities, such as boron (B), is disposed in the ladder region $R_{LD}$. With such a configuration, without generating the GIDL upon the erase operation, the holes can be provided in the semiconductor layer 110 from the conductive layer 150. Accordingly, the erase operation is executable at high speed.

[Characteristics of Select Transistor]

In the semiconductor memory device according to the comparative example, the two conductive layers 120 arranged in the Y-direction are connected to the common node in the select transistor region $R_{SGD}$. In such a configuration, for example, as illustrated in FIG. 9, when the voltage $V_{SG}$ is applied to the node N2, the electron channel Nch is formed not only in the semiconductor layer 110b, but also in the semiconductor layer 110a in some cases. The conductive layer 170 and the conductive layer 171 are electrically conducted via the channel formed in the semiconductor layer 110a in some cases. In such a case, a current flows in the conductive layer 170 regardless of data stored in the selected memory cell $MC_S$, thereby failing to preferably determine the data stored in the selected memory cell $MC_S$ in some cases.

Therefore, in the semiconductor memory device according to the first embodiment, the voltage $V_{SG}$ is applied to one of the two conductive layers 120 disposed at one side in the X-direction with respect to the semiconductor layer 110$b$ and the blocking voltage $V_{BB}$ is applied to the other in the select transistor region $R_{SGD}$. The blocking voltage $V_{BB}$ is applied to one of the two conductive layers 120 disposed at the other side in the X-direction with respect to the semiconductor layer 110$b$ and the voltage $V_{SG}$ is applied to the other. The blocking voltage $V_{BB}$ is applied to the rest of the conductive layers 120 corresponding to the semiconductor layers 110$a$, 110$c$. With such a method, it is possible to preferably separate the electron channel Nch formed in the semiconductor layers 110$a$, 110$c$ from the conductive layer 170. This allows to preferably execute the read operation.

Second Embodiment

[Configuration]

Figure 10:
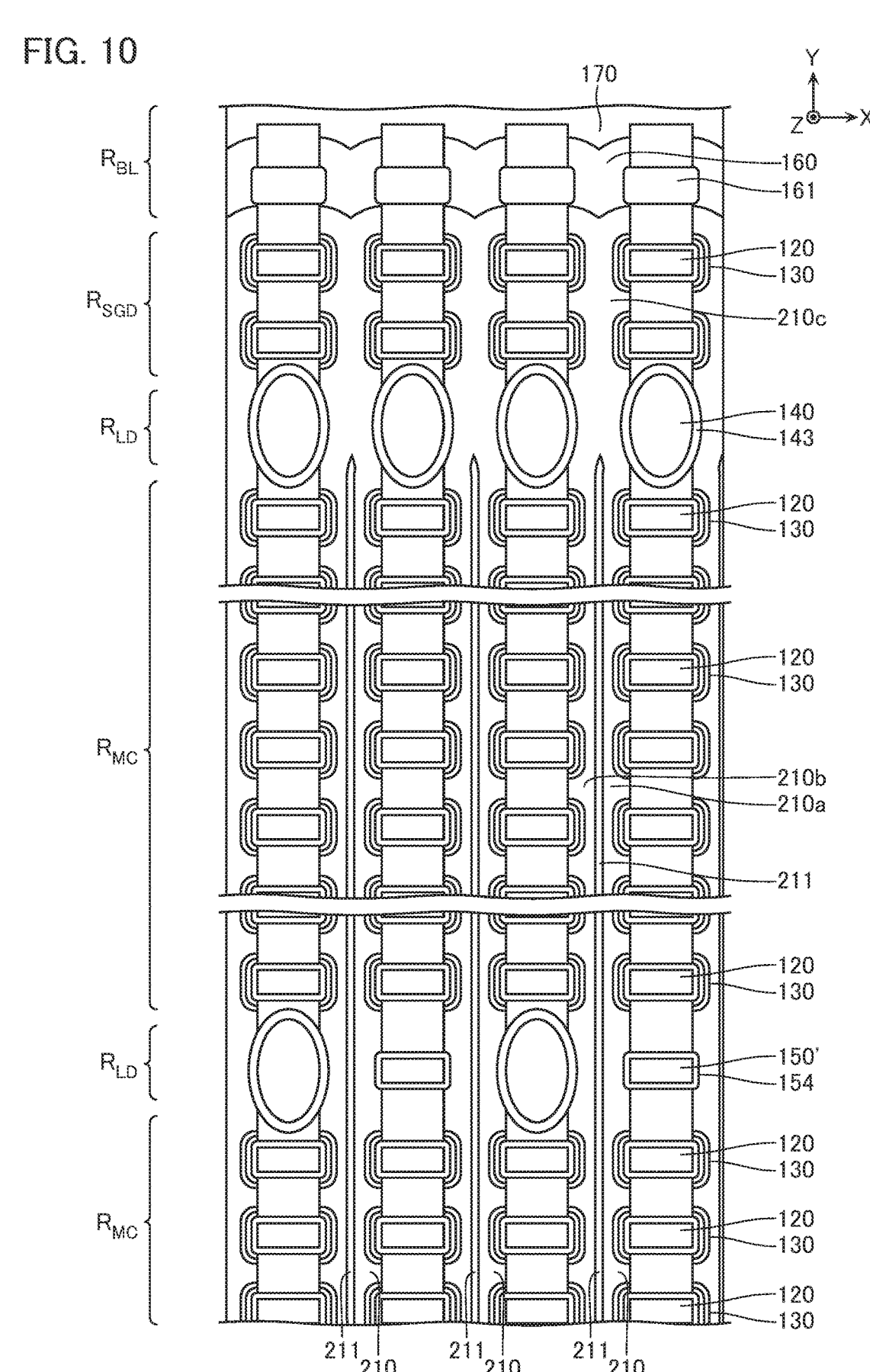
FIG. 10 is a schematic plan view illustrating a configuration of a part of a semiconductor memory device according to a second embodiment.
Figure 11:
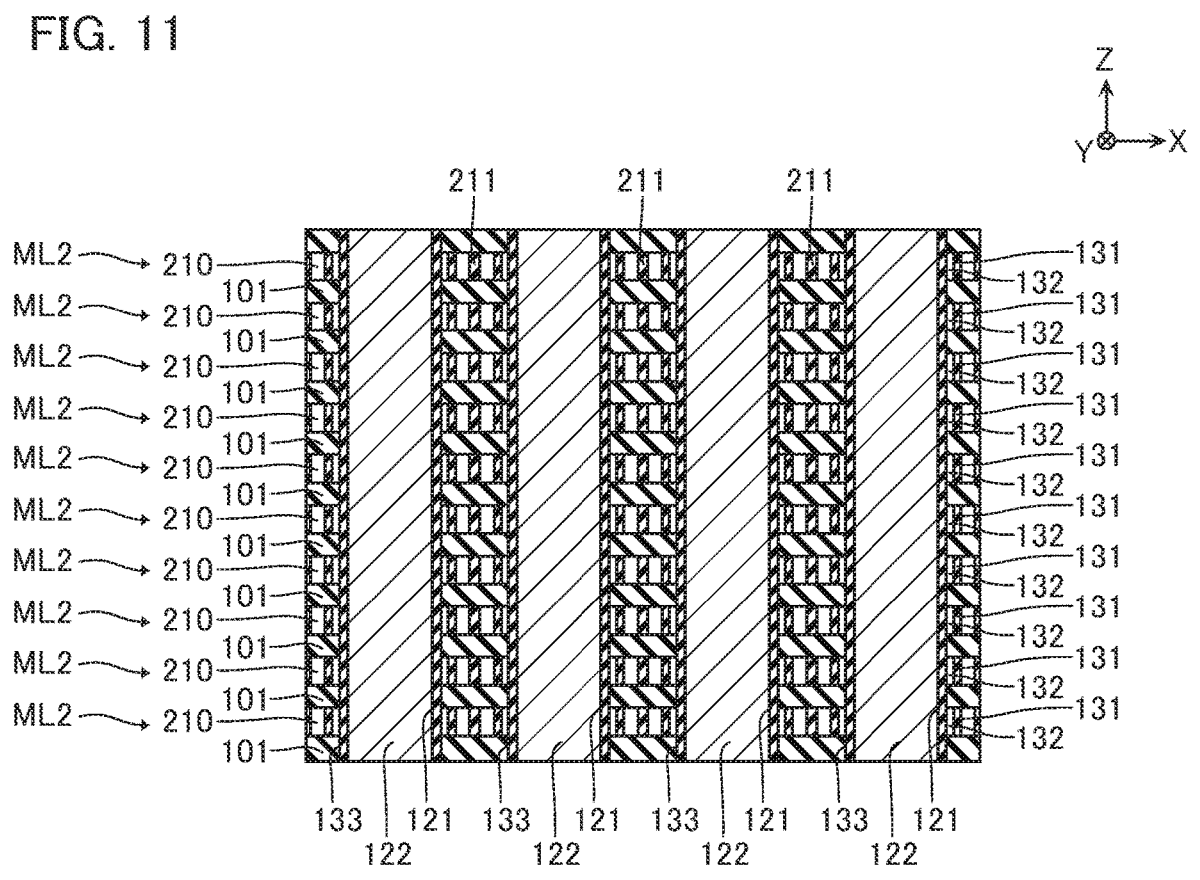

FIG. 10 is a schematic cross-sectional view illustrating a configuration of a part of a semiconductor memory device according to a second embodiment. FIG. 11 is a schematic plan view illustrating a configuration of a part of the semiconductor memory device.

In the semiconductor memory device according to the first embodiment, the conductive layer 150 is disposed in the ladder region $R_{LD}$, and this reduces a variation of the threshold voltage of the selected memory cell $MC_S$ in the read operation. However, such a configuration is merely an example. The method for reducing the variation of the threshold voltage of the selected memory cell $MC_S$ described above is appropriately adjustable. For example, in the semiconductor memory device according to the second embodiment, as illustrated in FIG. 10 and FIG. 11, semiconductor layers 210 that function as channel regions and the like of the memory cells are separated in the X-direction, and this reduces the variation of the threshold voltage of the selected memory cell $MC_S$ described above.

The semiconductor memory device according to the second embodiment is basically configured similarly to the semiconductor memory device according to the first embodiment.

However, as described above, the semiconductor memory device according to the second embodiment includes memory layers ML2 instead of the memory layers ML described with reference to FIG. 3 to FIG. 5. The memory layer ML2 is basically configured similarly to the memory layer ML.

However, the memory layer ML2 includes the semiconductor layers 210 instead of the semiconductor layers 110. The semiconductor layer 210 is basically configured similarly to the semiconductor layer 110. However, the semiconductor layer 210 includes portions 210$a$, 210$b$ extending in the Y-direction across the plurality of memory cell regions $R_{MC}$ and the plurality of ladder regions $R_{LD}$ alternately arranged in the Y-direction and a portion 210$c$ disposed in the select transistor region $R_{SGD}$ as illustrated in FIG. 10. The portions 210$a$, 210$b$ are arranged in the X-direction. Between the portions 210$a$ and 210$b$, an insulating layer 211, such as silicon oxide ($SiO_2$), extending in the Y-direction is disposed.

The semiconductor memory device according to the second embodiment includes the conductive layer 150' instead of the above-described conductive layer 150. The conductive layer 150' has the outer peripheral surface on which the insulating layer 154 is disposed.

[Manufacturing Method]

FIG. 12 to FIG. 35 are schematic cross-sectional views or plan views for describing a method for manufacturing the semiconductor memory device according to the second embodiment. FIG. 13, FIG. 17, FIG. 22, FIG. 24, FIG. 28 to FIG. 31, and FIG. 34 correspond to portions corresponding to FIG. 10. FIG. 12, FIG. 14 to FIG. 16, FIG. 18 to FIG. 21, FIG. 23, FIG. 25 to FIG. 27, FIG. 32, FIG. 33, and FIG. 35 correspond to portions corresponding to FIG. 11.

Figure 12:
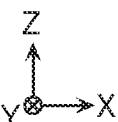
FIG. 12 is a schematic cross-sectional view for describing a method for manufacturing the semiconductor memory device according to the second embodiment.
Figure 12:
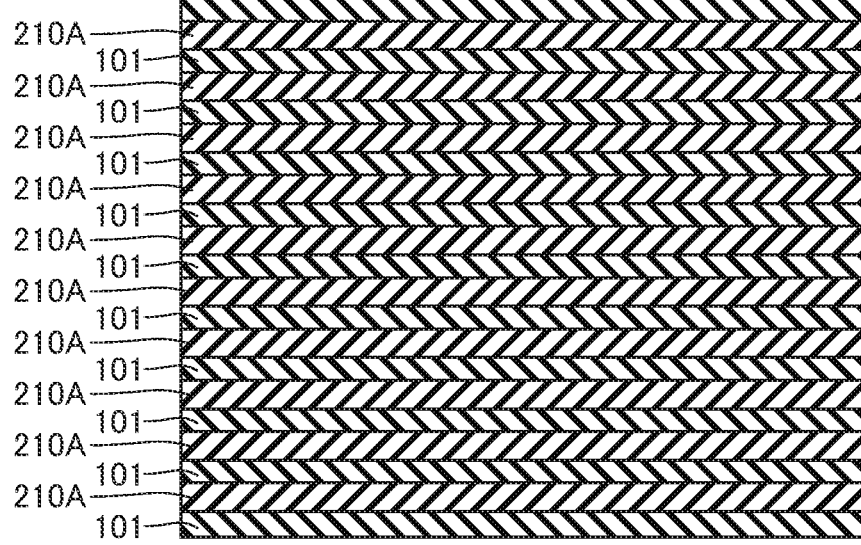

In the manufacturing method, for example, as illustrated in FIG. 12, a plurality of the insulating layers 101 and a plurality of sacrifice layers 210A are alternately formed. This process is, for example, performed by Chemical Vapor Deposition (CVD) or the like.

Figure 13:
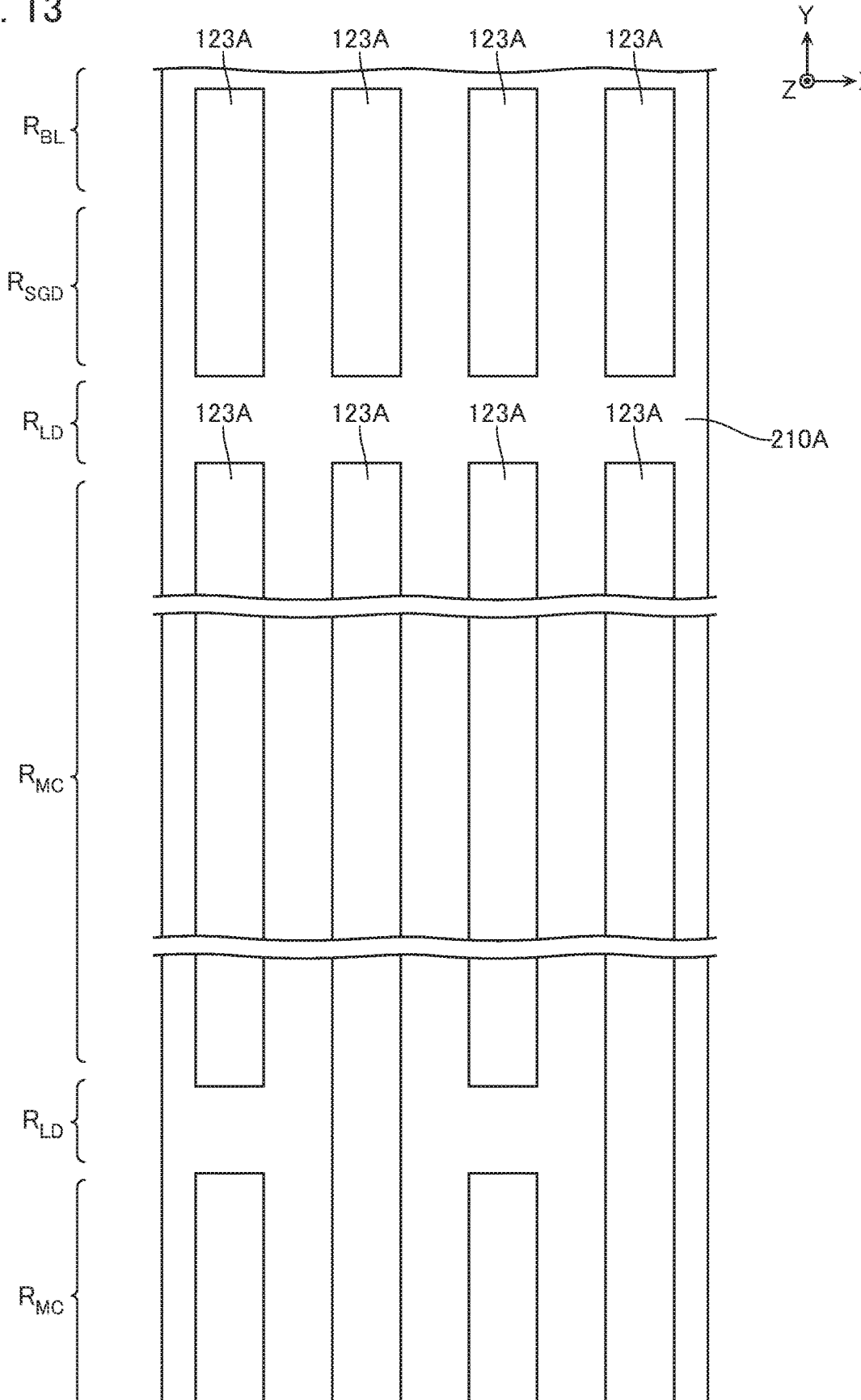
FIG. 13 is a schematic plan view for describing the manufacturing method.
Figure 14:
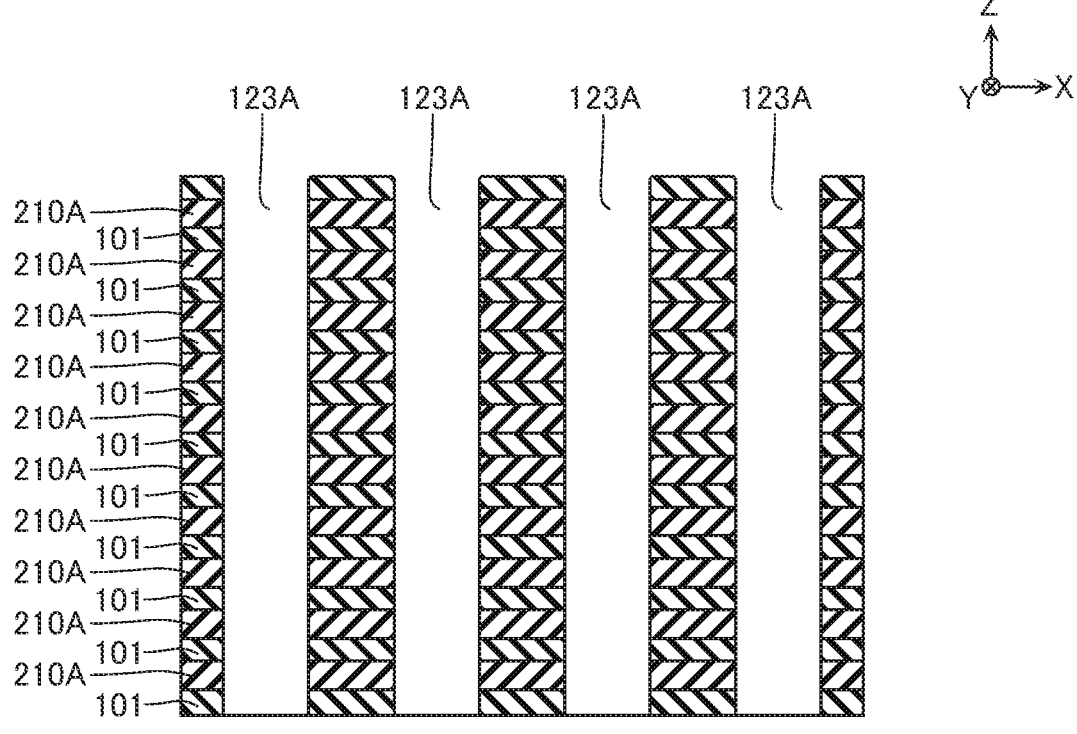
FIG. 14 is a schematic cross-sectional view for describing the manufacturing method.

Next, for example, as illustrated in FIG. 13 and FIG. 14, openings 123A are formed. The openings 123A extend in the Y-direction and are arranged in the X-direction as illustrated in FIG. 13. The openings 123A extend in the Z-direction and pass through the plurality of insulating layers 101 and the plurality of sacrifice layers 210A arranged in the Z-direction as illustrated in FIG. 14. This process is, for example, performed by Reactive Ion Etching (RIE) or the like.

Figure 15:
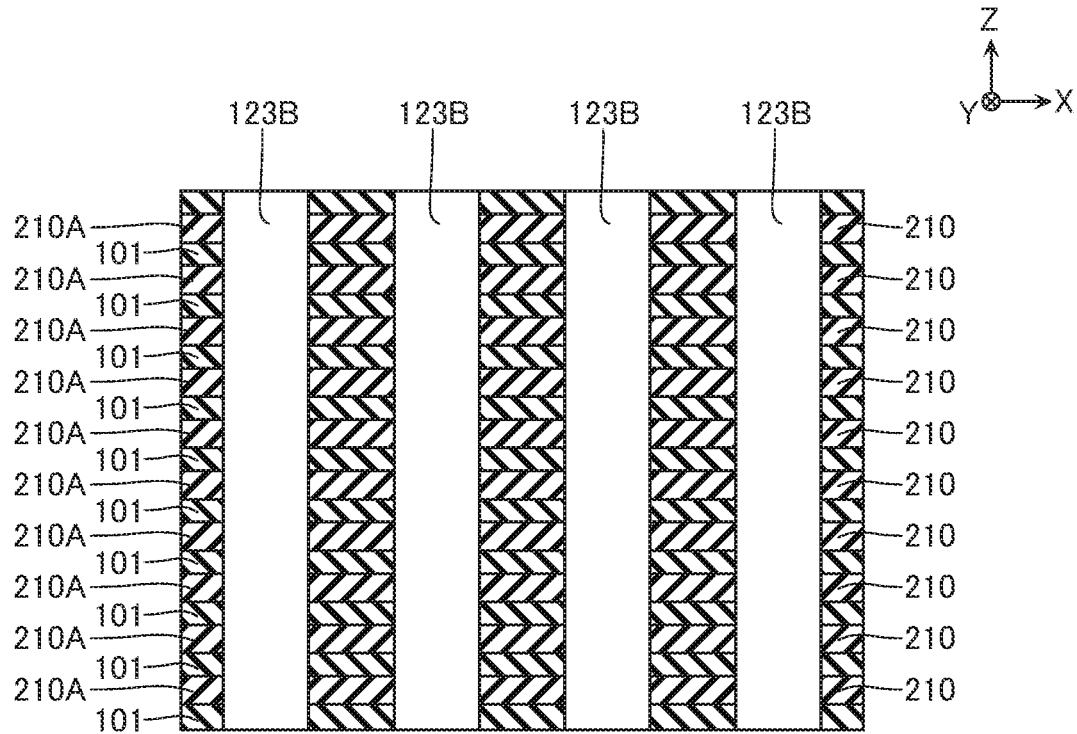
FIG. 15 is a schematic cross-sectional view for describing the manufacturing method.

Next, for example, as illustrated in FIG. 15, sacrifice layers 123B are formed inside the openings 123A. This process is, for example, performed by CVD or the like.

Figure 16:
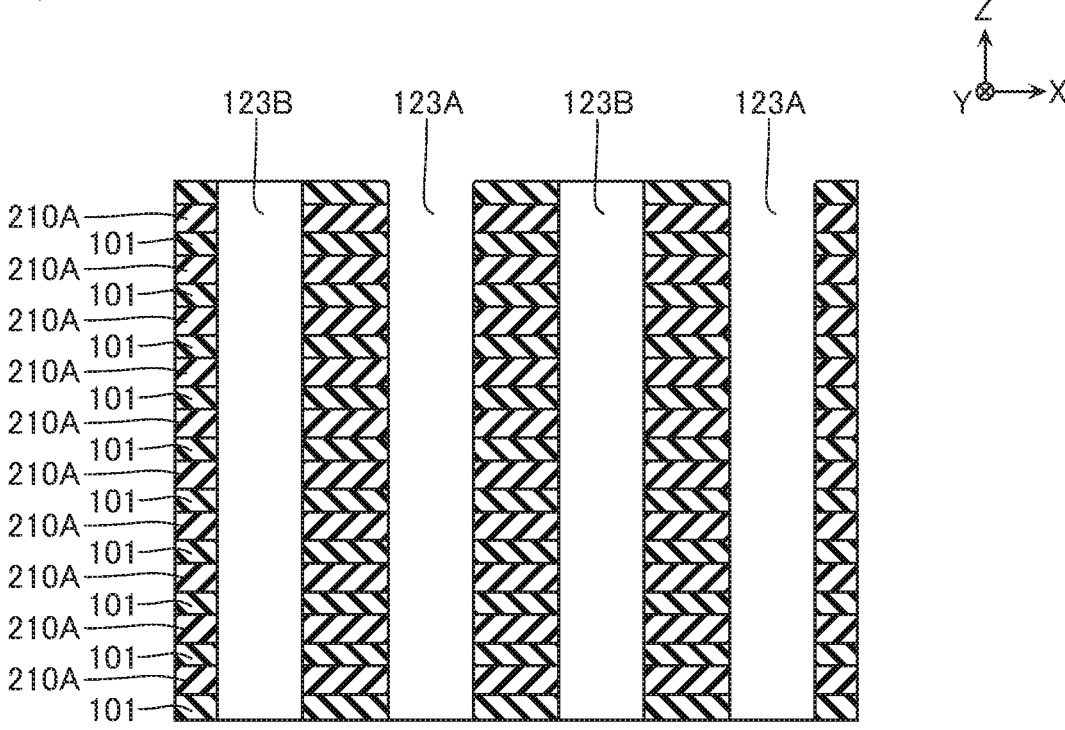
FIG. 16 is a schematic cross-sectional view for describing the manufacturing method.

Next, for example, as illustrated in FIG. 16, among the plurality of openings 123A provided in the memory cell region $R_{MC}$ and the select transistor region $R_{SGD}$, the sacrifice layers 123B disposed inside the even-numbered openings 123A counted from one side in the X-direction are removed. This process is, for example, performed by a method, such as wet etching.

Figure 17:
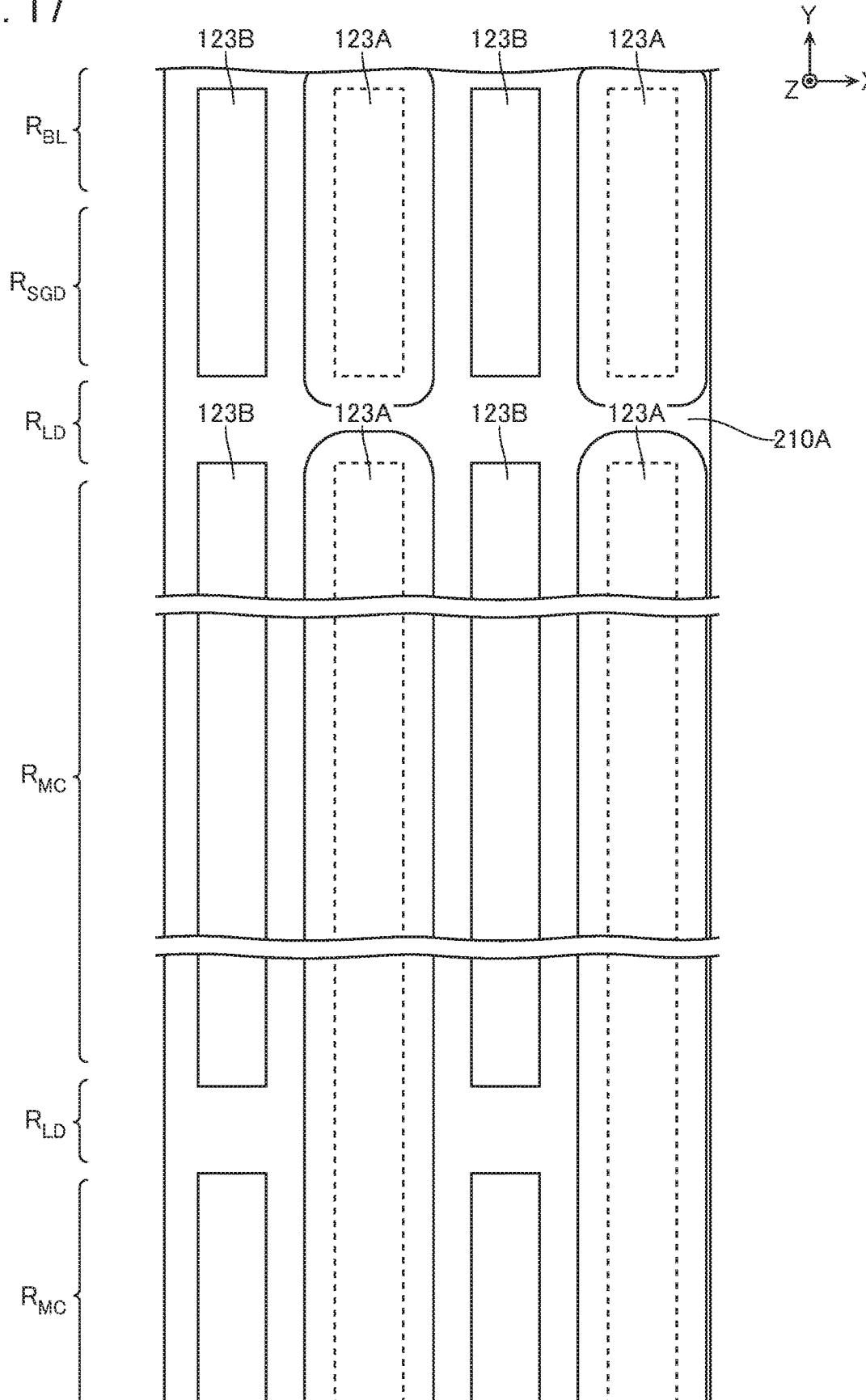
FIG. 17 is a schematic plan view for describing the manufacturing method.
Figure 18:
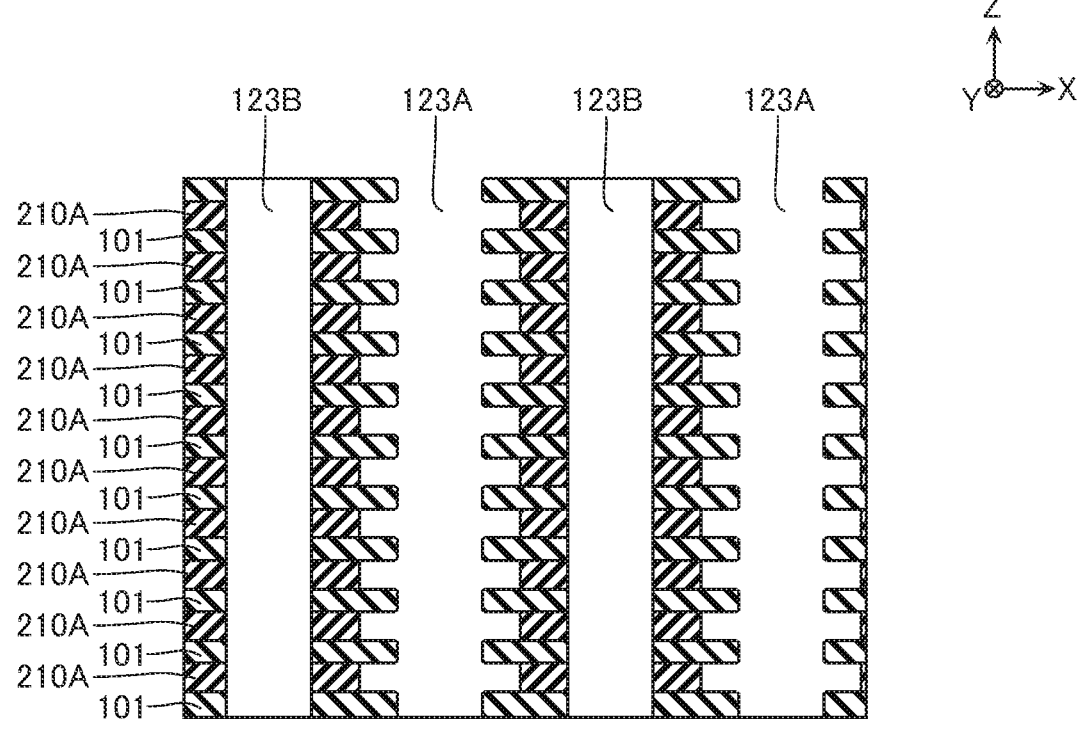
FIG. 18 is a schematic cross-sectional view for describing the manufacturing method.

Next, for example, as illustrated in FIG. 17 and FIG. 18, parts of upper surfaces and lower surfaces of the insulating layers 101 are exposed by removing parts of the sacrifice layers 210A. This process is, for example, performed by a method, such as wet etching.

Figure 19:
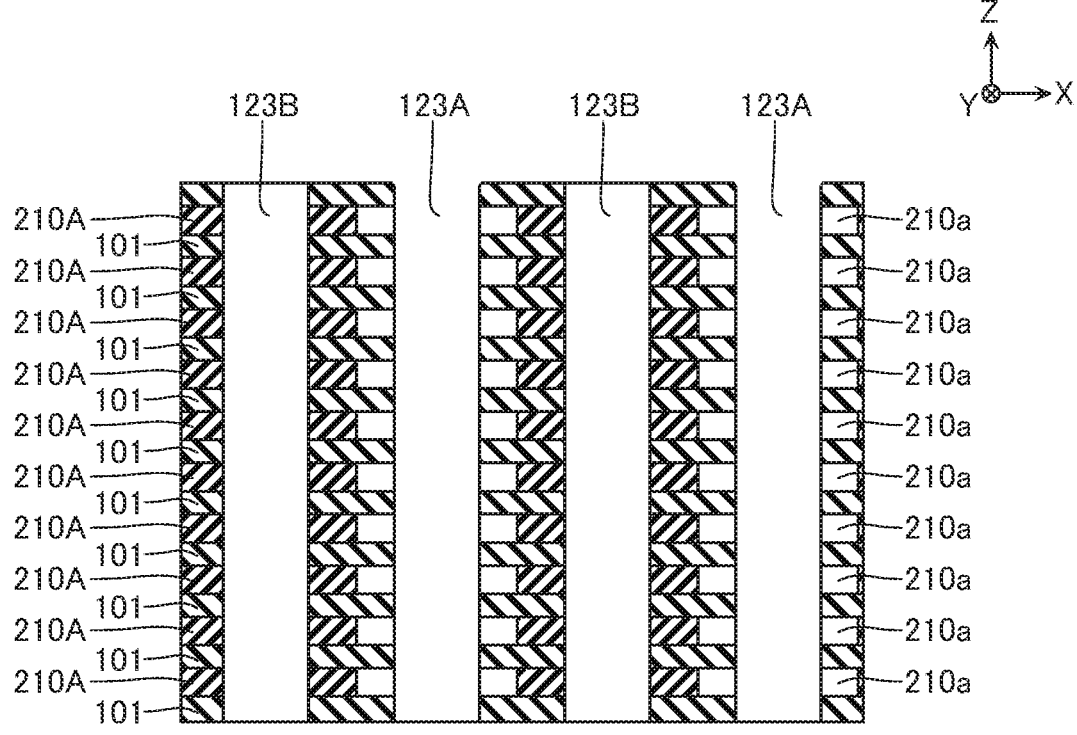
FIG. 19 is a schematic cross-sectional view for describing the manufacturing method.

Next, for example, as illustrated in FIG. 19, the portions 210$a$ of the semiconductor layers 210 are formed. This process is, for example, performed by a method, such as CVD. Note that while the illustration is omitted, this process also forms parts of the portions 210$c$ of the semiconductor layers 210 (see FIG. 22).

Figure 20:
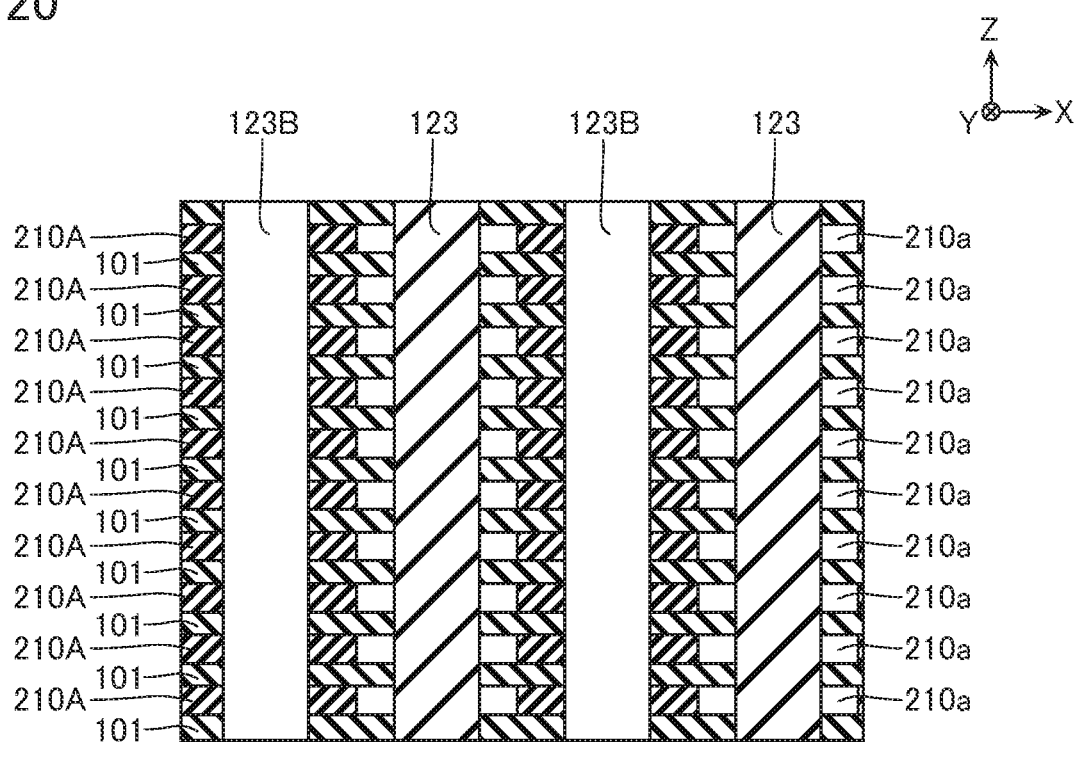
FIG. 20 is a schematic cross-sectional view for describing the manufacturing method.

Next, for example, as illustrated in FIG. 20, the insulating layers 123 are formed inside the openings 123A. This process is, for example, performed by CVD or the like.

Figure 21:
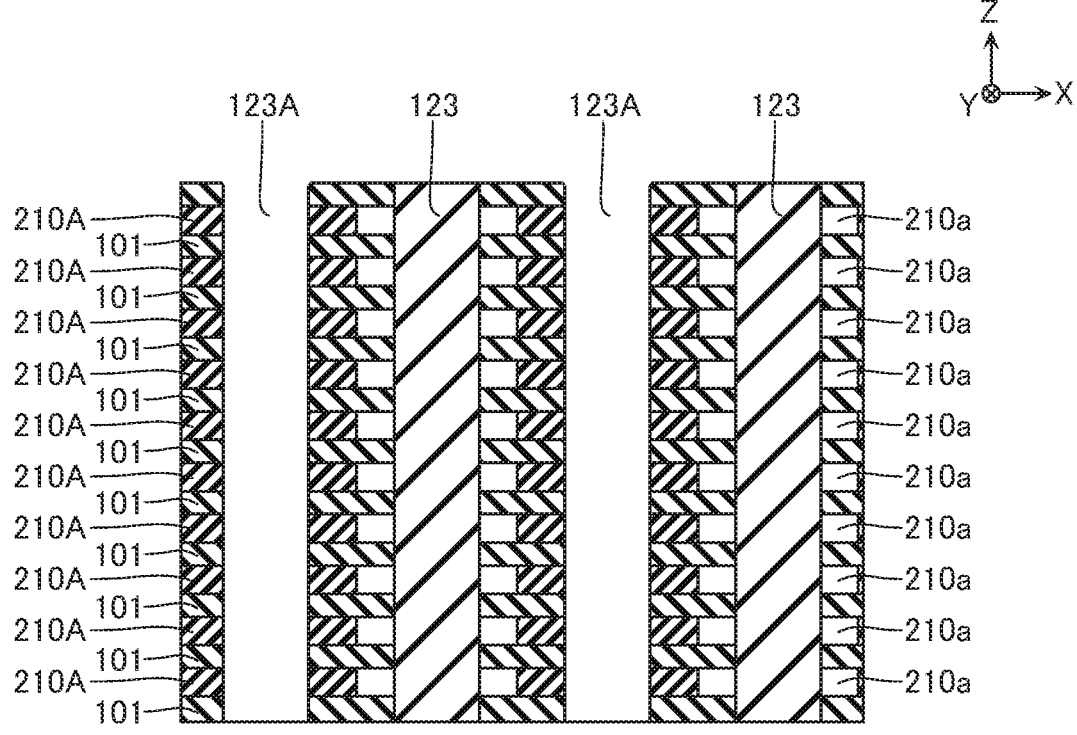
FIG. 21 is a schematic cross-sectional view for describing the manufacturing method.

Next, for example, as illustrated in FIG. 21, among the plurality of openings 123A provided in the memory cell region $R_{MC}$, the sacrifice layers 123B disposed inside the odd-numbered openings 123A counted from the one side in the X-direction are removed. This process is, for example, performed by a method, such as wet etching.

Figure 22:
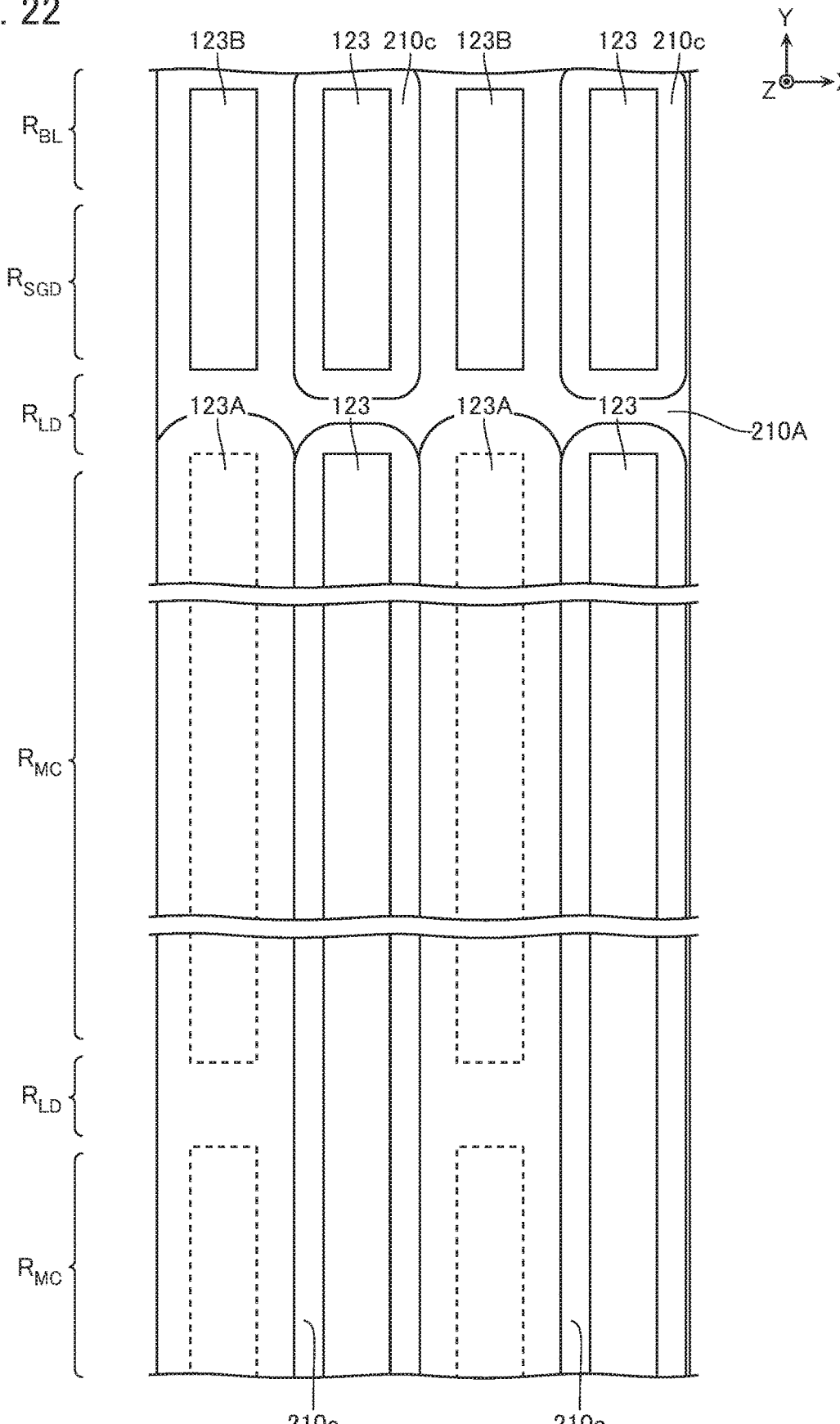
FIG. 22 is a schematic plan view for describing the manufacturing method.
Figure 23:
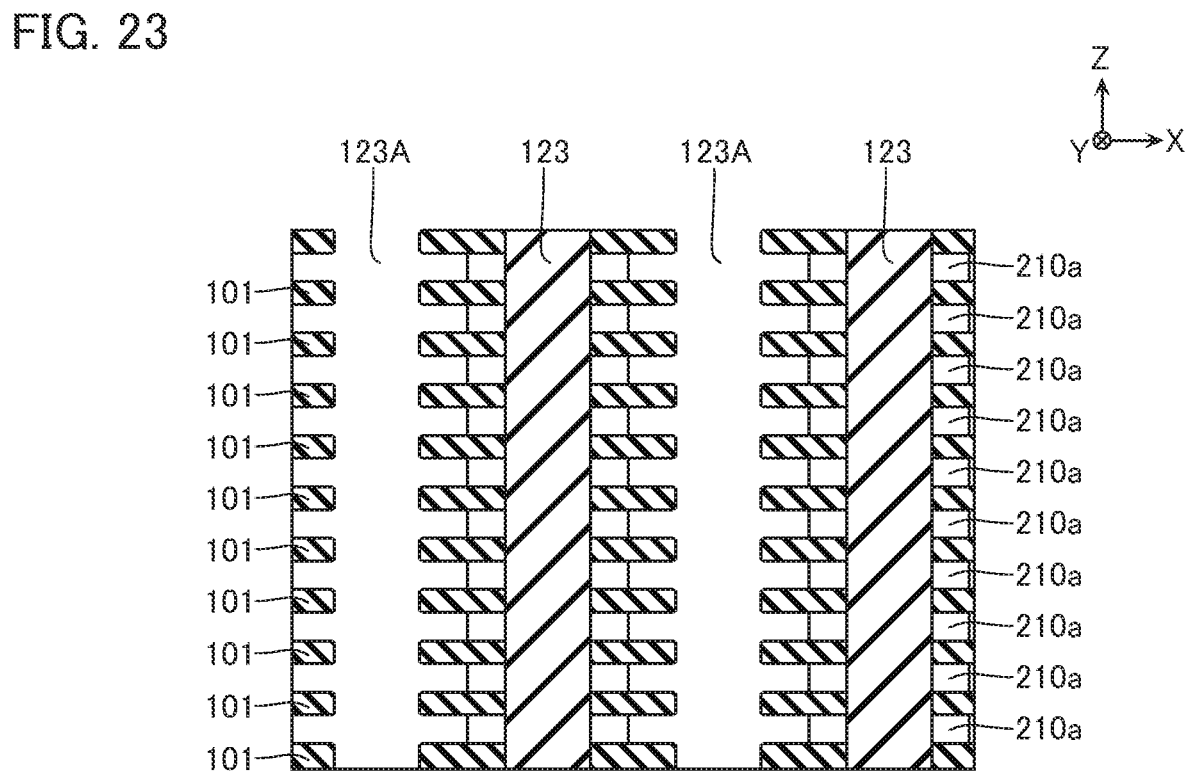

Next, for example, as illustrated in FIG. 22 and FIG. 23, the sacrifice layers 210A disposed in the memory cell region $R_{MC}$ are removed to expose parts of the upper surfaces and the lower surfaces of the insulating layers 101 and side surfaces in the X-direction of the portions 210$a$ of the semiconductor layers 210. This process is, for example, performed by a method, such as wet etching.

Figure 24:
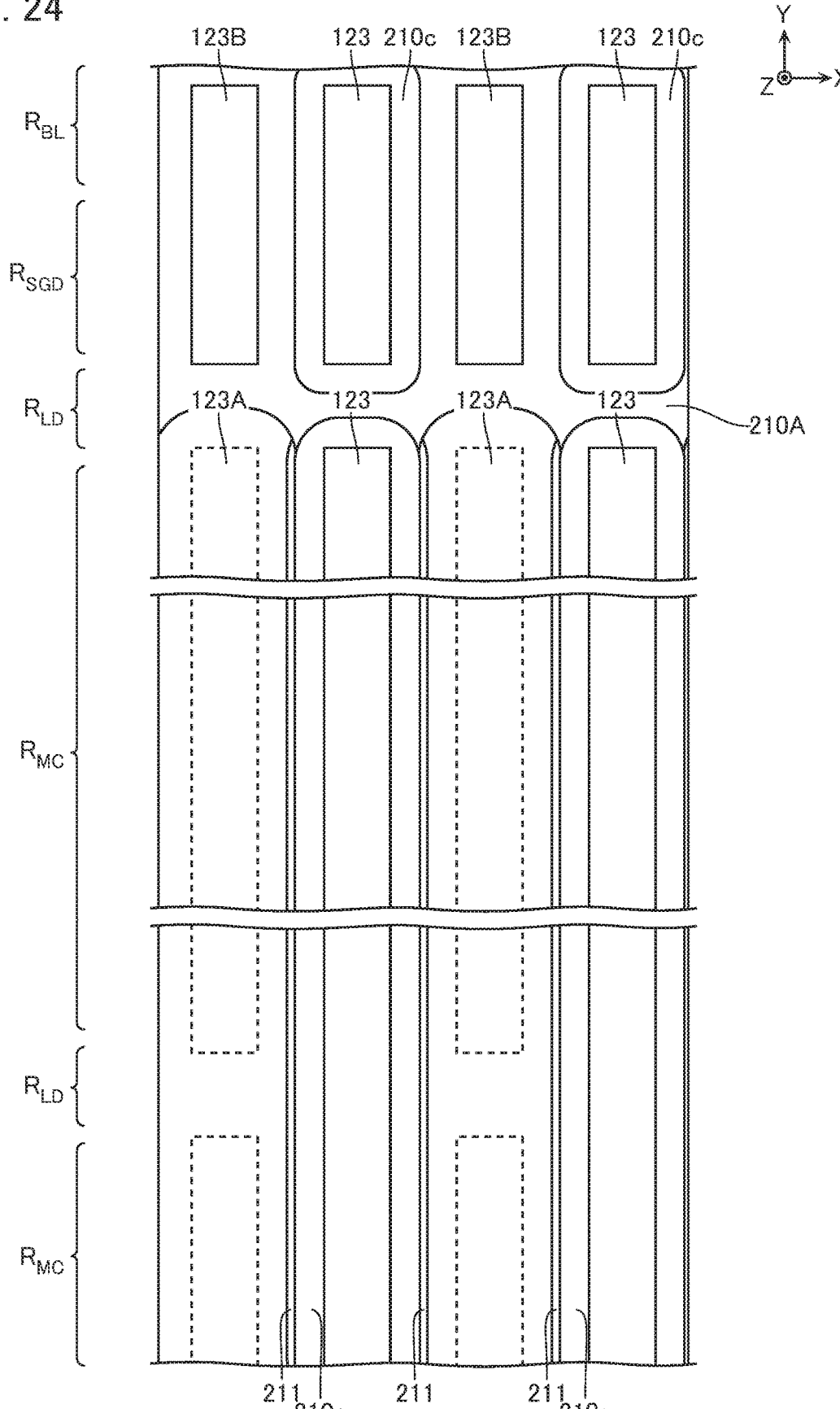
FIG. 24 is a schematic plan view for describing the manufacturing method.
Figure 25:
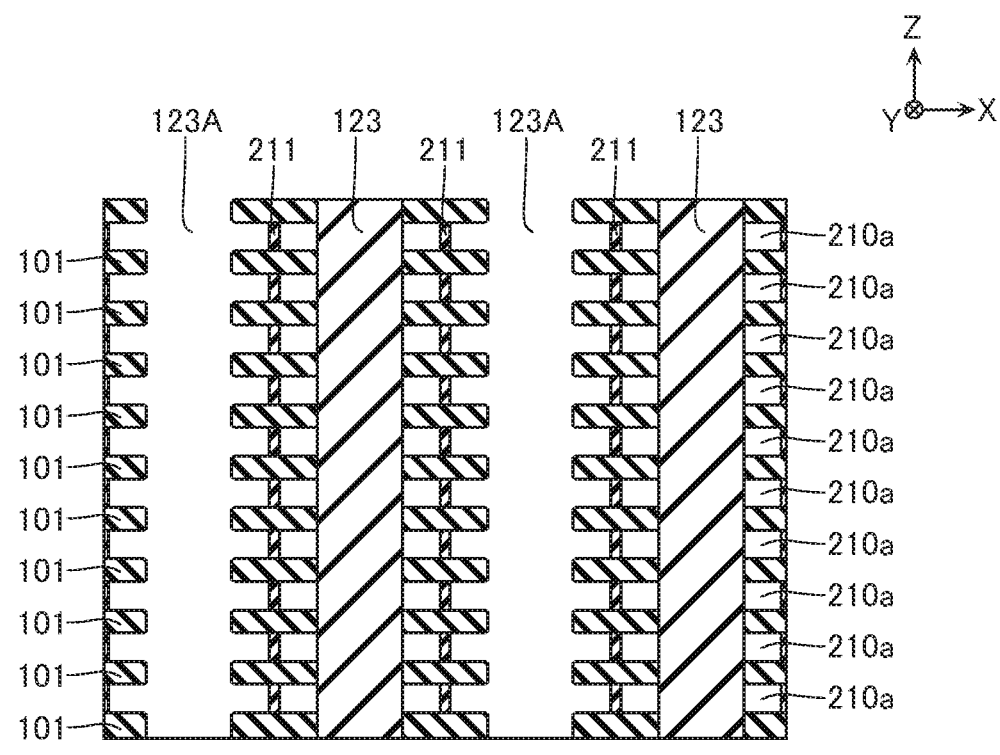
FIG. 25 is a schematic cross-sectional view for describing the manufacturing method.

Next, for example, as illustrated in FIG. 24 and FIG. 25, the insulating layers 211 are formed. This process is, for example, performed by a method, such as an oxidation process, on the side surfaces in the X-direction of the portions 210$a$ of the semiconductor layers 210.

Figure 26:
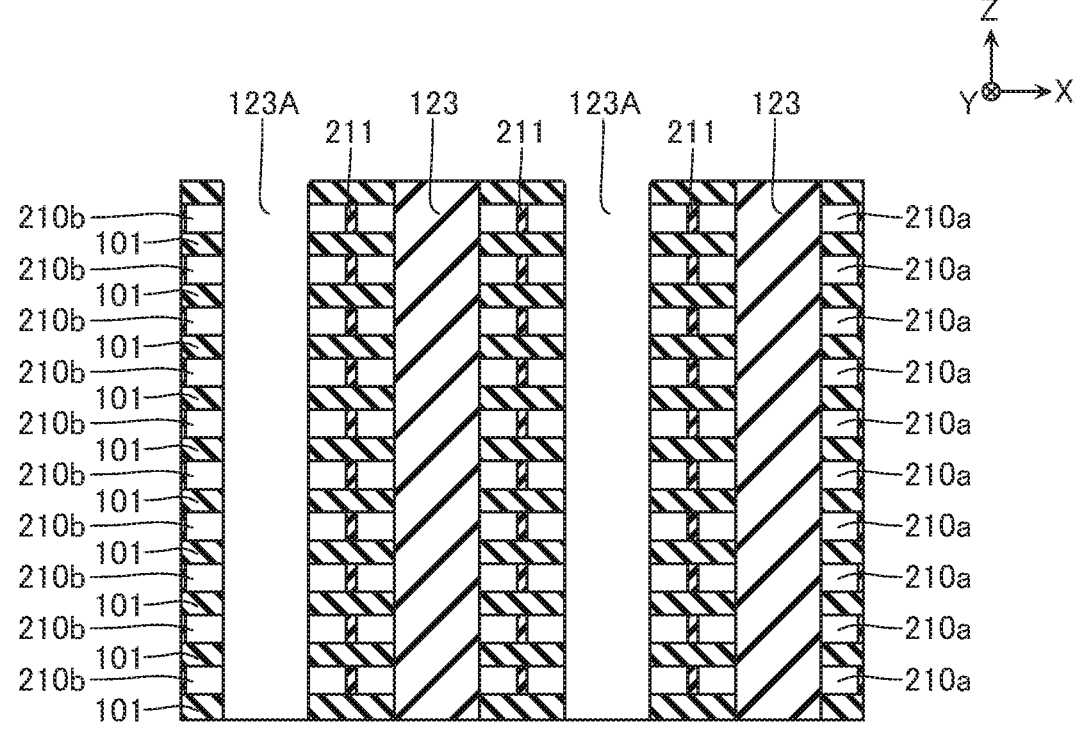
FIG. 26 is a schematic cross-sectional view for describing the manufacturing method.

Next, for example, as illustrated in FIG. 26, the portions 210$b$ of the semiconductor layers 210 are formed. This process is, for example, performed by a method, such as CVD.

Figure 27:
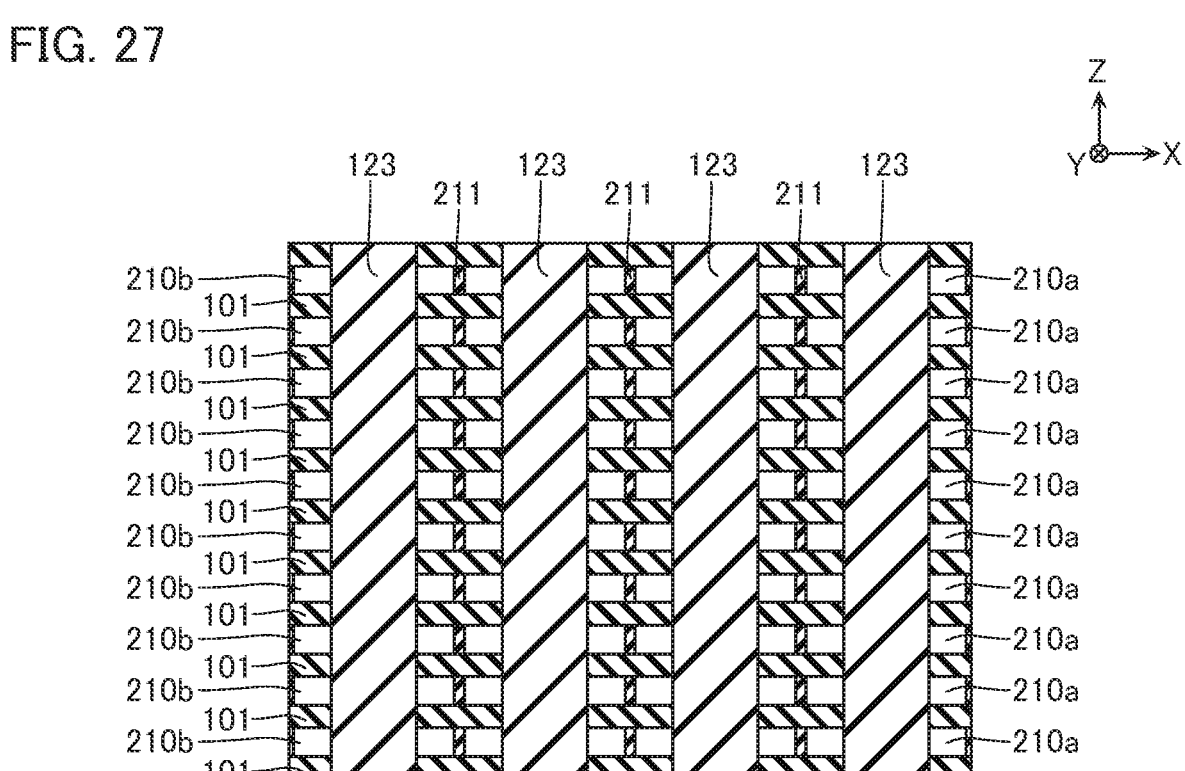
FIG. 27 is a schematic cross-sectional view for describing the manufacturing method

Next, for example, as illustrated in FIG. 27, the insulating layers 123 are formed inside the openings 123A. This process is, for example, performed by CVD or the like.

Figure 28:
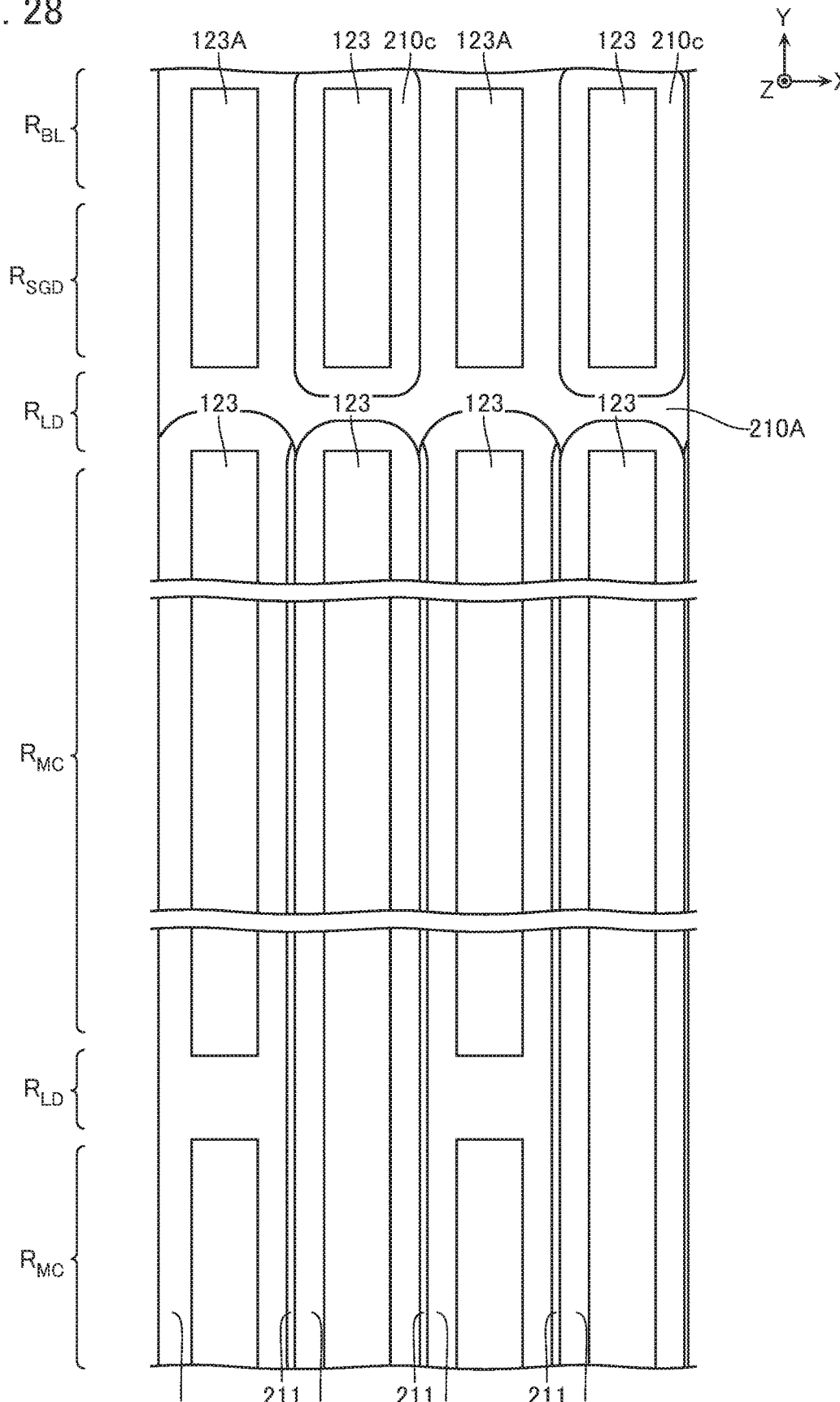
FIG. 28 is a schematic plan view for describing the manufacturing method.

Next, for example, as illustrated in FIG. 28, among the plurality of openings 123A provided in the select transistor region $R_{SGD}$, the sacrifice layers 123B disposed inside the odd-numbered openings 123A counted from the one side in the X-direction are removed. This process is, for example, performed by a method, such as wet etching.

Figure 29:
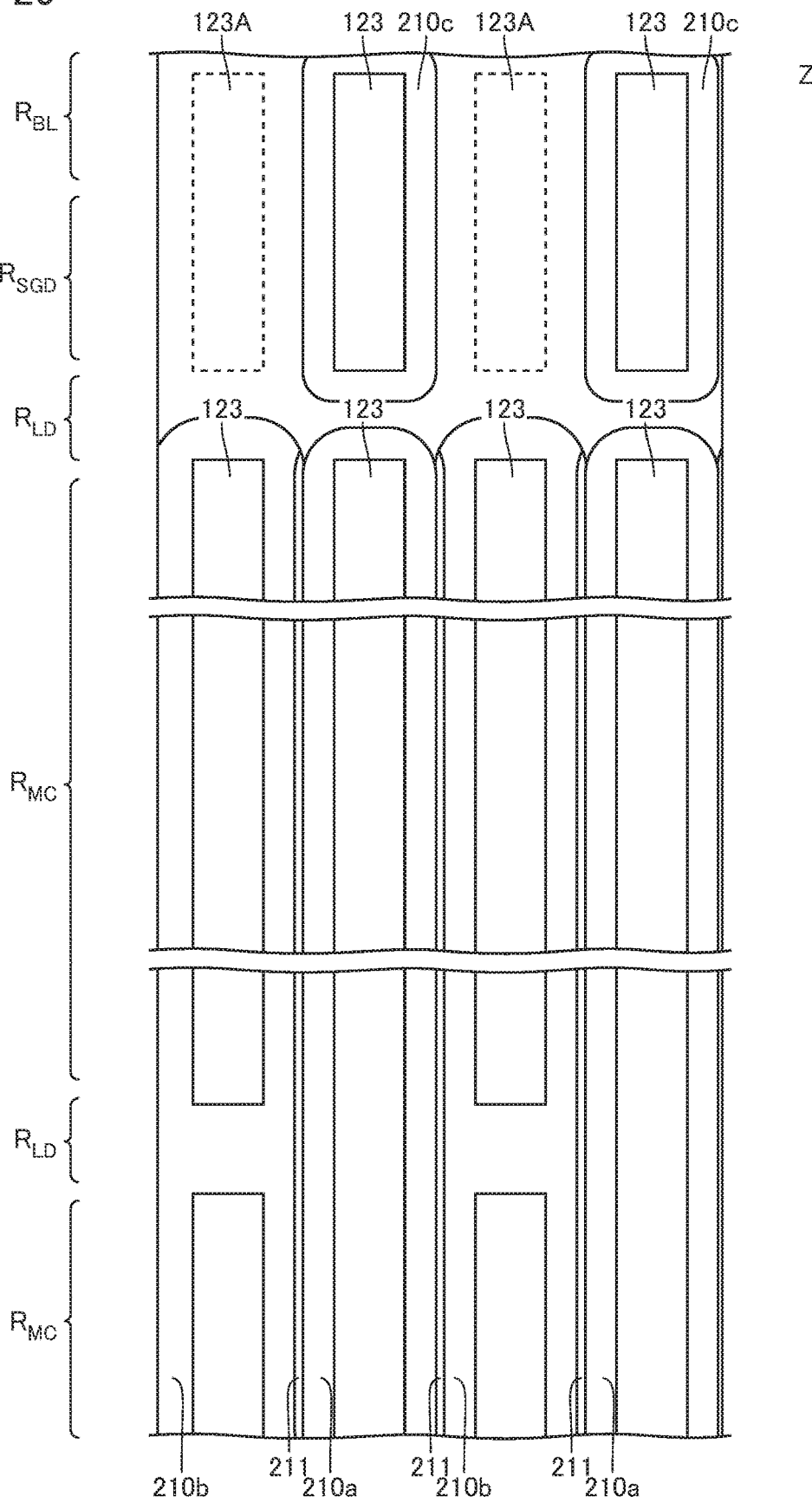
FIG. 29 is a schematic plan view for describing the manufacturing method.

Next, for example, as illustrated in FIG. 29, parts of the upper surfaces and the lower surfaces of the insulating layers 101 are exposed by removing the sacrifice layers 210A disposed in the select transistor region $R_{SGD}$. The side surfaces in the Y-direction of the portions 210a, 210b of the semiconductor layers 210 and the side surfaces in the X-direction and the Y-direction of parts of the portions 210c of the semiconductor layers 210 are exposed. This process is, for example, performed by a method, such as wet etching.

Figure 30:
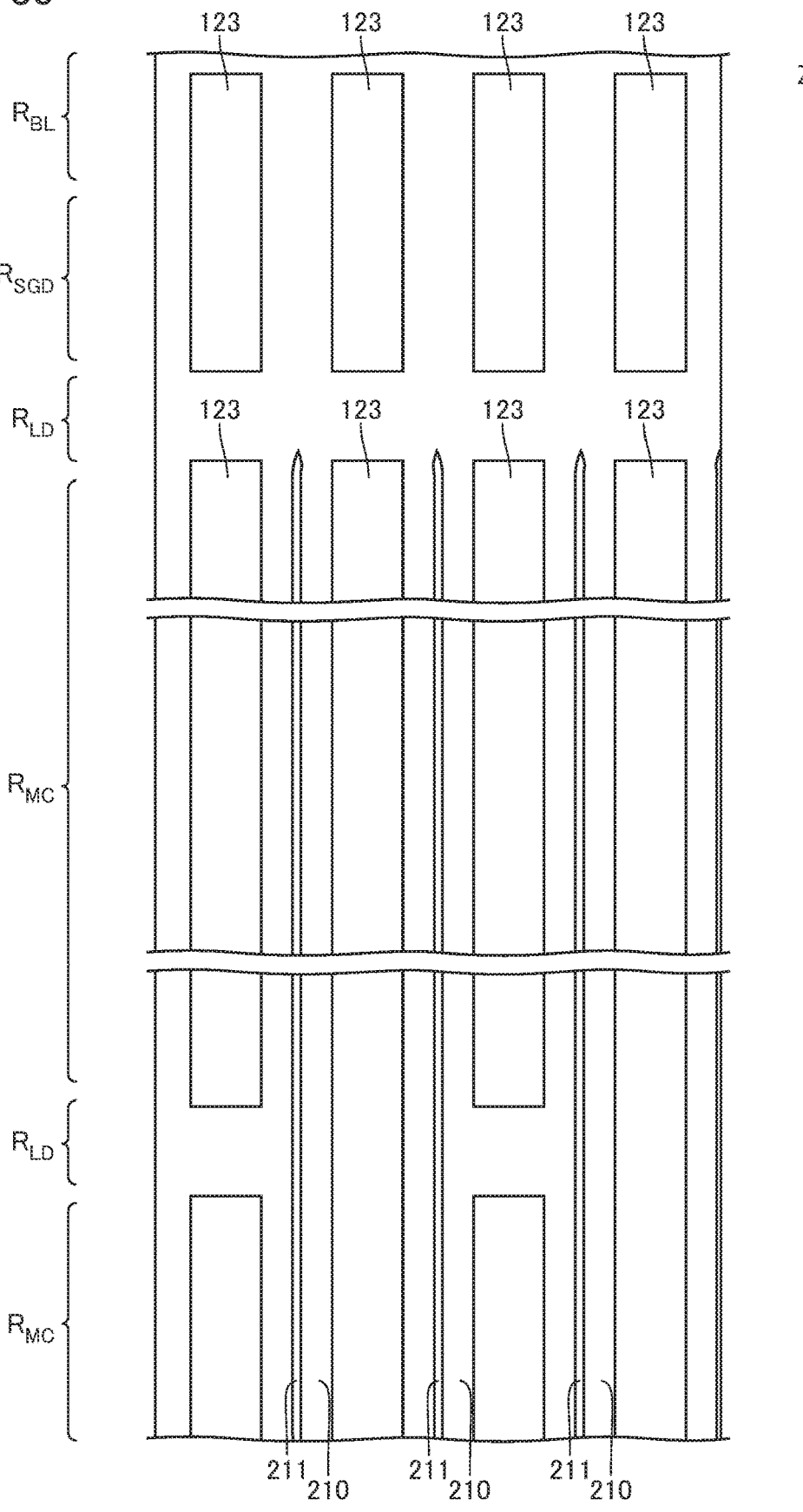
FIG. 30 is a schematic plan view for describing the manufacturing method.

Next, for example, as illustrated in FIG. 30, the semiconductor layers 210 are formed. This process is, for example, performed by a method, such as CVD.

Inside the openings 123A, the insulating layers 123 are formed. This process is, for example, performed by CVD or the like.

Figure 31:
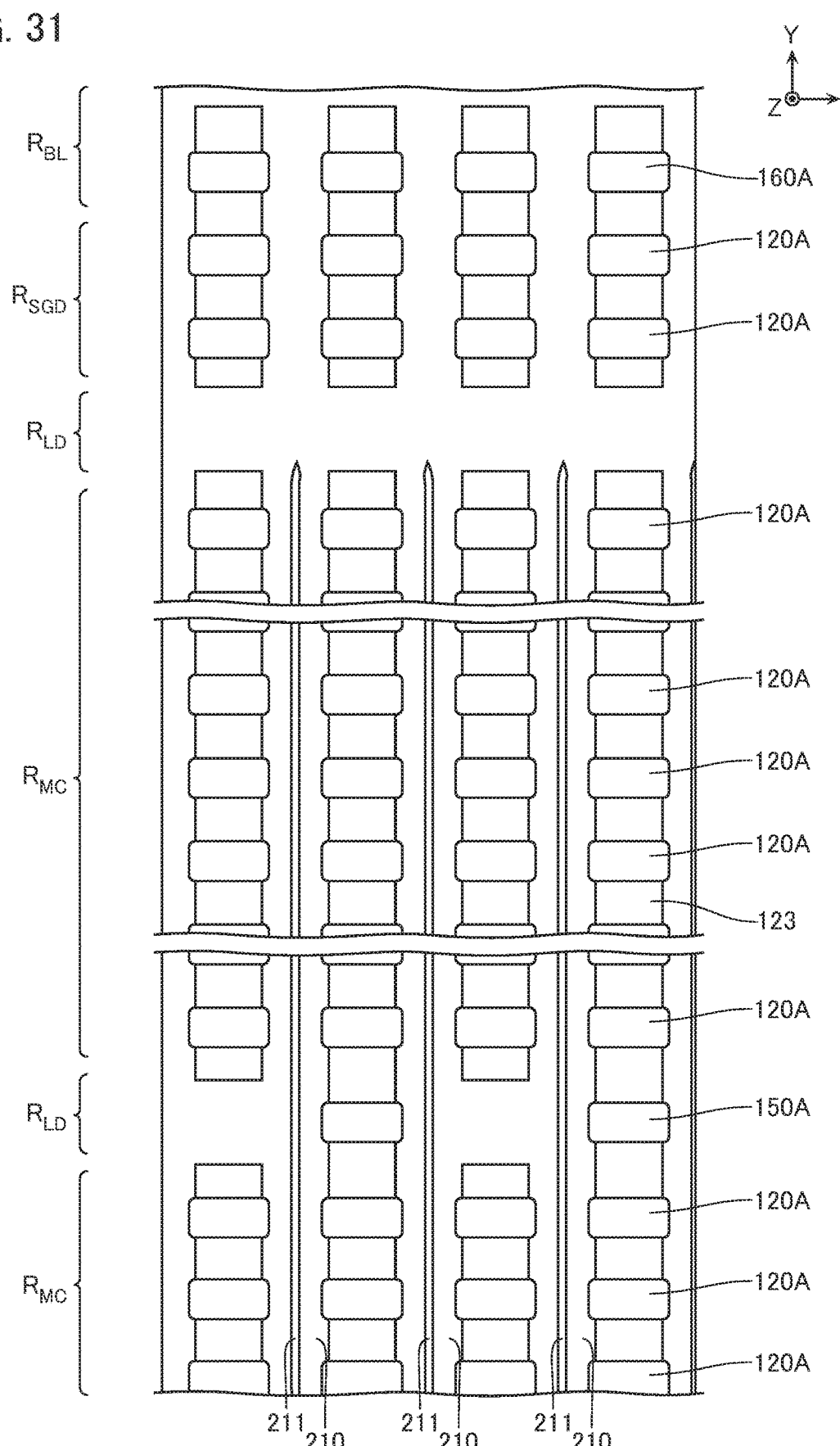
FIG. 31 is a schematic plan view for describing the manufacturing method.
Figure 32:
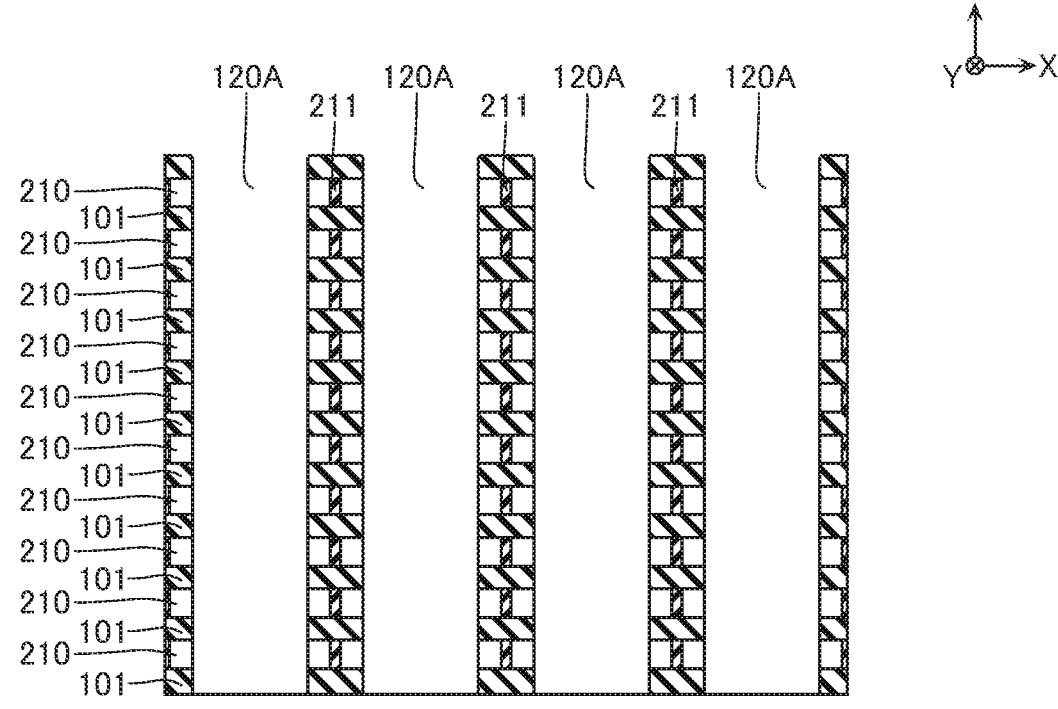
FIG. 32 is a schematic cross-sectional view for describing the manufacturing method.

Next, for example, as illustrated in FIG. 31 and FIG. 32, openings 120A are formed at positions corresponding to the conductive layers 120. At positions corresponding to the conductive layers 150', openings 150A are formed. At positions corresponding to the insulating layers 161, openings 160A are formed. These openings 120A, 150A, 160A extend in the Z-direction as illustrated in FIG. 32, and expose side surfaces in the X-direction of the plurality of insulating layers 101 and the plurality of semiconductor layers 210 arranged in the Z-direction. This process is, for example, performed by RIE or the like.

Figure 33:
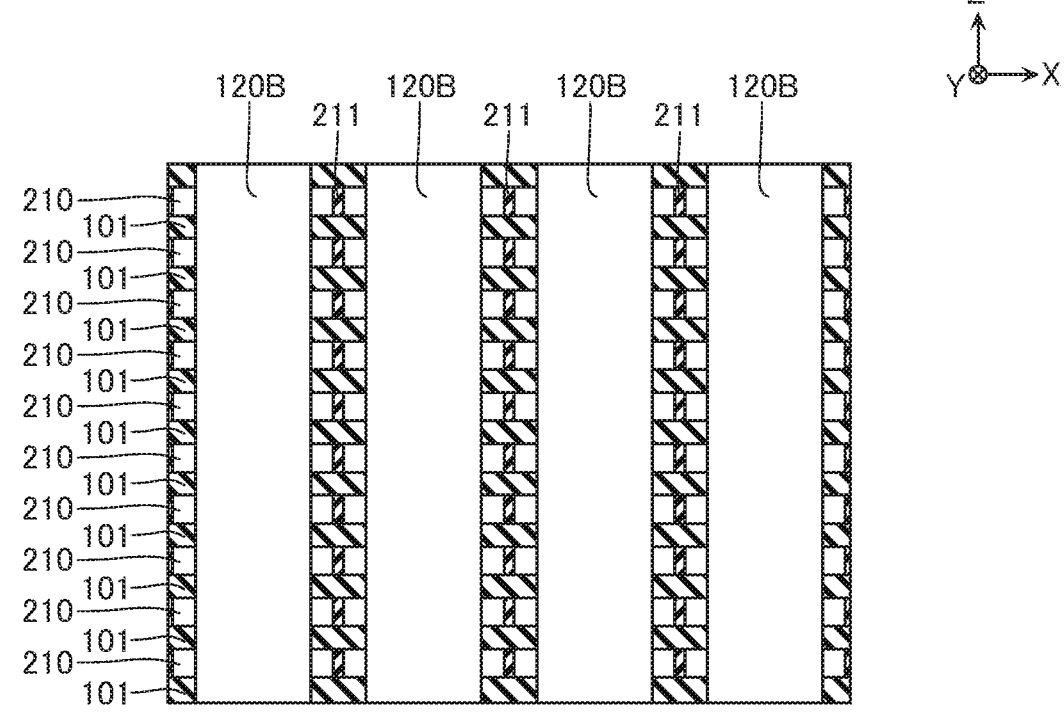
FIG. 33 is a schematic cross-sectional view for describing the manufacturing method.

Next, for example, as illustrated in FIG. 33, sacrifice layers 120B are formed inside the openings 120A. While the illustration is omitted, sacrifice layers 150B, 160B are formed inside the openings 150A, 160A. This process is, for example, performed by CVD or the like.

Figure 34:
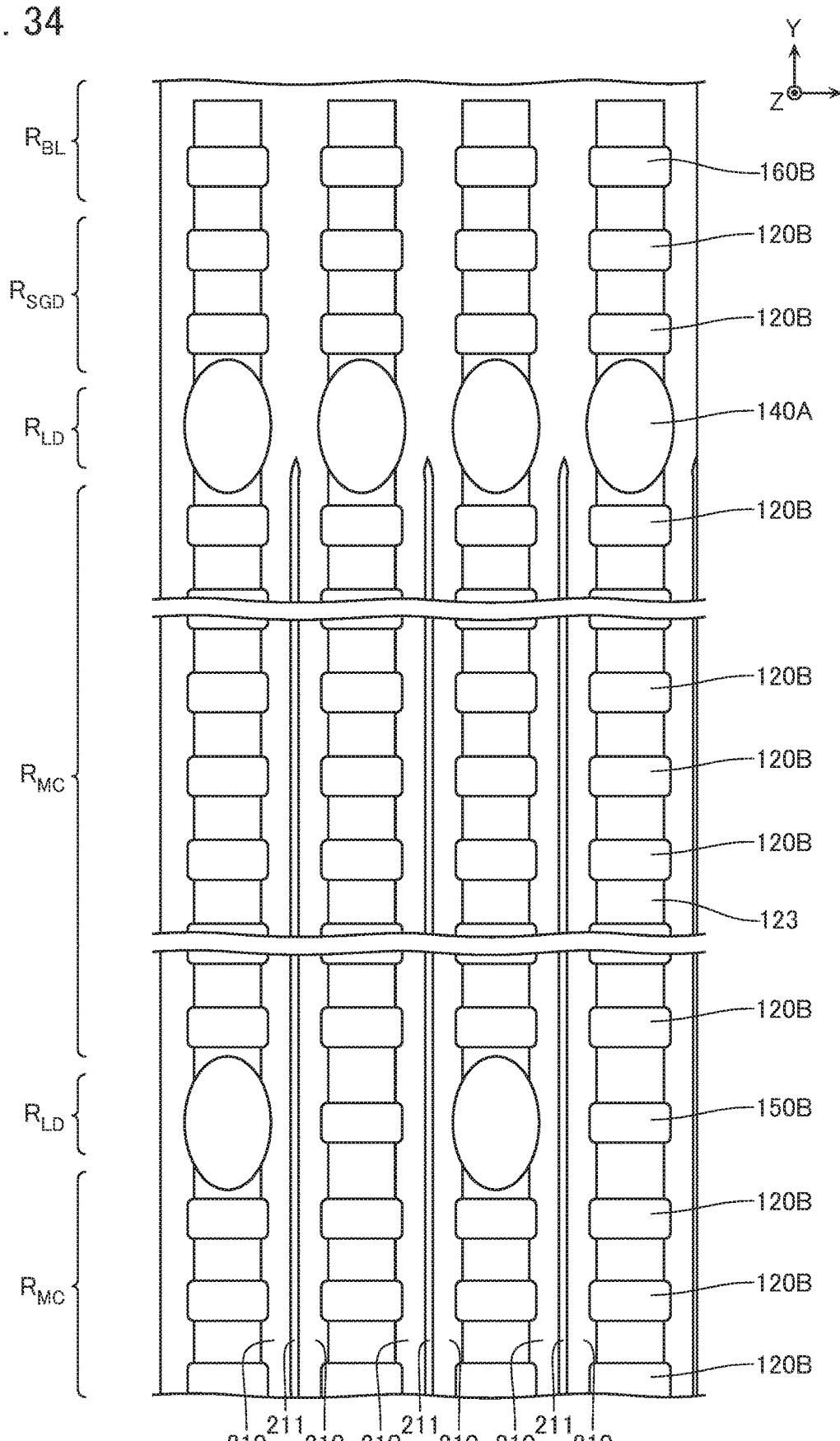
FIG. 34 is a schematic plan view for describing the manufacturing method.

Next, for example, as illustrated in FIG. 34, at positions corresponding to the conductive layers 140, openings 140A are formed. The openings 140A extend in the Z-direction, and expose the side surfaces in the X-direction of the plurality of insulating layers 101 and the plurality of semiconductor layers 210 arranged in the Z-direction. This process is, for example, performed by RIE or the like.

Next, sacrifice layers 140B are formed inside the openings 140A. This process is, for example, performed by CVD or the like.

Figure 35:
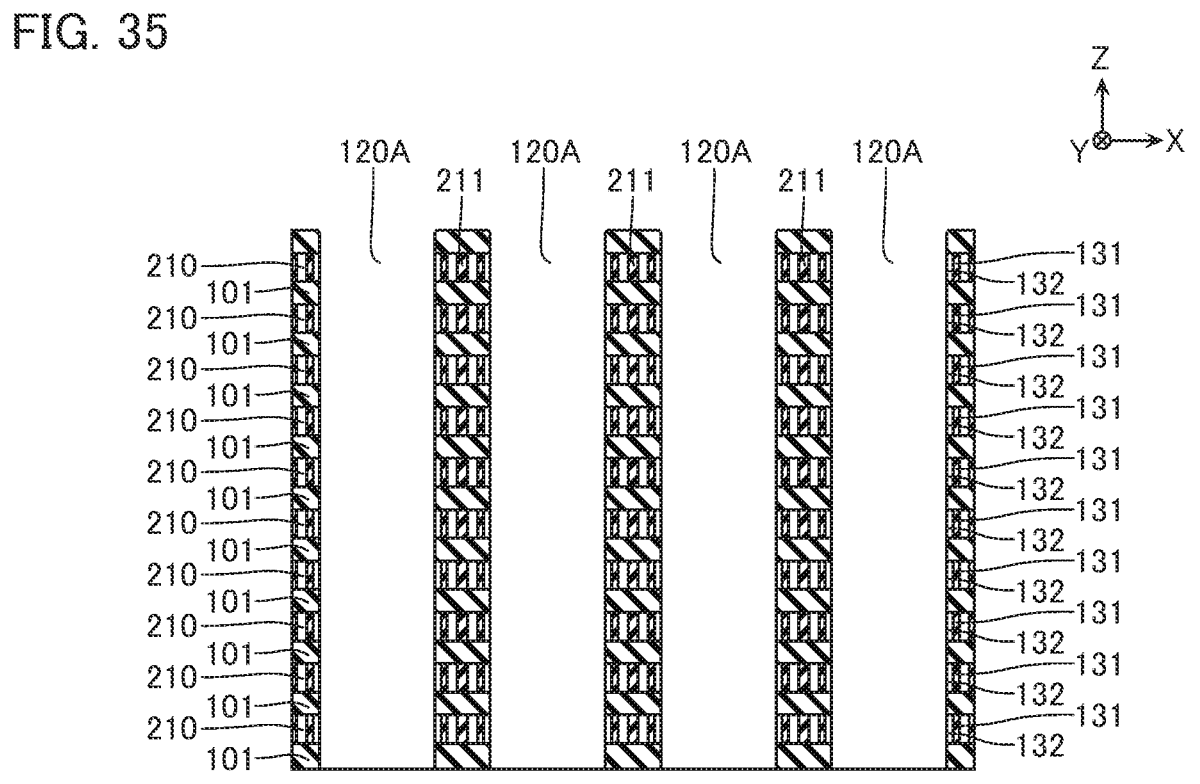

Next, for example, as illustrated in FIG. 35, the sacrifice layers 120B are removed. This process is, for example, performed by wet etching or the like.

Next, for example, as illustrated in FIG. 35, the tunnel insulating layers 131 and the electric charge accumulating layers 132 are formed. In this process, for example, by a method, such as wet etching via the openings 120A, parts of the semiconductor layers 210 are removed to expose parts of the upper surfaces and parts of the lower surfaces of the insulating layers 101. By a method, such as the oxidation process or CVD, the tunnel insulating layers 131 are formed. By a method, such as CVD, the electric charge accumulating layers 132 are formed. Parts of the electric charge accumulating layers 132 are removed by a method, such as wet etching, to separate the electric charge accumulating layers 132 in the Z-direction.

Next, for example, as illustrated in FIG. 11, the block insulating layers 133, the barrier conductive layers 121, and the conductive layers 122 are formed inside the openings 120A. This process is, for example, performed by a method, such as CVD.

Afterwards, the conductive layers 140, 150' and the like are formed, thereby manufacturing the structure as described with reference to FIG. 10 and FIG. 11.

[Manufacturing Method]

FIG. 36 to FIG. 39 are schematic cross-sectional views for describing another method for manufacturing the semiconductor memory device according to the second embodiment. FIG. 36 to FIG. 39 correspond to portions corresponding to FIG. 11.

In this manufacturing method, for example, the processes described with reference to FIG. 12 to FIG. 14 are executed.

Figure 36:
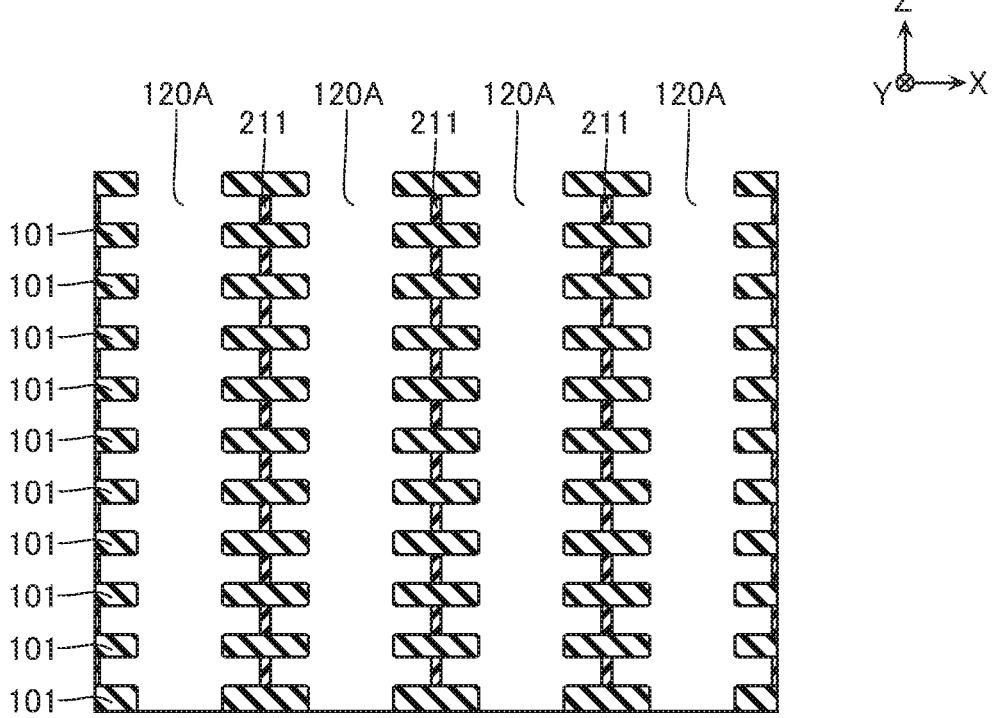
FIG. 36 is a schematic cross-sectional view for describing another method for manufacturing the semiconductor memory device according to the second embodiment.

Next, for example, as illustrated in FIG. 36, parts of the sacrifice layers 210A are removed to expose parts of the upper surfaces and the lower surfaces of the insulating layers 101. This process is, for example, performed by a method, such as wet etching. Note that parts of the sacrifice layers 210A that remain in this process may be the insulating layers 211.

Figure 37:
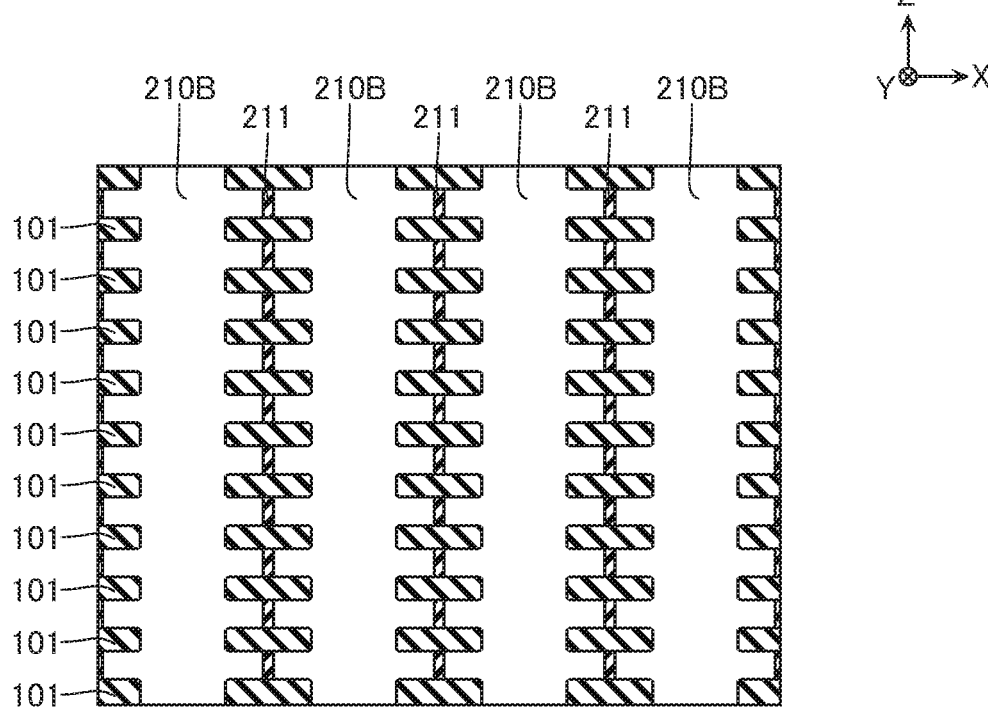
FIG. 37 is a schematic cross-sectional view for describing the manufacturing method.

Next, for example, as illustrated in FIG. 37, semiconductor layers 210B are formed. This process is, for example, performed by executing an epitaxial growth or the like in a state where an upper surface of the semiconductor substrate Sub is exposed to bottom surfaces of the openings 120A. This fills inside the openings 120A with the semiconductor layers 210B.

Figure 38:
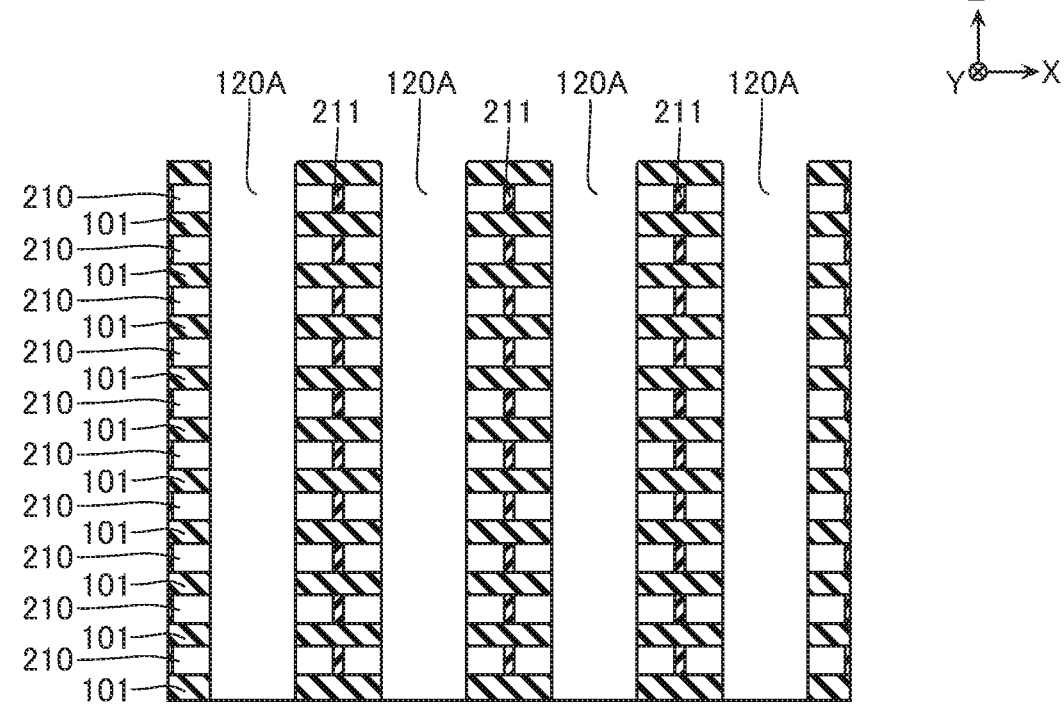
FIG. 38 is a schematic cross-sectional view for describing the manufacturing method.

Next, for example, as illustrated in FIG. 38, parts of the semiconductor layers 210B are removed to form the plurality of semiconductor layers 210. In this process, for example, of the semiconductor layers 210B, parts formed on the upper surfaces or the lower surfaces of the insulating layers 101 are left and the other parts are removed. This process is, for example, performed by a method, such as RIE.

Figure 39:
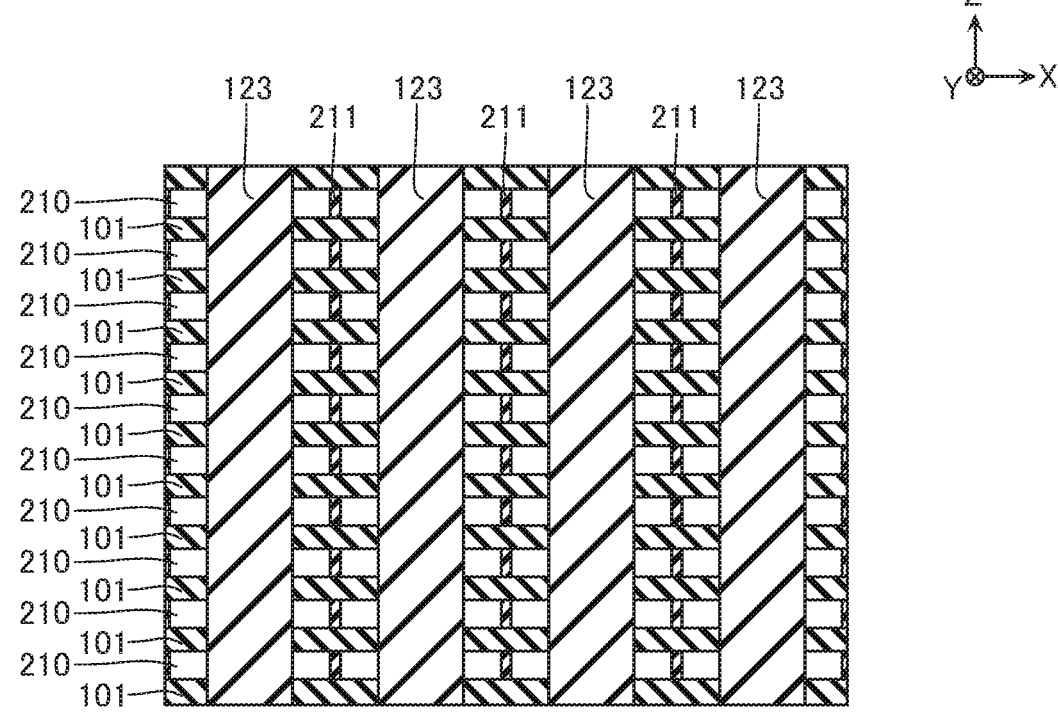
FIG. 39 is a schematic cross-sectional view for describing the manufacturing method.

Next, for example, as illustrated in FIG. 39, the insulating layers 123 are formed inside the openings 123A. This process is, for example, performed by CVD or the like.

Thereafter, the processes after the process described with reference to FIG. 31 and FIG. 32 are executed, thereby manufacturing the structure described with reference to FIG. 10 and FIG. 11.

Third Embodiment

Figure 40:
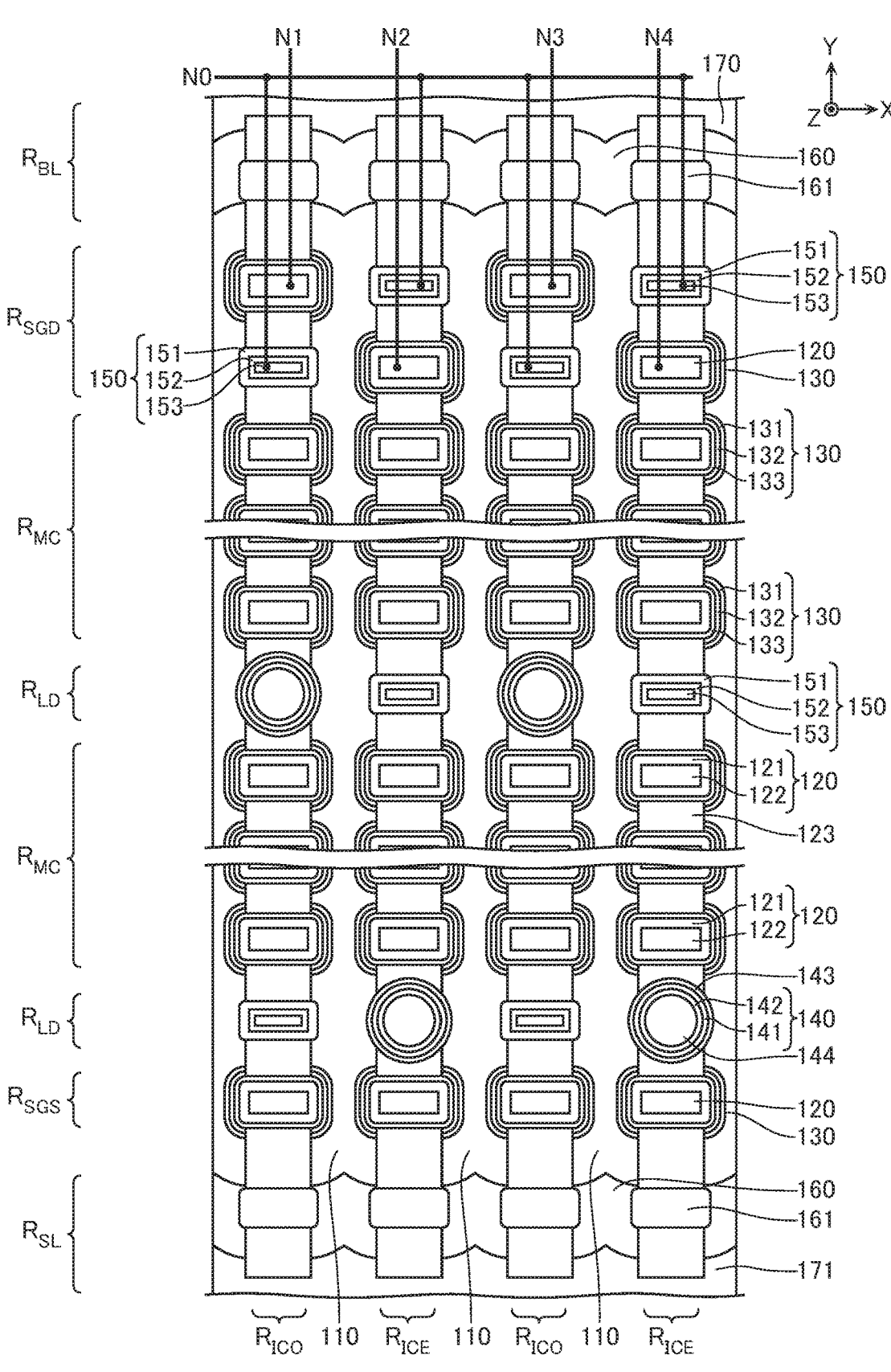
FIG. 40 is a schematic plan view illustrating a configuration of a part of a semiconductor memory device according to a third embodiment.

FIG. 40 is a schematic plan view illustrating a configuration of a part of a semiconductor memory device according to a third embodiment As described with reference to FIG. 2, in the first embodiment, the ladder region $R_{LD}$ is disposed between the select transistor region $R_{SGD}$ and the memory cell region $R_{MC}$ positioned closest thereto. With such a configuration, when the selected memory cell $MC_S$ is included in the memory cell region $R_{MC}$ positioned closest to the select transistor region $R_{SGD}$, the hole channel Pch formed at the proximity of the selected memory cell $MC_S$ can be preferably applied with a fixed voltage. However, in such a configuration, it is necessary to dispose the ladder region $R_{LD}$ between the select transistor region $R_{SGD}$ and the memory cell region $R_{MC}$ positioned closest thereto, and thus, it may cause an increase in circuit area.

Therefore, in the third embodiment, as illustrated in FIG. 40, the conductive layer 120 and the conductive layer 150 arranged in the Y-direction are disposed instead of the two conductive layers 120 arranged in the Y-direction in the inter-channel region $R_{IC}$ in the select transistor region $R_{SGD}$.

In the inter-channel region $R_{ICO}$ in the select transistor region $R_{SGD}$, the conductive layer 150 is disposed at a position closer to the memory cell region $R_{MC}$ than the conductive layer 120. In the illustrated example, these conductive layers 150 are commonly connected to the node N0.

In the inter-channel region $R_{ICE}$ in the select transistor region $R_{SGD}$, the conductive layer 150 is disposed at a position farther from the memory cell region $R_{MC}$ than the conductive layer 120. In the illustrated example, these conductive layers 150 are commonly connected to the node N0.

In the third embodiment, the ladder region $R_{LD}$ between the select transistor region $R_{SGD}$ and the memory cell region $R_{MC}$ positioned closest thereto is omitted.

With such a configuration, when the selected memory cell $MC_S$ is included in the memory cell region $R_{MC}$ positioned closest to the select transistor region $R_{SGD}$, the hole channel Pch formed at the proximity of the selected memory cell $MC_S$ can be electrically conducted with the conductive layer 150 disposed in the select transistor region $R_{SGD}$. This allows to preferably apply a fixed voltage to the hole channel Pch.

With such a configuration, omitting the ladder region $R_{LD}$ between the select transistor region $R_{SGD}$ and the memory cell region $R_{MC}$ positioned closest thereto allows to reduce an increase in circuit area.

Fourth Embodiment

Figure 41:
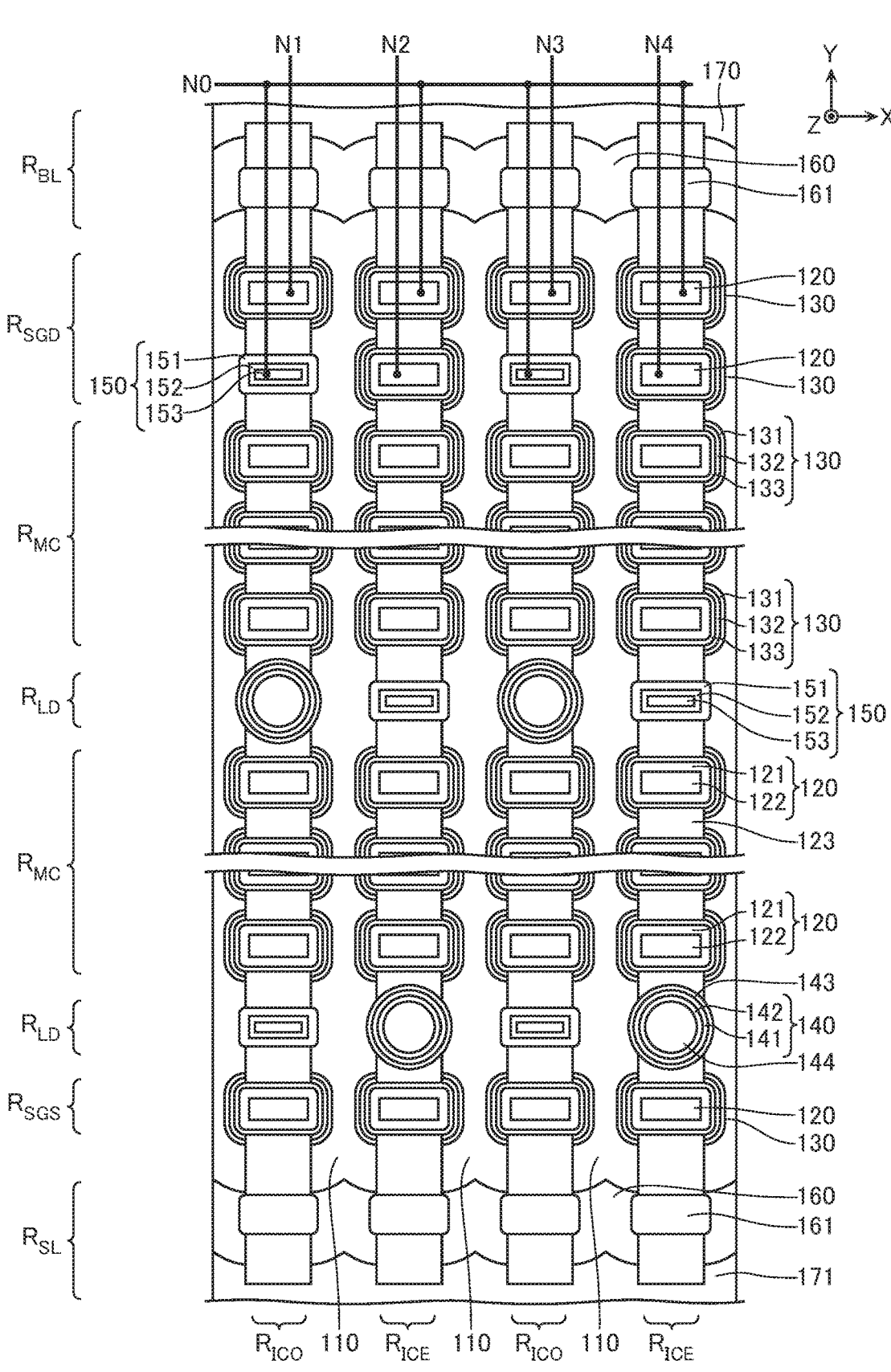
FIG. 41 is a schematic plan view illustrating a configuration of a part of a semiconductor memory device according to a fourth embodiment.

FIG. 41 is a schematic plan view illustrating a configuration of a part of a semiconductor memory device according to a fourth embodiment.

The semiconductor memory device according to the fourth embodiment is basically configured similarly to the semiconductor memory device according to the first embodiment.

However, in the fourth embodiment, as illustrated in FIG. 41, the conductive layer 120 and the conductive layer 150 arranged in the Y-direction are disposed instead of the two conductive layers 120 arranged in the Y-direction in the inter-channel region $R_{ICO}$ in the select transistor region $R_{SGD}$. This conductive layer 150 is disposed at a position closer to the memory cell region $R_{MC}$ than the conductive layer 120. In the illustrated example, these conductive layers 150 are commonly connected to the node N0.

In the fourth embodiment, the ladder region $R_{LD}$ between the select transistor region $R_{SGD}$ and the memory cell region $R_{MC}$ positioned closest thereto is omitted.

Such a configuration allows to provide an effect similar to that of the third embodiment.

Note that, in the example in FIG. 41, the conductive layers 150 disposed in the inter-channel region $R_{ICO}$ in the select transistor region $R_{SGD}$ and the conductive layers 120 positioned farther from the memory cell region $R_{MC}$ among the conductive layers 120 disposed in the inter-channel region $R_{ICE}$ in the select transistor region $R_{SGD}$ are connected to the common node N0. However, such a configuration is merely an example, and a specific configuration is appropriately adjustable.

Figure 42:
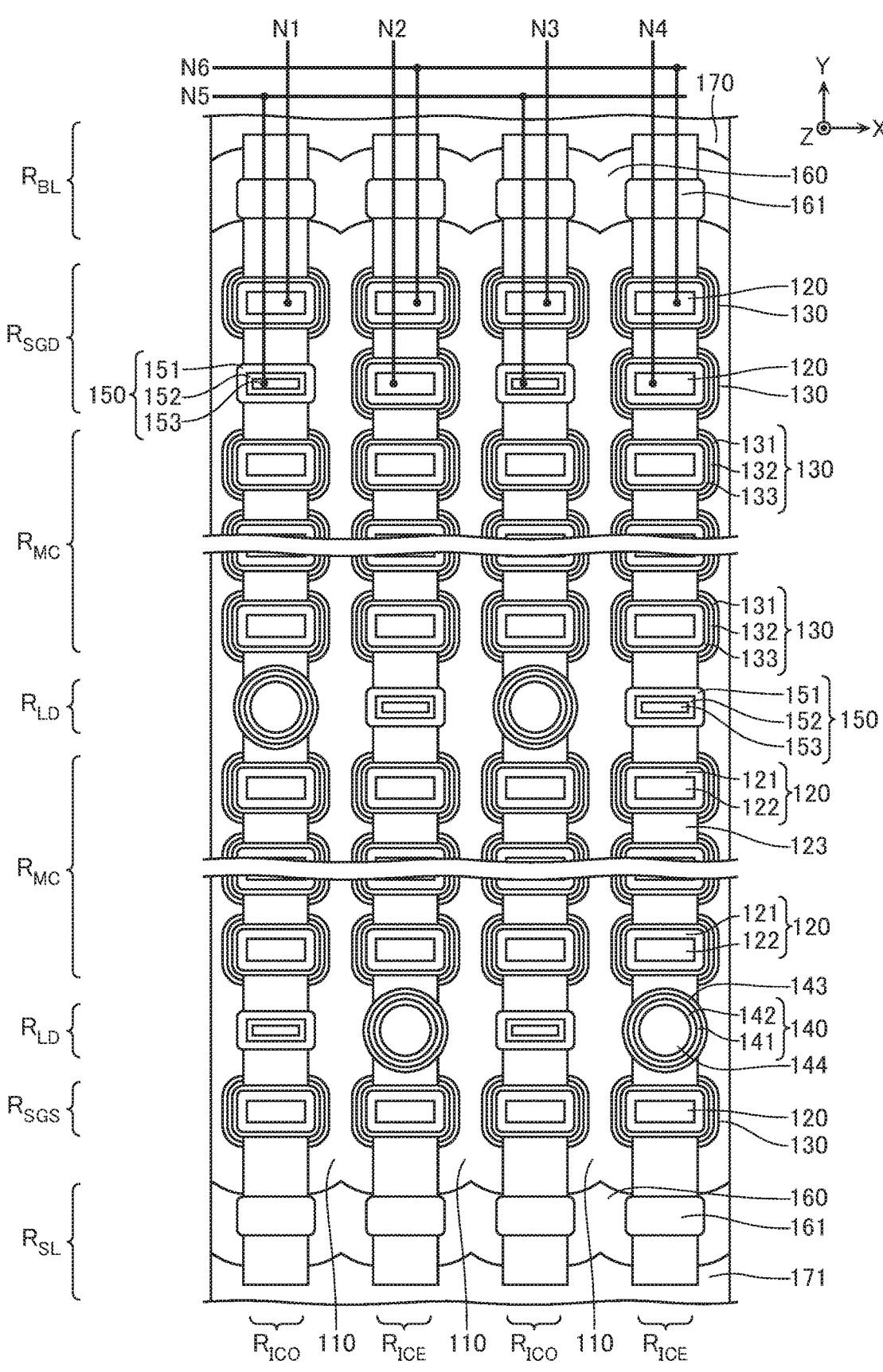
FIG. 42 is a schematic plan view illustrating another exemplary configuration of the semiconductor memory device according to the fourth embodiment.

For example, in the example in FIG. 42, the plurality of conductive layers 150 disposed in the inter-channel region $R_{ICO}$ in the select transistor region $R_{SGD}$ are commonly connected to the node N5. Among the conductive layers 120 disposed in the inter-channel region $R_{ICE}$ in the select transistor region $R_{SGD}$, the conductive layers 120 positioned farther from the memory cell region $R_{MC}$ are commonly connected to the node N6. The node N1 to the node N6 are electrically independent from one another and are configured to forward independent voltages.

Fifth Embodiment

Figure 43:
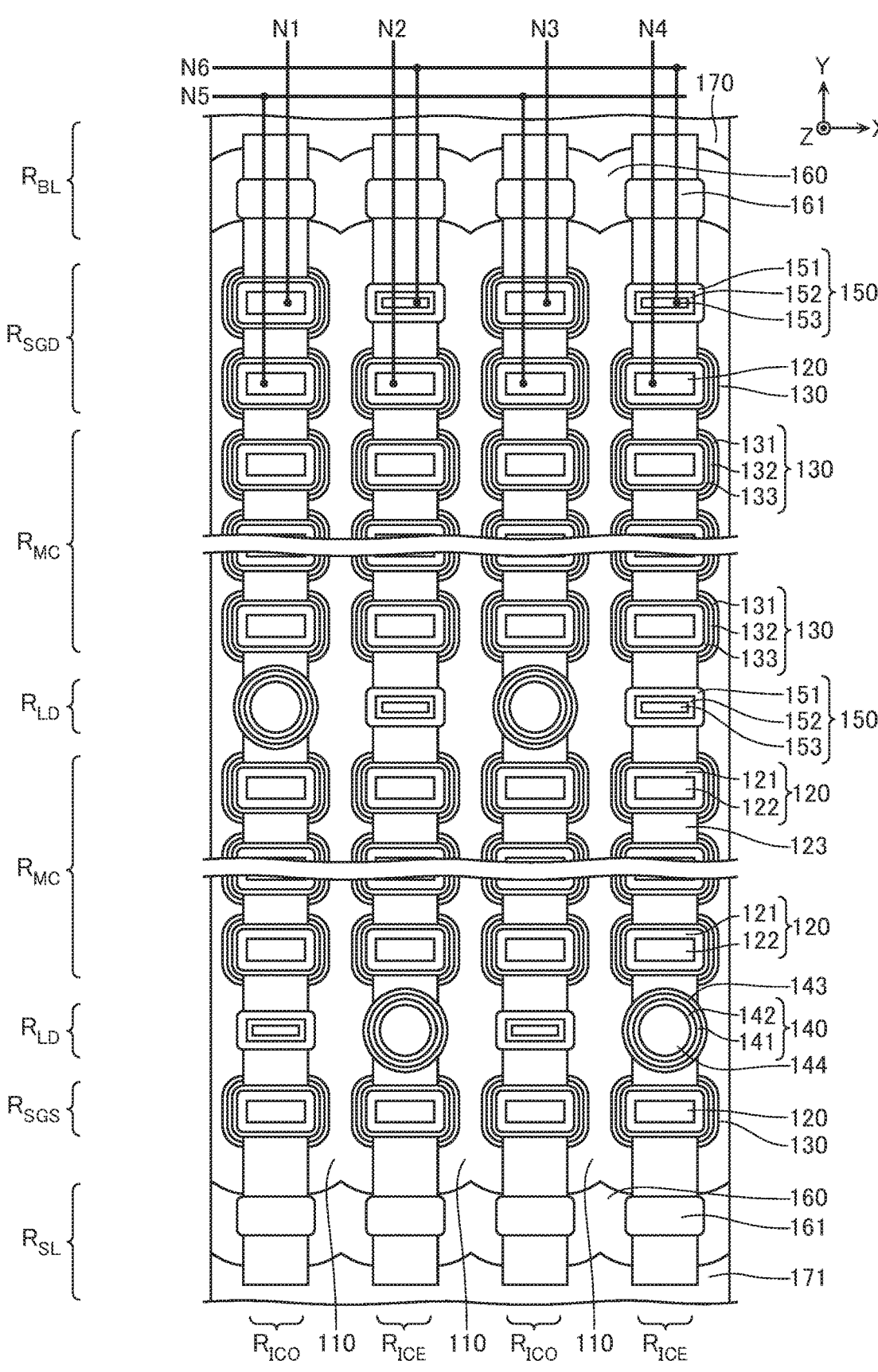
FIG. 43 is a schematic plan view illustrating a configuration of a part of a semiconductor memory device according to a fifth embodiment.

FIG. 43 is a schematic plan view illustrating a configuration of a part of a semiconductor memory device according to a fifth embodiment.

The semiconductor memory device according to the fifth embodiment is basically configured similarly to the semiconductor memory device according to the first embodiment.

However, in the fifth embodiment, as illustrated in FIG. 43, the conductive layer 120 and the conductive layer 150 arranged in the Y-direction are disposed instead of the two conductive layers 120 arranged in the Y-direction in the inter-channel region $R_{ICE}$ in the select transistor region $R_{SGD}$. This conductive layer 150 is disposed at a position farther from the memory cell region $R_{MC}$ than the conductive layer 120.

In the fifth embodiment, among the conductive layers 120 disposed in the inter-channel region $R_{ICO}$ in the select transistor region $R_{SGD}$, the conductive layers 120 positioned closer to the memory cell region $R_{MC}$ are commonly connected to the node N5. The plurality of conductive layers 150 disposed in the inter-channel region $R_{ICE}$ in the select transistor region $R_{SGD}$ are commonly connected to the node N6.

In the fifth embodiment, the ladder region $R_{LD}$ between the select transistor region $R_{SGD}$ and the memory cell region $R_{MC}$ positioned closest to the select transistor region $R_{SGD}$ is omitted.

Such a configuration allows to provide an effect similar to that of the third embodiment.

Sixth Embodiment

Figure 44:
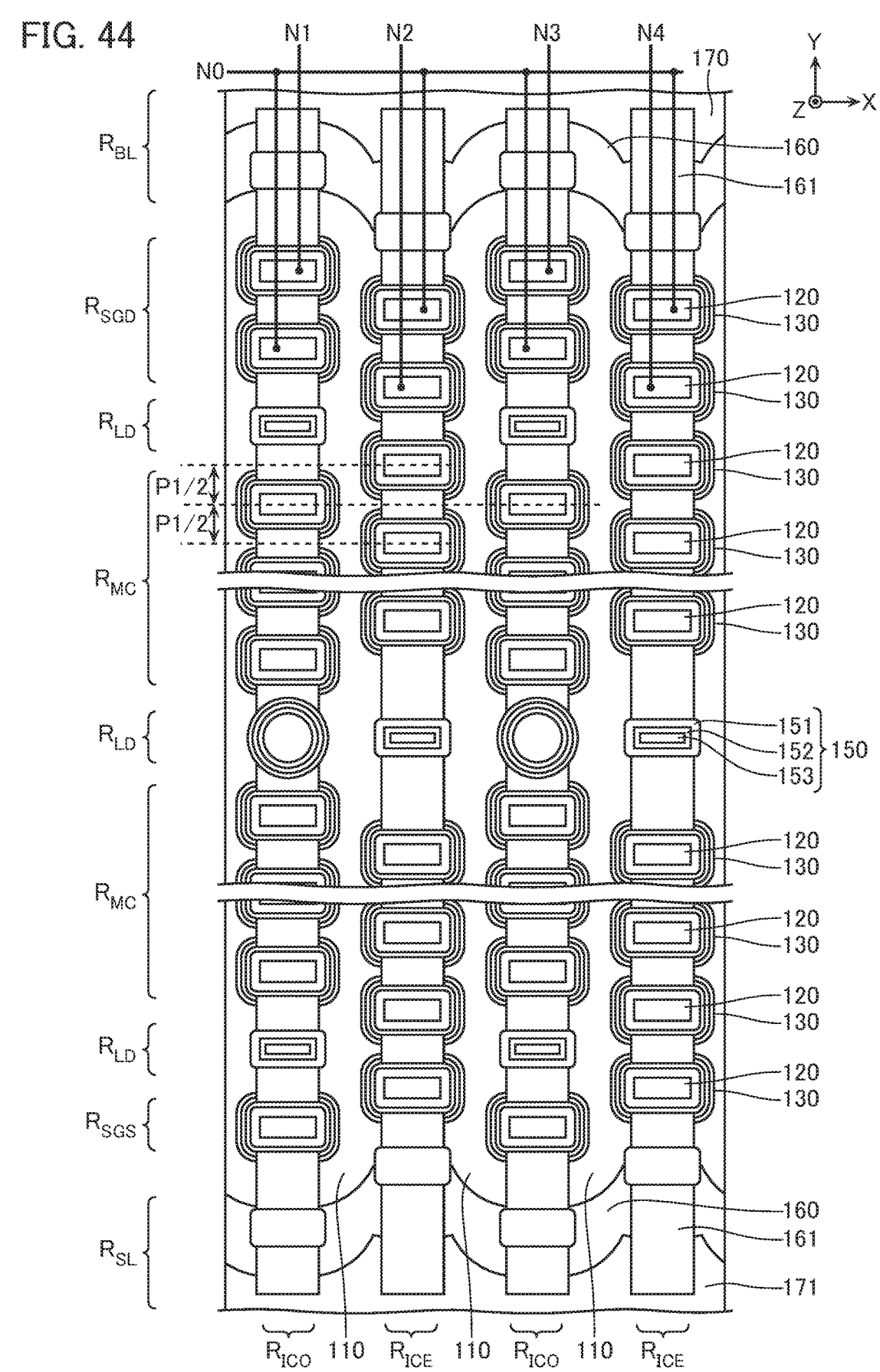
FIG. 44 is a schematic plan view illustrating a configuration of a part of a semiconductor memory device according to a sixth embodiment.

FIG. 44 is a schematic plan view illustrating a configuration of a part of a semiconductor memory device according to a sixth embodiment.

The semiconductor memory device according to the sixth embodiment is basically configured similarly to the semiconductor memory device according to the first embodiment.

However, in the semiconductor memory device according to the first embodiment, the positions in the Y-direction of the plurality of conductive layers 120 disposed in the inter-channel region $R_{ICO}$ approximately correspond to the positions in the Y-direction of the plurality of conductive layers 120 disposed in the inter-channel region $R_{ICE}$.

On the other hand, in the semiconductor memory device according to the sixth embodiment, the positions in the Y-direction of the plurality of conductive layers 120 disposed in the inter-channel region $R_{ICO}$ do not approximately correspond to the positions in the Y-direction of the plurality of conductive layers 120 disposed in the inter-channel region $R_{ICE}$.

For example, an arrangement period of the plurality of conductive layers 120 arranged in the Y-direction in the memory cell region $R_{MC}$ is assumed to be P1. In this case, the positions in the Y-direction of the plurality of conductive layers 120 disposed in the inter-channel region $R_{ICO}$ differ by P1/2 from the positions in the Y-direction of the plurality of conductive layers 120 disposed in the inter-channel region $R_{ICE}$.

Such an arrangement of the conductive layers 120 is applicable to any embodiments described above.

Seventh Embodiment

[Configuration]

Figure 45:
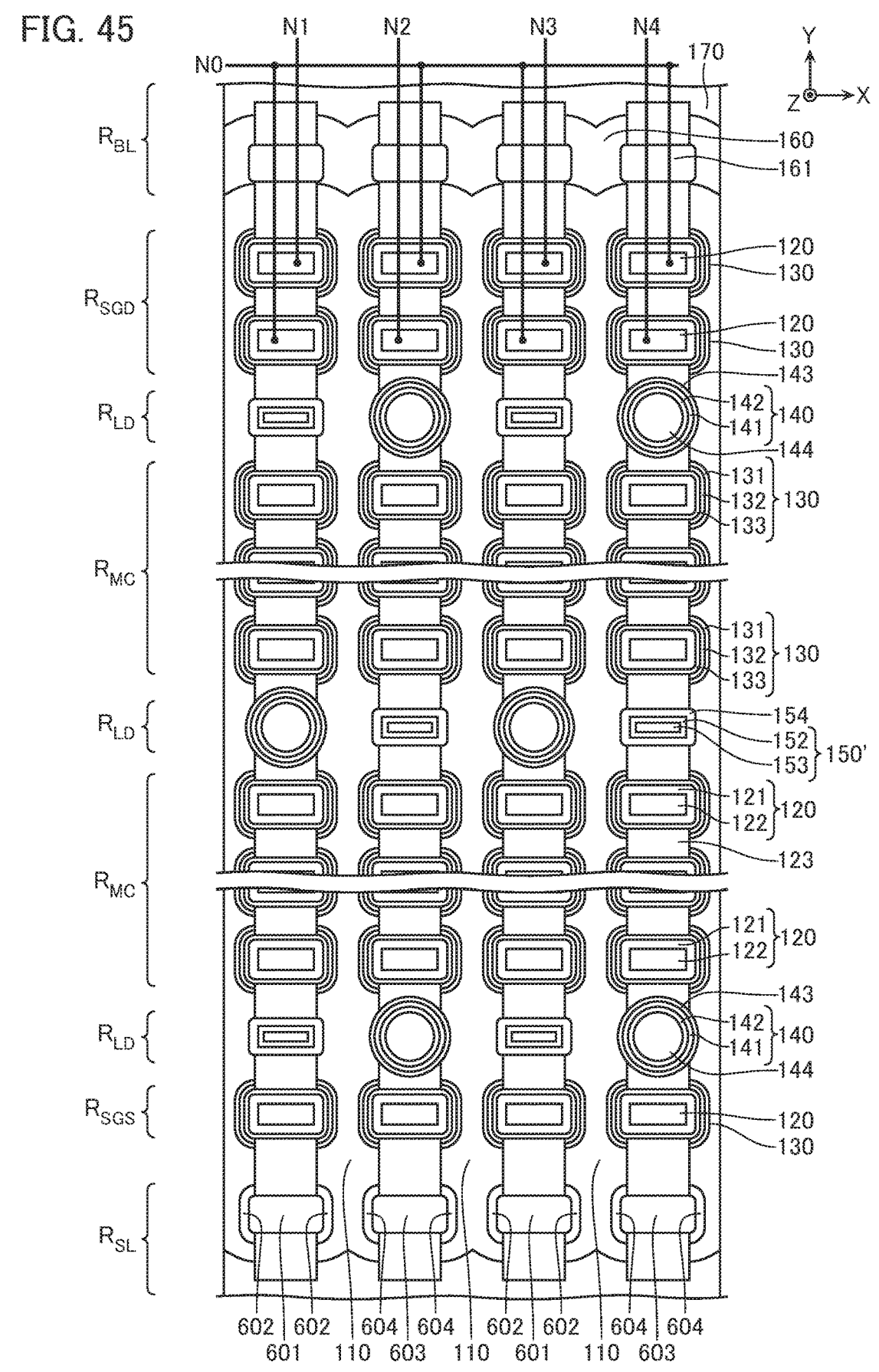
FIG. 45 is a schematic plan view illustrating a configuration of a part of a semiconductor memory device according to a seventh embodiment.

FIG. 45 is a schematic plan view illustrating a configuration of a part of a semiconductor memory device according to a seventh embodiment.

As described above, in the semiconductor memory device according to the first embodiment, the conductive layer 150 is disposed in the ladder region $R_{LD}$, thereby achieving an increased speed of the erase operation. However, such a configuration is merely an example. The method for increasing a speed of erase operation is appropriately adjustable. For example, in the semiconductor memory device according to the seventh embodiment, as illustrated in FIG. 45, conductive layers 603 configured to be able to provide the holes in the semiconductor layer 110 are disposed in the source line region $R_{SL}$ instead of the ladder region $R_{LD}$.

The semiconductor memory device according to the seventh embodiment is basically configured similarly to the semiconductor memory device according to the first embodiment.

However, the semiconductor memory device according to the seventh embodiment includes the conductive layers 150' instead of the above-described conductive layers 150. The conductive layer 150' has the outer peripheral surface on which the insulating layer 154 is disposed.

In the inter-channel region Ricin the source line region $R_{SL}$ of the semiconductor memory device according to the seventh embodiment, a conductive layer 601 or the conductive layer 603 is disposed.

In the inter-channel region $R_{ICO}$ in the source line region $R_{SL}$, the conductive layer 601 is disposed. The conductive layer 601 may, for example, include a conductive layer, such as titanium nitride (TiN) and a conductive layer, such as tungsten (W). The conductive layer 601 passes through the plurality of memory layers ML and extends in the Z-direction.

In the source line region $R_{SL}$, the memory layer ML includes a semiconductor layer 602 disposed between the conductive layer 601 and the semiconductor layer 110. The semiconductor layer 602, for example, includes polycrystalline silicon (Si) and the like containing N-type impurities, such as phosphorus (P). The conductive layer 601 is connected to the semiconductor layer 110 via this semiconductor layer 602.

In the inter-channel region $R_{ICE}$ in the source line region $R_{SL}$, the conductive layer 603 is disposed. The conductive layer 603 may, for example, include a conductive layer, such as titanium nitride (TiN), and a conductive layer, such as tungsten (W). The conductive layer 603 passes through the plurality of memory layers ML and extends in the Z-direction.

In the source line region $R_{SL}$, the memory layer ML includes a semiconductor layer 604 disposed between the conductive layer 603 and the semiconductor layer 110. The semiconductor layer 604, for example, includes polycrystalline silicon (Si) containing P-type impurities, such as boron (B). The conductive layer 603 is connected to the semiconductor layer 110 via this semiconductor layer 604.

[Manufacturing Method]

The semiconductor memory device according to the seventh embodiment is manufacturable by various kinds of methods.

For example, in the seventh embodiment, the conductive layer 120 disposed in the inter-channel region $R_{ICO}$ in the select transistor region $R_{SGS}$ may function as a gate electrode of an N-channel type field effect transistor. The conductive layer 120 disposed in the inter-channel region $R_{ICE}$ in the select transistor region $R_{SGS}$ may function as a gate electrode of a P-channel type field effect transistor. In this case, among the semiconductor layers 110, the portions functioning as channel regions of these field effect transistors may be film-formed in another process. The film formation may be performed in the same process and impurities may be implanted in another process.

For example, it is considered to dispose polycrystalline silicon containing N-type impurities, such as phosphorus (P), in the semiconductor layer 602 in the source line region $R_{SL}$ and the channel region of the above-described P-channel type field effect transistor in the select transistor region $R_{SGS}$. In such a case, it is possible to execute the film formation of the semiconductor layer 110 or the injection of the impurities in such a region in the same process. When N-type impurities, such as phosphorus (P), are included in the semiconductor layer 110 in the memory cell region $R_{MC}$, it is possible to execute this process together.

For example, it is considered to dispose polycrystalline silicon containing P-type impurities, such as boron (B), in the semiconductor layer 604 in the source line region $R_{SL}$ and the channel region of the above-described N-channel type field effect transistor in the select transistor region $R_{SGS}$. In such a case, it is possible to execute the film formation of the semiconductor layer 110 or the injection of the impurities in such a region in the same process. When P-type impurities, such as boron (B), are included in the semiconductor layer 110 in the memory cell region $R_{MC}$, it is possible to execute this process together.

Figure 46:
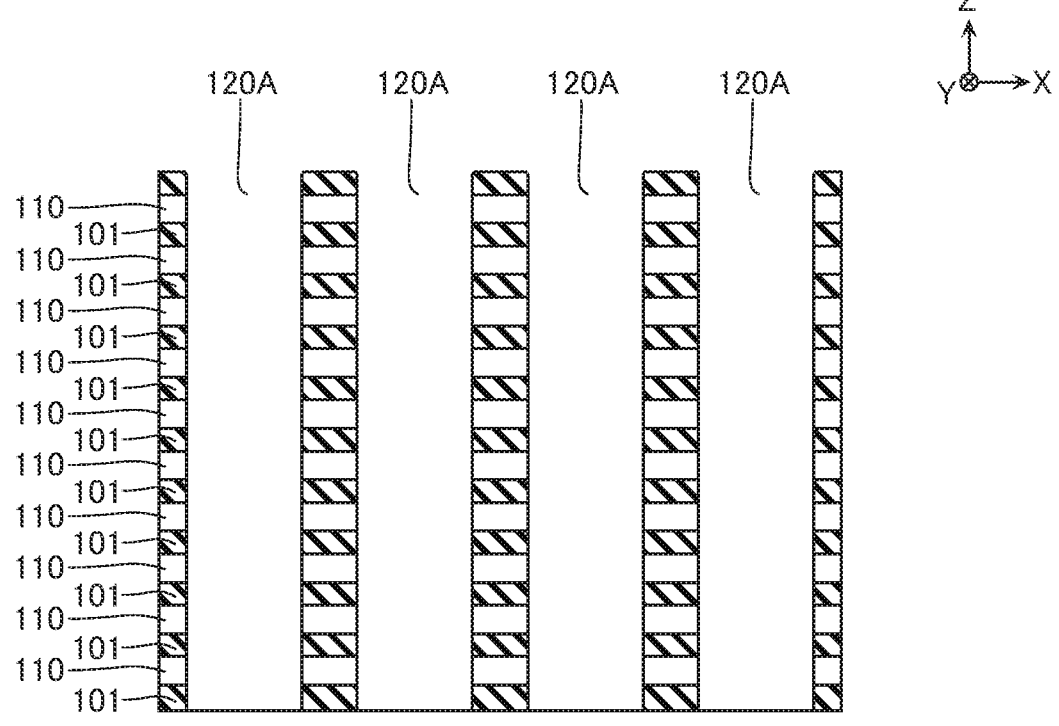
FIG. 46 is a schematic cross-sectional view for describing a method for manufacturing the semiconductor memory device.
Figure 47:
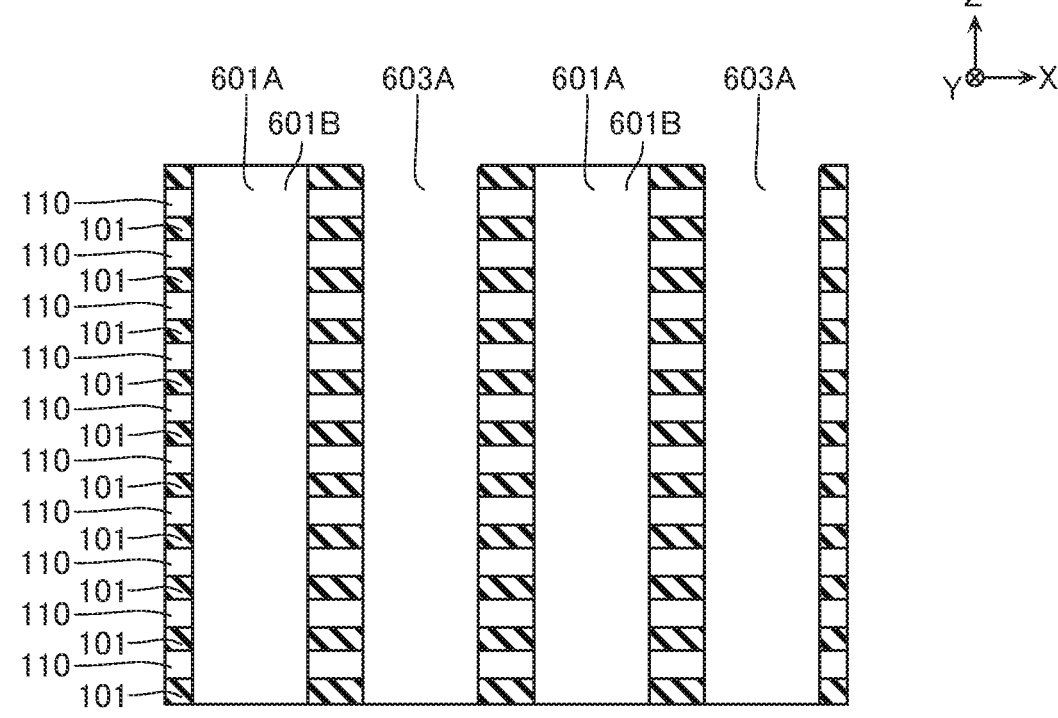
FIG. 47 is a schematic cross-sectional view for describing the manufacturing method.

For example, FIG. 46 exemplarily illustrates the openings 120A provided at positions corresponding to the conductive layers 120 of the memory cell region $R_{MC}$. FIG. 47 exemplarily illustrates openings 601A, 603A provided at positions corresponding to the conductive layers 601, 603 of the source line region $R_{SL}$. In the examples in FIG. 46 and FIG. 47, the openings 120A, 603A have exposed inner peripheral surfaces. On the other hand, the openings 601A have insides filled with sacrifice layers 601B. In such a state, P-type impurities, such as boron (B), may be implanted in the portions exposed to the openings 120A, 603A in the semiconductor layer 110.

Eighth Embodiment

Figure 48:
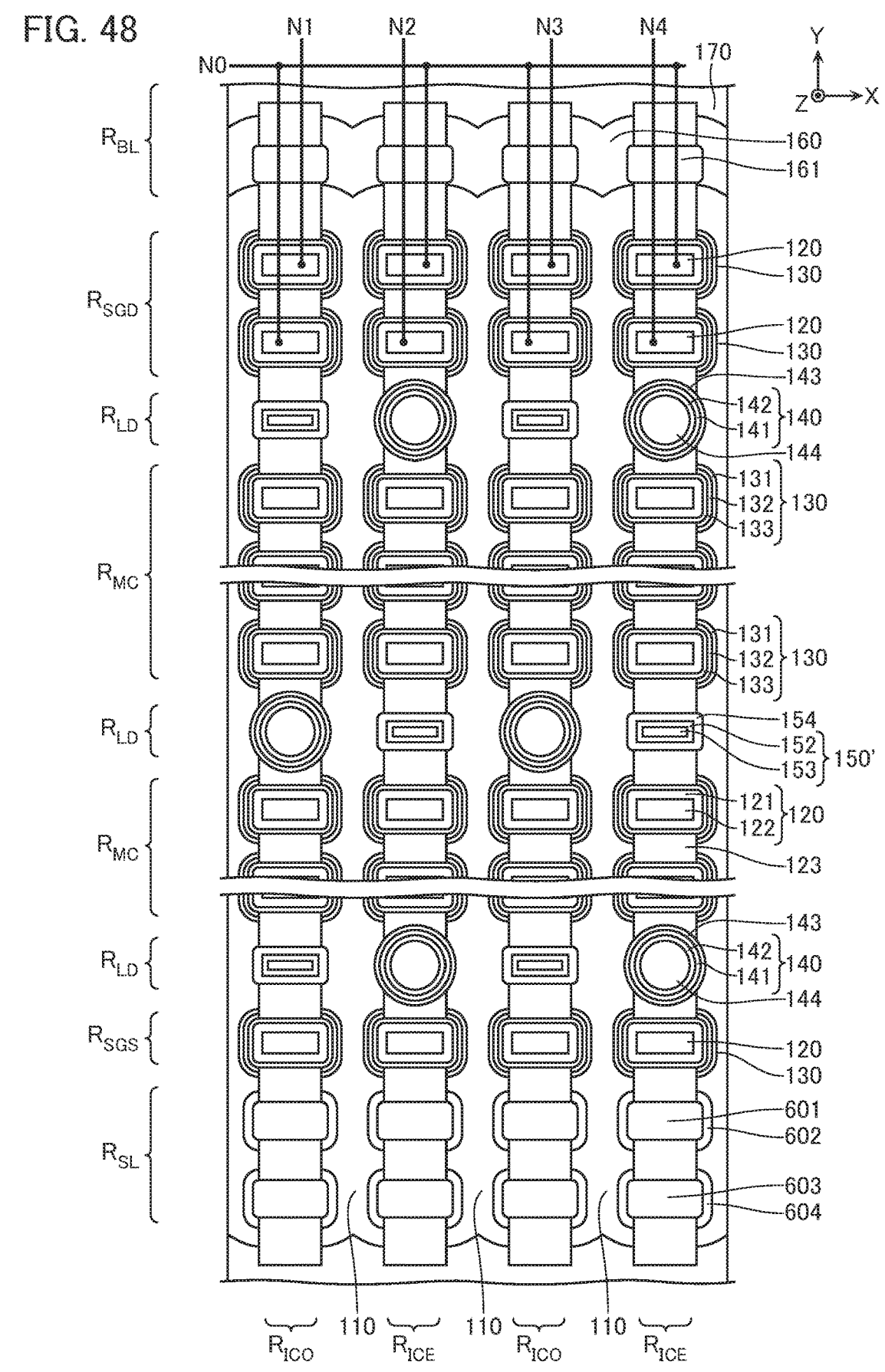
FIG. 48 is a schematic plan view illustrating a configuration of a part of a semiconductor memory device according to an eighth embodiment.

FIG. 48 is a schematic plan view illustrating a configuration of a part of a semiconductor memory device according to an eighth embodiment.

The semiconductor memory device according to the eighth embodiment is basically configured similarly to the semiconductor memory device according to the seventh embodiment.

However, in the inter-channel regions $R_{IC}$ in the source line region $R_{SL}$ of the semiconductor memory device according to the eighth embodiment, both the conductive layers 601 and the conductive layers 603 are each disposed. Between the conductive layer 601 and the semiconductor layer 110, the semiconductor layer 602 is disposed. Similarly, between the conductive layer 603 and the semiconductor layer 110, the semiconductor layer 604 is disposed.

Ninth Embodiment

Figure 49:
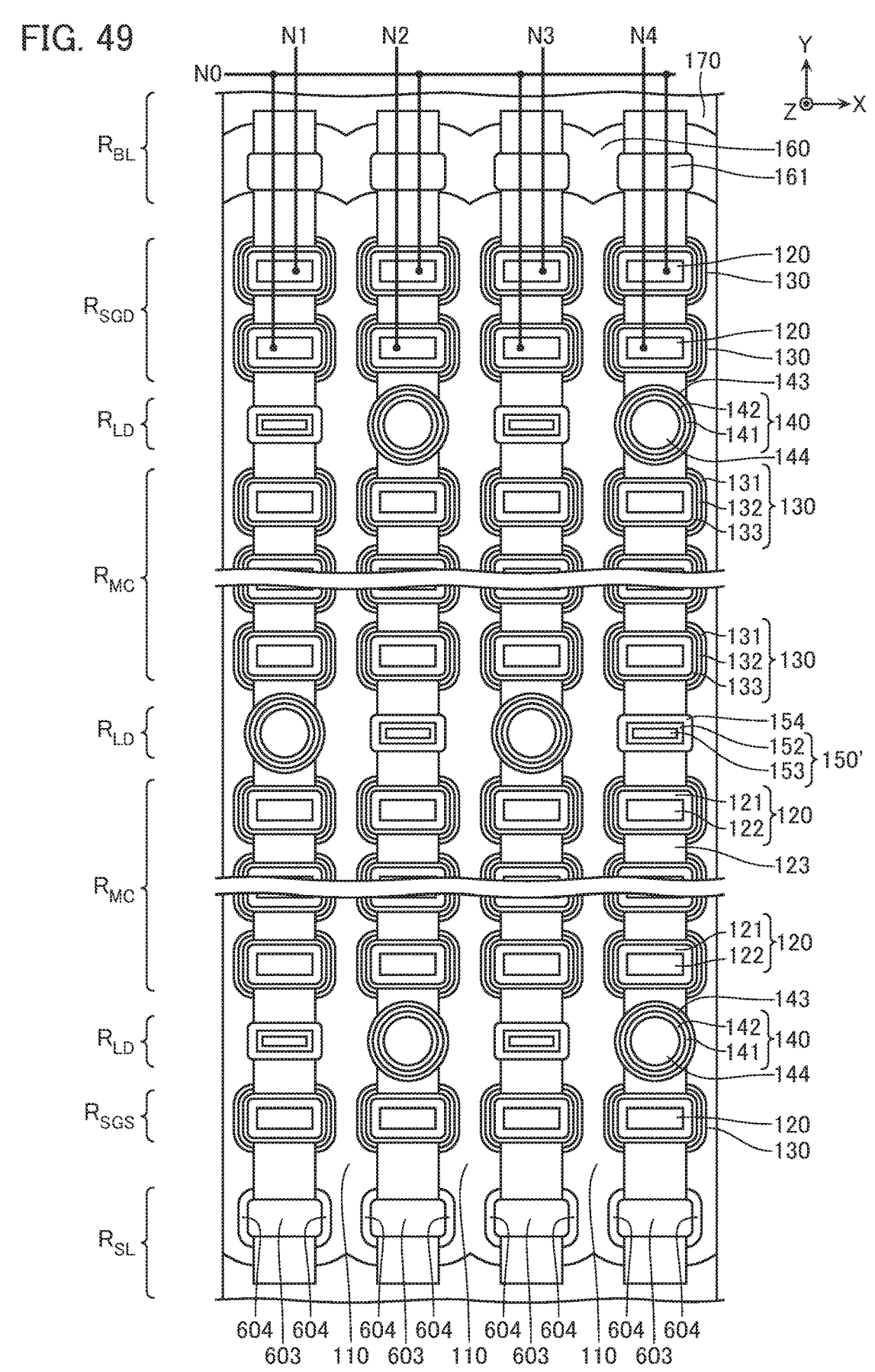
FIG. 49 is a schematic plan view illustrating a configuration of a part of a semiconductor memory device according to a ninth embodiment.

FIG. 49 is a schematic plan view illustrating a configuration of a part of a semiconductor memory device according to a ninth embodiment.

The semiconductor memory device according to the ninth embodiment is basically configured similarly to the semiconductor memory device according to the seventh embodiment.

However, in the inter-channel regions $R_{IC}$ in the source line region $R_{SL}$ of the semiconductor memory device according to the ninth embodiment, the conductive layers 603 are each disposed. Between the conductive layer 603 and the semiconductor layer 110, the semiconductor layer 604 is disposed.

Tenth Embodiment

Figure 50:
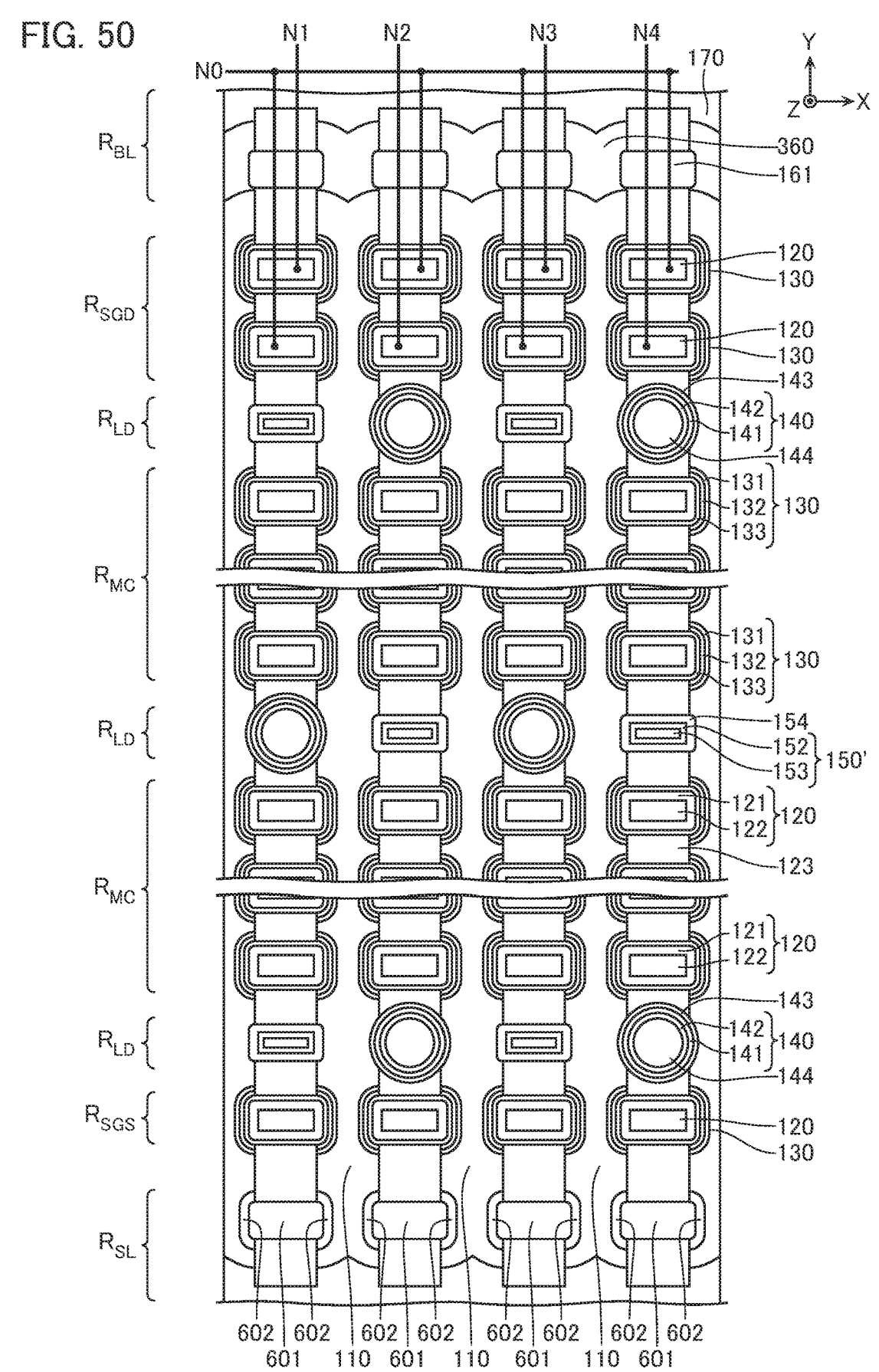
FIG. 50 is a schematic plan view illustrating a configuration of a part of a semiconductor memory device according to a tenth embodiment.

FIG. 50 is a schematic plan view illustrating a configuration of a part of a semiconductor memory device according to a tenth embodiment.

The semiconductor memory device according to the tenth embodiment is basically configured similarly to the semiconductor memory device according to the seventh embodiment.

However, in the inter-channel regions $R_{IC}$ in the source line region $R_{SL}$ of the semiconductor memory device according to the tenth embodiment, the conductive layers 601 are each disposed. Between the conductive layer 601 and the semiconductor layer 110, the semiconductor layer 602 is disposed.

In the bit line region $R_{BL}$ of the semiconductor memory device according to the tenth embodiment, a semiconductor layer 360 is disposed instead of the semiconductor layer 160. The semiconductor layer 360 is basically configured similarly to the semiconductor layer 160. However, the semiconductor layer 360 includes polycrystalline silicon (Si) and the like containing P-type impurities, such as boron (B), not polycrystalline silicon (Si) or the like containing N-type impurities, such as phosphorus (P).

ANOTHER EMBODIMENT

In the semiconductor memory device described above, upon the read operation, the electron channel is formed in the channel region of the memory transistor. However, such a configuration is merely an example. For example, upon the read operation, a hole channel may be formed in the channel region of the memory transistor. In such a case, a configuration corresponding to the above-described conductive layer 150 may be connected to a configuration corresponding to the semiconductor layer 110 via polycrystalline silicon (Si) and the like containing N-type impurities, such as phosphorus (P), not polycrystalline silicon (Si) or the like containing P-type impurities, such as boron (B).

In the semiconductor memory device described above, the select transistor includes a configuration similar to that of the memory transistor. That is, the portions disposed in the select transistor regions $R_{SGD}$, $R_{SGS}$ of the semiconductor layer 110 function as the channel region of the select transistor. Among the conductive layers 120, ones disposed in the select transistor region $R_{SGD}$, $R_{SGS}$ function as the gate electrode of the select transistor. Also in the select transistor regions $R_{SGD}$, $R_{SGS}$, between the conductive layer 120 and the semiconductor layer 110, the gate insulating layer 130 is disposed. However, the select transistor may include a configuration different from that of the memory transistor.

Figure 51:
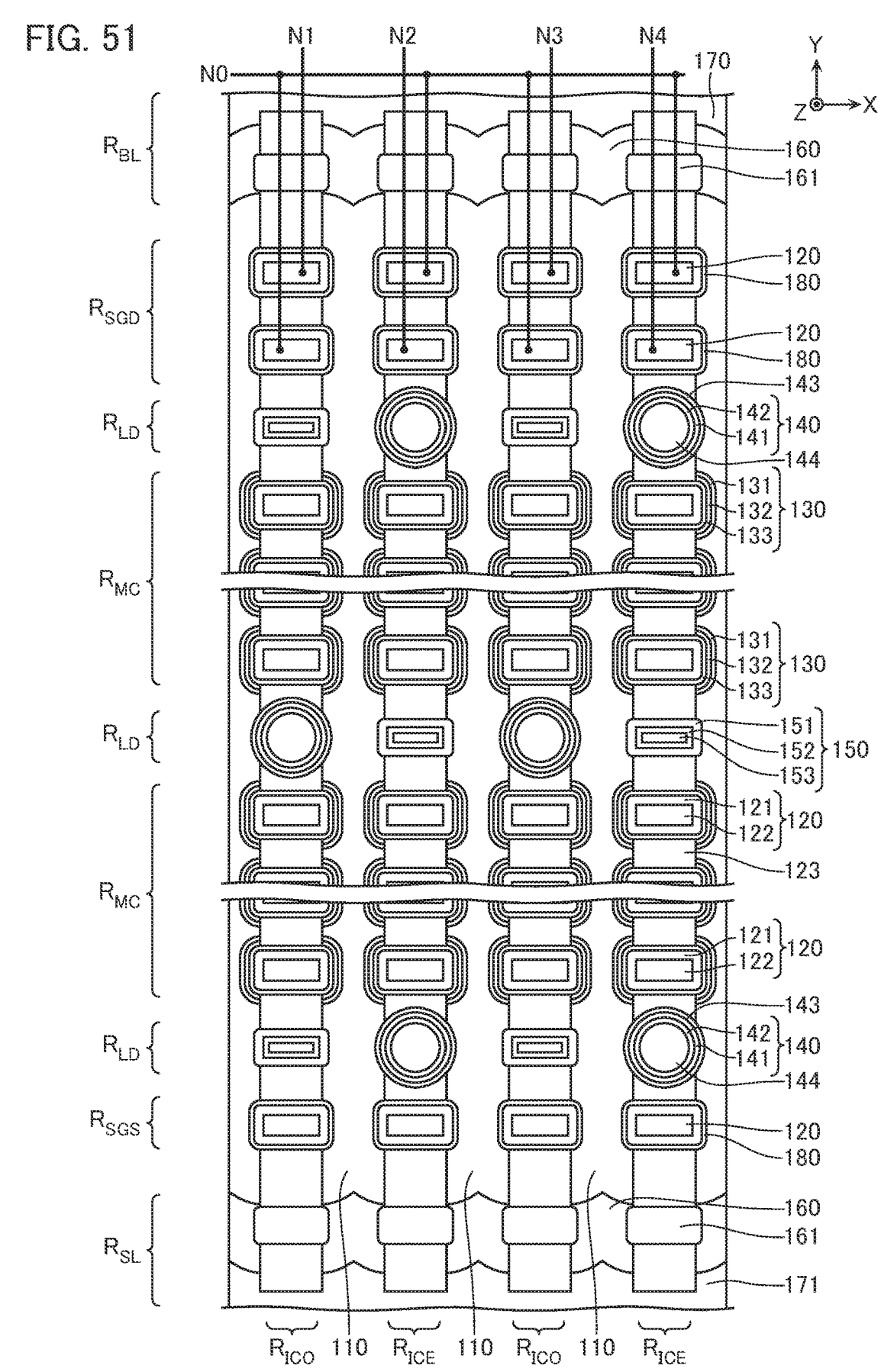
FIG. 51 is a schematic plan view illustrating a configuration of a part of a semiconductor memory device according to another embodiment.

For example, a semiconductor memory device exemplarily illustrated in FIG. 51 is basically configured similarly to the semiconductor memory device according to the first embodiment. However, in the example in FIG. 51, in the select transistor regions $R_{SGD}$, $R_{SGS}$, the gate insulating layer 130 is not disposed, but instead, an insulating layer 180 is disposed between the conductive layer 120 and the semiconductor layer 110. The insulating layer 180 may, for example, include silicon oxide ($SiO_2$) and the like. Note that, in any semiconductor memory device described above, the gate insulating layer 130 may be omitted from at least one of the select transistor regions $R_{SGD}$, $R_{SGS}$, and the insulating layer 180 may be disposed instead.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first semiconductor layer extending in a first direction;
a plurality of first conductive layers arranged in the first direction, the plurality of first conductive layers extending in a second direction intersecting with the first direction;
a plurality of electric charge accumulating portions disposed between the first semiconductor layer and the plurality of first conductive layers;
a first conductivity-typed second semiconductor layer connected to one end in the first direction of the first semiconductor layer;
a first wiring connected to the first semiconductor layer via the first conductivity-typed second semiconductor layer;
a second conductivity-typed third semiconductor layer connected to a side surface at one side in a third direction of the first semiconductor layer, the third direction intersecting with the first direction and the second direction; and
a second conductive layer extending in the second direction, the second conductive layer being connected to the first semiconductor layer via the second conductivity-typed third semiconductor layer.

2. The semiconductor memory device according to claim 1, comprising:
a second conductivity-typed fourth semiconductor layer connected to a side surface at the other side in the third direction of the first semiconductor layer; and
a third conductive layer extending in the second direction, the third conductive layer being connected to the first semiconductor layer via the second conductivity-typed fourth semiconductor layer, wherein
a position in the first direction of the third conductive layer differs from a position in the first direction of the second conductive layer.

3. The semiconductor memory device according to claim 2, comprising a plurality of first regions and a plurality of second regions alternately arranged in the first direction, wherein the plurality of first regions each include at least parts of the plurality of first conductive layers, odd-numbered second regions counted in the first direction among the plurality of second regions each include one of the second conductive layer and the third conductive layer, and even-numbered second regions counted in the first direction among the plurality of second regions each include the other of the second conductive layer and the third conductive layer.

4. The semiconductor memory device according to claim 3, comprising a third region closer to the first conductivity-typed second semiconductor layer than the plurality of first regions and the plurality of second regions, and a controller, wherein the third region includes:

a fourth conductive layer extending in the second direction, the fourth conductive layer being opposed to the side surface at the one side in the third direction of the first semiconductor layer;

a fifth conductive layer extending in the second direction, the fifth conductive layer being opposed to the side surface at the one side in the third direction of the first semiconductor layer, the fifth conductive layer being closer to the plurality of first regions than the fourth conductive layer;

a sixth conductive layer extending in the second direction, the sixth conductive layer being opposed to the side surface at the other side in the third direction of the first semiconductor layer; and a seventh conductive layer extending in the second direction, the seventh conductive layer being opposed to the side surface at the other side in the third direction of the first semiconductor layer, the seventh conductive layer being closer to the plurality of first regions than the sixth conductive layer, in a read operation, the controller applies voltages to the fourth conductive layer, the fifth conductive layer, the sixth conductive layer, and the seventh conductive layer, and in the read operation, the voltage applied to the fourth conductive layer and the voltage applied to the seventh conductive layer are larger than the voltage applied to the fifth conductive layer and the voltage applied to the sixth conductive layer.

5. The semiconductor memory device according to claim 4, comprising:

a first insulating layer disposed between the fourth conductive layer and the first semiconductor layer; and a second insulating layer disposed between the seventh conductive layer and the first semiconductor layer.

6. The semiconductor memory device according to claim 4, comprising a third insulating layer disposed between the fifth conductive layer and the first semiconductor layer.

7. The semiconductor memory device according to claim 4, comprising a second conductivity-typed fifth semiconductor layer disposed between the fifth conductive layer and the first semiconductor layer, wherein the fifth conductive layer is connected to the first semiconductor layer via the second conductivity-typed fifth semiconductor layer.

8. The semiconductor memory device according to claim 4, comprising a fourth insulating layer disposed between the sixth conductive layer and the first semiconductor layer.

9. The semiconductor memory device according to claim 4, comprising a second conductivity-typed sixth semiconductor layer disposed between the sixth conductive layer and the first semiconductor layer, wherein the sixth conductive layer is connected to the first semiconductor layer via the second conductivity-typed sixth semiconductor layer.

10. The semiconductor memory device according to claim 4, wherein the fifth conductive layer is electrically connected to the sixth conductive layer.

11. The semiconductor memory device according to claim 1, comprising a semiconductor substrate, wherein the first semiconductor layer includes a single-crystal and the crystal included in the first semiconductor layer has an orientation aligning with an orientation of a crystal included in the semiconductor substrate.

12. A semiconductor memory device comprising:

a substrate;

a first semiconductor layer that extends in a first direction and is spaced from the substrate in a second direction intersecting with a surface of the substrate, the second direction intersecting with the first direction;

a plurality of first conductive layers extending in the second direction, the plurality of first conductive layers being arranged in the first direction, the plurality of first conductive layers being opposed to a side surface at one side of the first semiconductor layer in a third direction intersecting with the first direction and the second direction;

a plurality of first electric charge accumulating portions disposed between the first semiconductor layer and the plurality of first conductive layers;

a plurality of second conductive layers extending in the second direction, the plurality of second conductive layers being arranged in the first direction, the plurality of second conductive layers being opposed to a side surface at the other side of the first semiconductor layer in the third direction;

a plurality of second electric charge accumulating portions disposed between the first semiconductor layer and the plurality of second conductive layers;

a fourth conductive layer extending in the second direction, the fourth conductive layer being opposed to a side surface at one side in the third direction of the first semiconductor layer;

a fifth conductive layer extending in the second direction, the fifth conductive layer being opposed to the side surface at the one side in the third direction of the first semiconductor layer, the fifth conductive layer being closer to the plurality of first conductive layers than the fourth conductive layer; and a second conductivity-typed fifth semiconductor layer disposed between the fifth conductive layer and the first semiconductor layer, wherein the first semiconductor layer includes:

a first part extending in the first direction, the first part being opposed to the plurality of first conductive layers;

a second part extending in the first direction, the second part being opposed to the plurality of second conductive layers; and a third part connected to the first part and the second part, the third part being opposed to the fourth conductive layer and to the fifth conductive layer, and the fifth conductive layer is connected to the first semiconductor layer via the second conductivity-typed fifth semiconductor layer.

13. The semiconductor memory device according to claim 12, comprising:

a sixth conductive layer extending in the second direction, the sixth conductive layer being opposed to a side surface at the other side in the third direction of the third part of the first semiconductor layer;

a seventh conductive layer extending in the second direction, the seventh conductive layer being opposed to the side surface at the other side in the third direction of the third part of the first semiconductor layer, the seventh conductive layer being closer to the plurality of first conductive layers than the sixth conductive layer; and a controller, wherein in a read operation, the controller applies voltages to the fourth conductive layer, the fifth conductive layer, the sixth conductive layer, and the seventh conductive layer, in the read operation, the voltage applied to the fourth conductive layer and the voltage applied to the seventh conductive layer are larger than the voltage applied to the fifth conductive layer and the voltage applied to the sixth conductive layer.

14. The semiconductor memory device according to claim 13, comprising:

a first insulating layer disposed between the fourth conductive layer and the first semiconductor layer; and a second insulating layer disposed between the seventh conductive layer and the first semiconductor layer.

15. The semiconductor memory device according to claim 12, wherein the first semiconductor layer includes a single-crystal, and the crystal included in the first semiconductor layer has an orientation aligning with an orientation of a crystal included in the substrate.

16. A semiconductor memory device comprising a first region and a second region arranged in a first direction; and a controller, wherein the first region includes:

a part of a first semiconductor layer extending in the first direction;

a plurality of first conductive layers arranged in the first direction, the plurality of first conductive layers extending in a second direction intersecting with the first direction; and a plurality of electric charge accumulating portions disposed between the first semiconductor layer and the plurality of first conductive layers, the second region includes:

another part of the first semiconductor layer;

a fourth conductive layer extending in the second direction, the fourth conductive layer being opposed to a side surface at one side in a third direction intersecting with the first direction and the second direction of the first semiconductor layer;

a fifth conductive layer extending in the second direction, the fifth conductive layer being opposed to the side surface at the one side in the third direction of the first semiconductor layer, the fifth conductive layer being closer to the first region than the fourth conductive layer;

a sixth conductive layer extending in the second direction, the sixth conductive layer being opposed to a side surface at the other side in the third direction of the first semiconductor layer; and a seventh conductive layer extending in the second direction, the seventh conductive layer being opposed to the side surface at the other side in the third direction of the first semiconductor layer, the seventh conductive layer being closer to the first region than the sixth conductive layer;

a second conductivity-typed fifth semiconductor layer disposed between the fifth conductive layer and the first semiconductor layer, wherein a position of the fourth conductive layer in the first direction and a position of the sixth conductive layer in the first direction are the same, a position of the fifth conductive layer in the first direction and a position of the seventh conductive layer in the first direction are the same, the fifth conductive layer is connected to the first semiconductor layer via the second conductivity-typed fifth semiconductor layer, in a read operation, the control circuit applies voltages to the fourth conductive layer, the fifth conductive layer, the sixth conductive layer, and the seventh conductive layer, and in the read operation, a voltage applied to the fourth conductive layer and a voltage applied to the seventh conductive layer are larger than a voltage applied to the fifth conductive layer and a voltage applied to the sixth conductive layer.

17. The semiconductor memory device according to claim 16, comprising:

a first insulating layer disposed between the fourth conductive layer and the first semiconductor layer; and a second insulating layer disposed between the seventh conductive layer and the first semiconductor layer.

18. The semiconductor memory device according to claim 16, comprising a semiconductor substrate, wherein the first semiconductor layer includes a single-crystal, and the crystal included in the first semiconductor layer has an orientation aligning with an orientation of a crystal included in the semiconductor substrate.

* * * * *